(12) United States Patent
Higashitsuji et al.

(10) Patent No.: US 12,362,021 B2
(45) Date of Patent: Jul. 15, 2025

(54) SEMICONDUCTOR MEMORY

(71) Applicant: Kioxia Corporation, Tokyo (JP)

(72) Inventors: Teppei Higashitsuji, Fujisawa Kanagawa (JP); Toshifumi Watanabe, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 320 days.

(21) Appl. No.: 18/177,026

(22) Filed: Mar. 1, 2023

(65) Prior Publication Data
US 2024/0055057 A1 Feb. 15, 2024

(30) Foreign Application Priority Data

Aug. 12, 2022 (JP) ................. 2022-128943

(51) Int. Cl.
*G11C 16/04* (2006.01)
*G11C 5/06* (2006.01)
*G11C 16/26* (2006.01)

(52) U.S. Cl.
CPC ............ *G11C 16/26* (2013.01); *G11C 5/06* (2013.01)

(58) Field of Classification Search
CPC .................. G11C 16/26; G11C 5/06
See application file for complete search history.

(56) References Cited

U.S. PATENT DOCUMENTS

| 2014/0071763 | A1* | 3/2014 | Shikata | G11C 16/3418 |
| | | | | 365/185.18 |
| 2018/0268877 | A1* | 9/2018 | Sato | G11C 16/08 |
| 2019/0050169 | A1* | 2/2019 | Komai | G11C 7/18 |
| 2020/0286529 | A1 | 9/2020 | Takagiwa | |

FOREIGN PATENT DOCUMENTS

JP 2020-145372 A 9/2020

* cited by examiner

*Primary Examiner* — Pho M Luu
(74) *Attorney, Agent, or Firm* — Kim & Stewart LLP

(57) ABSTRACT

A semiconductor memory includes a memory cell, a bit line electrically connected to the memory cell, a sense amplifier including a first latch circuit, a first hookup circuit, a second latch circuit, a first wiring, and a first pre-charge circuit. The sense amplifier is in a first circuit area. The first hookup circuit is in a second circuit area and configured to control connection between the bit line and the sense amplifier. The first wiring is connected between the first latch circuit and the second latch circuit. The first pre-charge circuit includes a first transistor in a third circuit area between the first circuit area and the second circuit area. The first transistor has a first end connected to the first wiring at a first position in the third circuit area and a second end connectable to a terminal supplied with one of a pre-charge voltage and a ground voltage.

20 Claims, 40 Drawing Sheets

FIG. 32
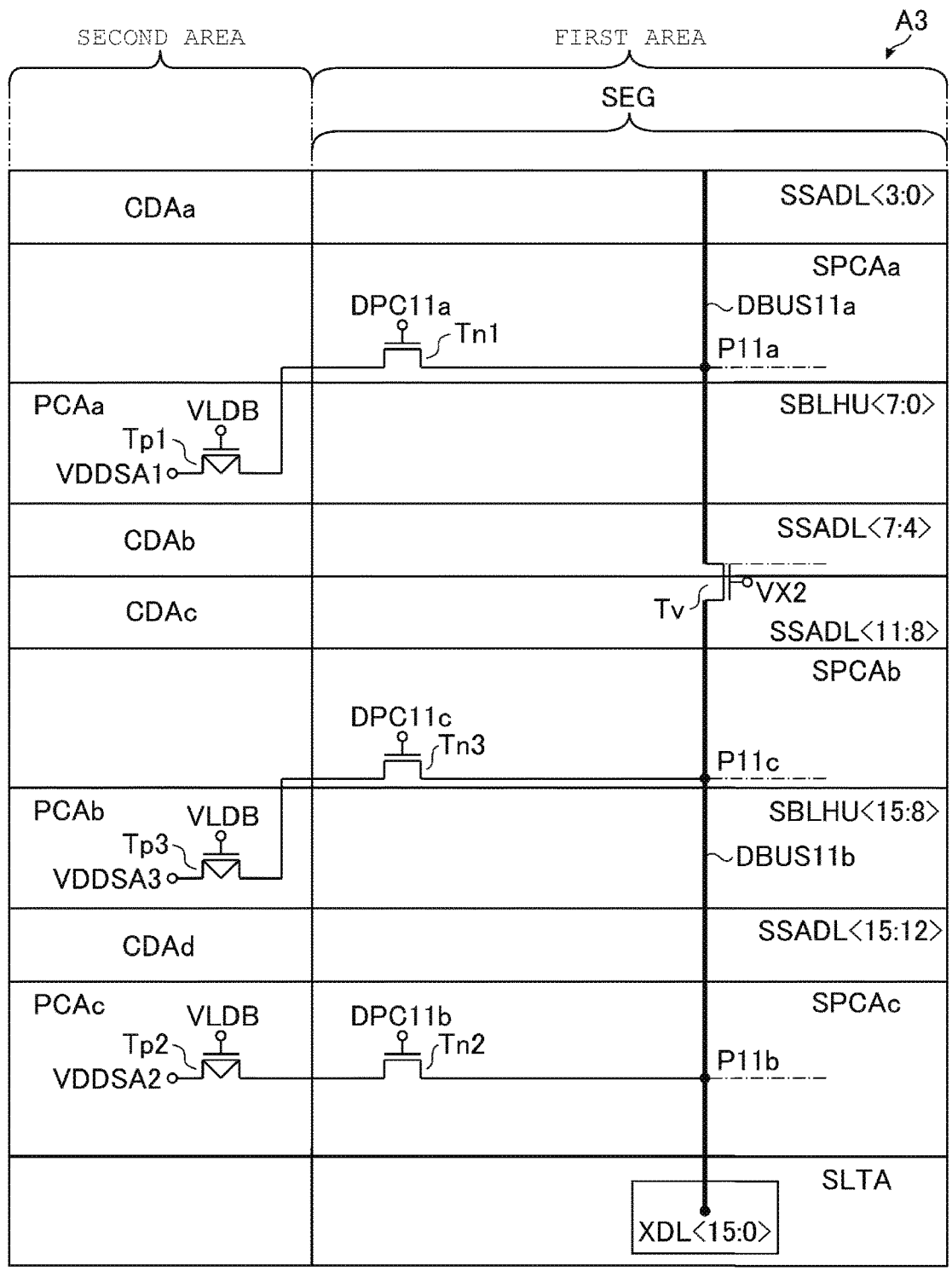
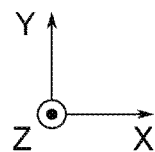

SEMICONDUCTOR MEMORY

CROSS-REFERENCE TO RELATED APPLICATION

This application is based upon and claims the benefit of priority from Japanese Patent Application No. 2022-128943, filed Aug. 12, 2022, the entire contents of which are incorporated herein by reference.

FIELD

Embodiments described herein relate generally to a semiconductor memory.

BACKGROUND

As a semiconductor memory, a NAND flash memory is known.

BRIEF DESCRIPTION OF THE DRAWINGS

FIG. 32 is a diagram showing an example of a layout of buses and circuits in the sense amplifier module in the semiconductor memory according to the first modification of the first embodiment.

DETAILED DESCRIPTION

Figure 1:
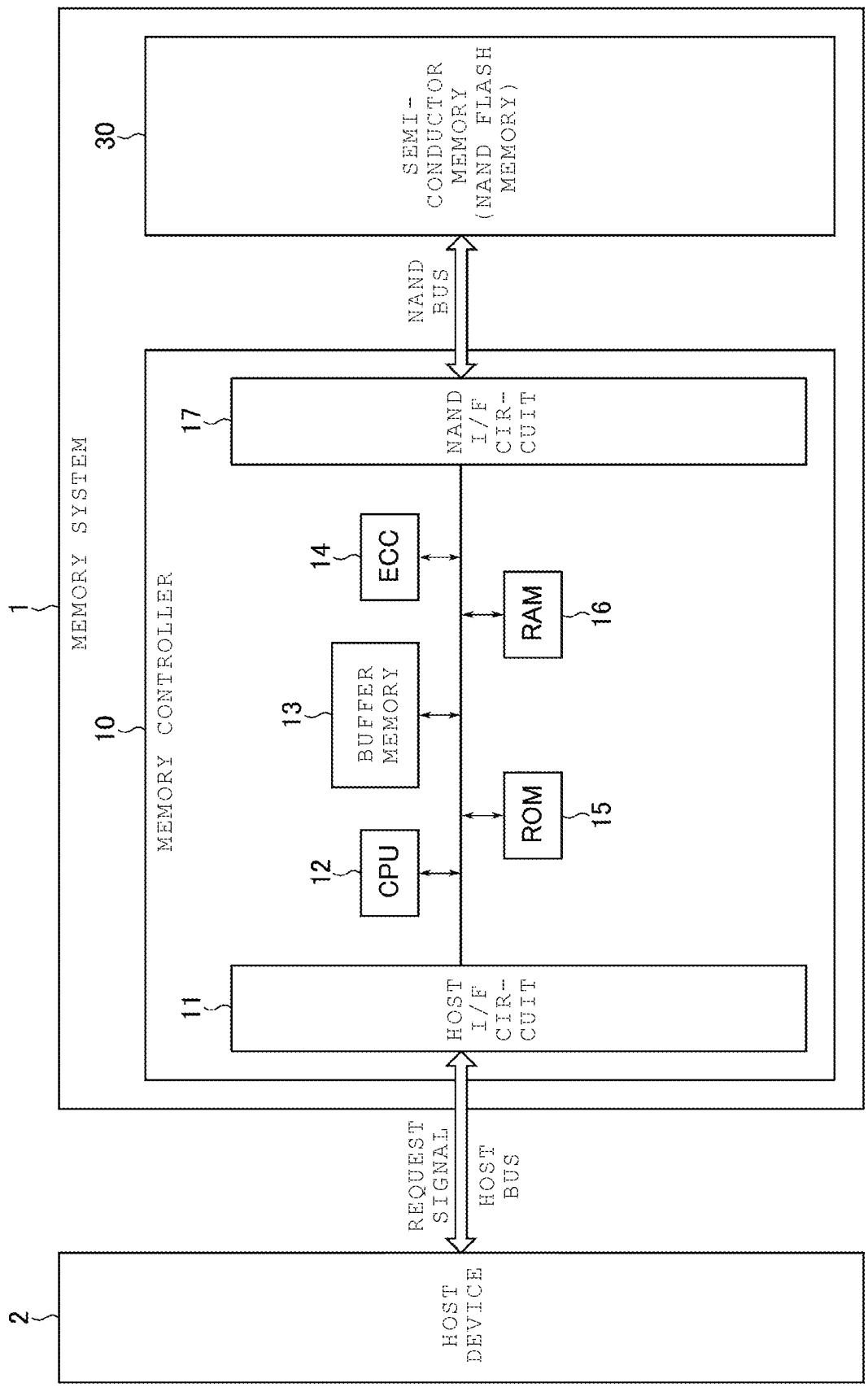
FIG. 1 is a block diagram of an example of an information processing system having a memory system including a semiconductor memory according to a first embodiment.

Embodiments provide a semiconductor memory capable of operating at high speed.

In general, according to an embodiment, a semiconductor memory includes a memory cell, a bit line electrically connected to the memory cell, a sense amplifier including a first latch circuit, a first hookup circuit, a second latch circuit, a first wiring, and a first pre-charge circuit. The sense amplifier is in a first circuit area. The first hookup circuit is in a second circuit area and configured to control connection between the bit line and the sense amplifier. The first wiring is connected between the first latch circuit and the second latch circuit. The first pre-charge circuit includes a first transistor in a third circuit area between the first circuit area and the second circuit area. The first transistor has a first end connected to the first wiring at a first position in the third circuit area and a second end connectable to a terminal that is supplied with one of a pre-charge voltage and a ground voltage.

Hereinafter, embodiments will be described with reference to the drawings. In the following description, components having substantially the same functions and configurations are denoted by the same reference numerals. Different letters or numerals may be added to the end of the same reference numerals when specifically distinguishing between elements having the same configurations.

1. First Embodiment

A semiconductor memory according to a first embodiment will be described. Hereinafter, a NAND flash memory will be described as an example of the semiconductor memory.

1.1 Configuration
1.1.1 Configuration of Memory System

A configuration of a memory system including the semiconductor memory according to the present embodiment will be described with reference to FIG. 1. FIG. 1 is a block diagram of an example of an information processing system having the memory system including the semiconductor memory according to the present embodiment.

The information processing system includes a memory system 1 and a host device 2.

The memory system 1 is a device that stores data. For example, the memory system 1 is a Solid State Drive (SSD), a Universal Flash Storage (UFS) device, a Universal Serial Bus (USB) memory, a Multi-Media Card (MMC), or an SD™ card. The memory system 1 is connectable to the host device 2 via a host bus. The memory system 1 performs processing based on a request signal received from the host device 2 or a spontaneous processing request.

The host device 2 is a device that controls the memory system 1. For example, the host device 2 is a personal computer, a server system, a mobile device, a vehicle-mounted device, or a digital camera.

Next, the internal configuration of the memory system 1 will be described.

The memory system 1 includes a memory controller 10 and a semiconductor memory 30. For example, the semiconductor memory 30 is a nonvolatile memory such as a NAND flash memory. Hereinafter, the semiconductor memory 30 will be referred to as the NAND flash memory 30.

The memory controller 10 is a device that controls the NAND flash memory 30. For example, the memory controller 10 is a System On a Chip (SoC). The memory controller 10 is connected to the host device 2 via the host bus. The memory controller 10 receives a request signal from the host device 2 via the host bus. The type of the host bus is determined according to an application used for the memory system 1. When the memory system 1 is an SSD, for example, an interface of a Serial Attached SCSI (SAS), a Serial ATA (SATA), or a Peripheral Component Interconnect Express (PCIe™) standard is used as the host bus. When the memory system 1 is a UFS device, an interface of an M-PHY standard is used as the host bus. When the memory system 1 is the USB memory, an interface of a USB standard is used as the host bus. When the memory system 1 is the MMC, an interface of an Embedded Multi Media Card (eMMC) standard is used as the host bus. When the memory system 1 is the SD™ card, an interface of an SD™ standard is used as the host bus.

The memory controller 10 controls the NAND flash memory 30 via a NAND bus based on the request signal received from the host device 2 or a spontaneous processing request. The NAND bus transmits and receives signals according to the NAND interface.

The NAND flash memory 30 is a device that stores data. The NAND flash memory 30 includes a plurality of memory cell transistors. Each of the plurality of memory cell transistors stores data according to a threshold voltage in a nonvolatile manner. The NAND flash memory 30 stores data received from the memory controller 10 in the plurality of memory cell transistors in a nonvolatile manner. The NAND flash memory 30 outputs data read from the plurality of memory cell transistors to the memory controller 10.

Next, the internal configuration of the memory controller 10 will be described.

The memory controller 10 includes a host interface (I/F) circuit 11, a processor (Central Processing Unit (CPU)) 12, a buffer memory 13, an Error Checking and Correcting (ECC) circuit 14, a Read Only Memory (ROM) 15, a Random Access Memory (RAM) 16, and a NAND interface (I/F) circuit 17.

The host interface circuit 11 is a circuit that controls communication between the memory controller 10 and the host device 2. The host interface circuit 11 is connected to the host device 2 via the host bus.

The processor 12 is a control circuit for the memory controller 10. The processor 12 executes programs stored in the ROM 15 to control the overall operation of the memory controller 10. For example, when receiving a write request from the host device 2, the processor 12 controls a write operation based on the write request. The same applies to a read operation and an erasing operation.

The buffer memory 13 is a memory that temporarily stores data. For example, the buffer memory 13 is a Static Random Access Memory (SRAM). The buffer memory 13 temporarily stores write data, read data, and the like. The write data is data to be written to the NAND flash memory 30. The read data is data read from the NAND flash memory 30.

The ECC circuit 14 is a circuit that performs ECC processing on data. Specifically, the ECC circuit 14 generates an error correction code based on the write data during a data write operation. Then, during a data read operation, the ECC circuit 14 generates, in a predetermined unit, a syndrome based on the error correction code, detects an error, and corrects the detected error.

The ROM 15 is a nonvolatile memory. For example, the ROM 15 is an Electrically Erasable Programmable Read-Only Memory (EEPROM™). The ROM 15 stores programs such as firmware and the like.

The RAM 16 is a volatile memory. For example, the RAM 16 is the SRAM. The RAM 16 is used as a work area for the processor 12. The RAM 16 stores firmware for managing the NAND flash memory 30 and various kinds of management information.

The NAND interface circuit 17 is a circuit that controls communication between the memory controller 10 and the NAND flash memory 30. The NAND interface circuit 17 is connected to the NAND flash memory 30 via the NAND bus. For example, the NAND interface circuit 17 controls transfer of data, commands, addresses, and the like between the memory controller 10 and the NAND flash memory 30.

1.1.2 Configuration of NAND Flash Memory

Figure 2:
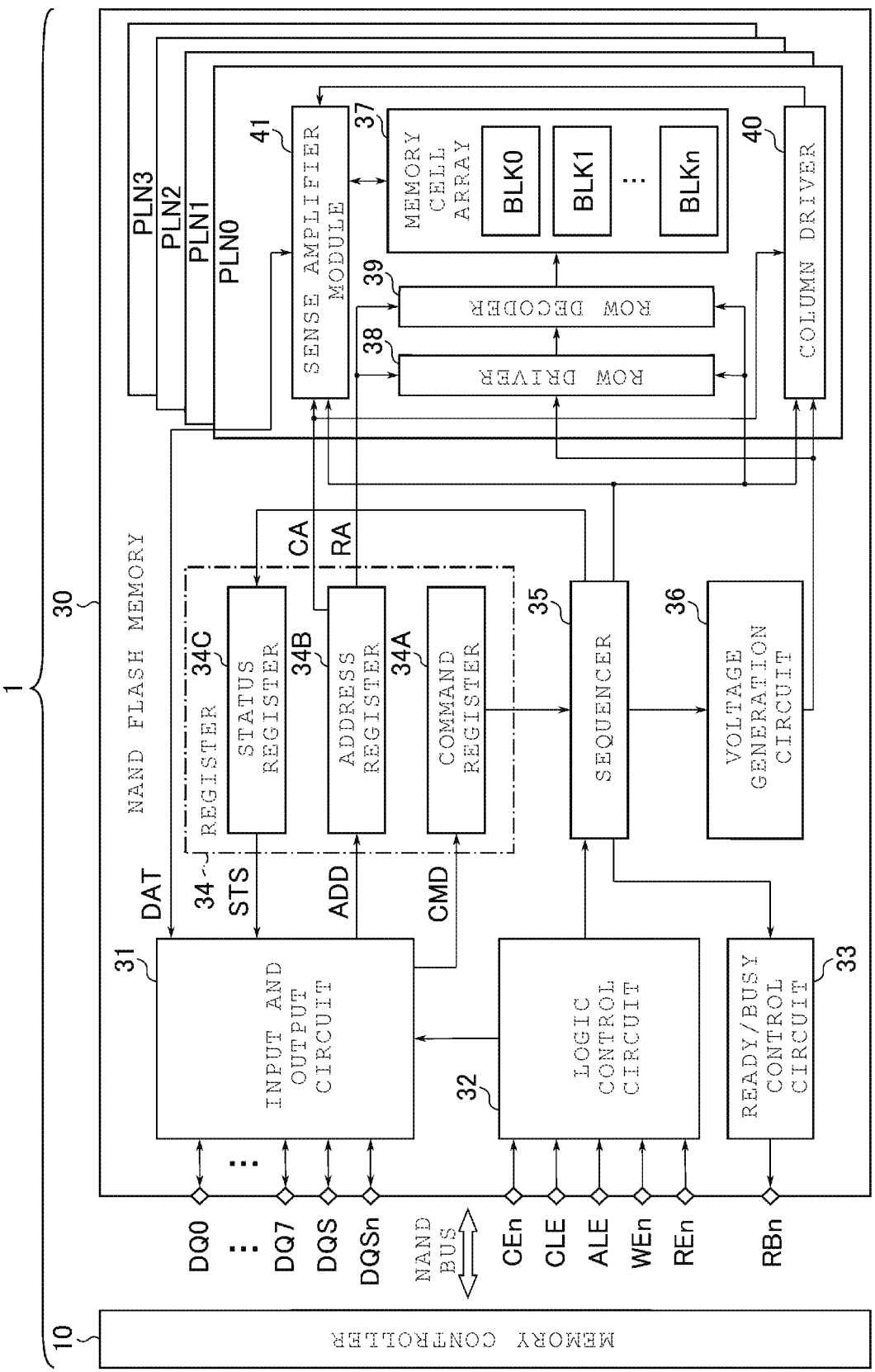
FIG. 2 is a block diagram of an example of a configuration of the semiconductor memory according to the first embodiment.

A configuration of the NAND flash memory 30 will be described with reference to FIG. 2. FIG. 2 is a block diagram of an example of the configuration of the NAND flash memory 30. The NAND flash memory 30 includes an input and output circuit 31, a logic control circuit 32, a ready/busy control circuit 33, a register 34, a sequencer 35, a voltage generation circuit 36, and a plurality of planes PLN.

The input and output circuit 31 is a circuit that transmits and receives signals and information to and from the memory controller 10. The input and output circuit 31 transmits and receives input and output signals DQ (e.g., 8-bit signals DQ0 to DQ7) and data strobe signals DQS and DQSn (inverted signals of the signal DQS) to and from the memory controller 10. The signal DQ is data transmitted and received between the NAND flash memory 30 and the memory controller 10. For example, the signal DQ is a command CMD, an address ADD, status information STS, and data DAT. The signals DQS and DQSn are signals for controlling the timing of transmission and reception of the signal DQ. For example, when writing data, the signals DQS and DQSn are transmitted from the memory controller 10 to the NAND flash memory 30 together with the signal DQ including the write data. The NAND flash memory 30 receives the signal DQ including the write data in synchronization with the signals DQS and DQSn. Further, when reading data, the signals DQS and DQSn are transmitted from the NAND flash memory 30 to the memory controller 10 together with the signal DQ including the read data. The memory controller 10 receives the signal DQ including the read data in synchronization with the signals DQS and DQSn. It is noted that the input and output circuit 31 may receive the signals DQS and DQSn from the memory controller 10 via the logic control circuit 32.

In addition, the input and output circuit 31 transmits the command CMD in the signal DQ to a command register 34A. The input and output circuit 31 transmits the address ADD in the signal DQ to an address register 34B. The input and output circuit 31 receives the status information STS from a status register 34C. The input and output circuit 31 transmits and receives data DAT in the signal DQ to and from a sense amplifier module 41 of each plane PLN.

The logic control circuit 32 is a circuit that controls the input and output circuit 31 and the sequencer 35 based on control signals. The logic control circuit 32 receives, from the memory controller 10, a chip enable signal CEn, a command latch enable signal CLE, an address latch enable signal ALE, a write enable signal WEn, and a read enable signal REn. The signal CEn is a signal for enabling the NAND flash memory 30. The signal CLE is a signal indicating that the signal DQ received by the NAND flash memory 30 is the command CMD. The signal ALE is a signal indicating that the signal DQ received by the NAND flash memory 30 is the address ADD. The signal WEn is a signal that instructs the NAND flash memory 30 to input the signal DQ. The signal REn is a signal that instructs the NAND flash memory 30 to output the signal DQ. The NAND flash memory 30 generates the signals DQS and DQSn based on the signal REn. The NAND flash memory 30 outputs the signal DQ to the memory controller 10 based on the generated signals DQS and DQSn. The logic control circuit 32 controls the input and output circuit 31 and the sequencer 35 based on the received signal.

The ready/busy control circuit 33 is a circuit that notifies the memory controller 10 of the operation status of the sequencer 35. The ready/busy control circuit 33 transmits a ready/busy signal RBn to the memory controller 10 based on operation status of the sequencer 35. The signal RBn is a signal indicating whether the NAND flash memory 30 is in a ready state or a busy state. For example, the signal RBn is set to "Low" level when the NAND flash memory 30 is in a busy state. The ready state is a state in which the NAND flash memory 30 can receive commands from the memory controller 10. The busy state is a state in which the NAND flash memory 30 cannot receive commands from the memory controller 10.

The register 34 is a circuit that temporarily stores information. The register 34 includes the command register 34A, the address register 34B, and the status register 34C.

The command register 34A is a circuit that stores the command CMD. For example, the command CMD includes instructions for causing the sequencer 35 to execute a read operation, a write operation, and an erasing operation.

The address register 34B is a circuit that stores the address ADD. For example, the address ADD includes a row address RA (including a block address and a page address) and a column address CA. For example, the block address, the page address, and the column address CA are used for selecting a block BLK, a word line, and a bit line, respectively. For example, the address register 34B transfers the row address RA to a row driver 38 and a row decoder 39. The address register 34B transfers the column address CA to a column driver 40 and the sense amplifier module 41.

For example, the status register 34C is a circuit that temporarily stores the status information STS during the read, write, and erasing operations. The status information STS is used for notifying the memory controller 10 whether or not the operation is completed normally.

The sequencer 35 is a circuit that controls the operation of other circuits according to a predetermined program. The sequencer 35 controls the overall operation of the NAND flash memory 30. For example, the sequencer 35 controls the ready/busy control circuit 33, the voltage generation circuit 36, and the row driver 38, the row decoder 39, the column driver 40, and the sense amplifier module 41 of each plane PLN based on the command CMD stored in the command register 34A. For example, the sequencer 35 performs the read, write, and erasing operations.

The voltage generation circuit 36 is a circuit that generates voltages used in the read, write, and erasing operations. For example, the voltage generation circuit 36 supplies the generated voltage to the row driver 38, the column driver 40, and the like.

The plane PLN is a component (memory area) that performs the data write and read operations independently. In the example of FIG. 2, the NAND flash memory 30 includes four planes PLN0, PLN1, PLN2, and PLN3. It is noted that the number of planes PLN in the NAND flash memory 30 is not limited to four. The planes PLN0 to PLN3 can operate independently of each other. In addition, the planes PLN0 to PLN3 can operate in parallel. In other words, the NAND flash memory 30 has a plurality of memory areas that can be controlled independently of each other. Hereinafter, when it is not intended to limit any specific one of the planes PLN0 to PLN3, the plane is referred to as the "plane PLN".

Next, the internal configuration of the plane PLN will be described. Hereinafter, a case in which the planes PLN0 to PLN3 have the same configuration will be described. It is noted that the configuration of each plane PLN may be different from each other. The plane PLN includes a memory cell array 37, the row driver 38, the row decoder 39, the column driver 40, and the sense amplifier module 41.

The memory cell array 37 includes a plurality of blocks BLK0 to BLKn (n is an integer of 1 or more). For example, the block BLK is a set of the plurality of memory cell transistors in which data is collectively erased. For example, the block BLK is used as a unit of data erasing operation. The block BLK includes a plurality of word lines. The memory cell transistor can store data in a nonvolatile manner. The memory cell array 37 includes a plurality of bit lines and the plurality of word lines. For example, each memory cell transistor is associated with one bit line and one word line. Details of the memory cell array 37 will be described below.

The row driver 38 is a circuit that supplies voltage to the row decoder 39. The row driver 38 supplies voltages used in the read, write, and erasing operations to the row decoder 39 based on the row address RA.

The row decoder 39 is a circuit that selects one block BLK in the memory cell array 37 based on the row address RA. The row decoder 39 transfers the voltage applied to a signal line corresponding to the selected word line to the selected word line in the selected block BLK.

The column driver 40 is a circuit that supplies voltage to the sense amplifier module 41. The column driver 40 supplies voltages used in the read, write, and erasing operations to the sense amplifier module 41 based on the column address CA.

The sense amplifier module 41 is a circuit that determines data stored in the memory cell transistors. In the read operation, the sense amplifier module 41 determines the data stored in the memory cell transistors based on the voltages on the bit lines. The sense amplifier module 41 transfers the determined result to the input and output circuit 31 as the read data DAT. In addition, in the write operation, the sense amplifier module 41 applies a voltage to the bit line based on the write data DAT received from the input and output circuit 31.

1.1.3 Circuit Configuration of Memory Cell Array

Figure 3:
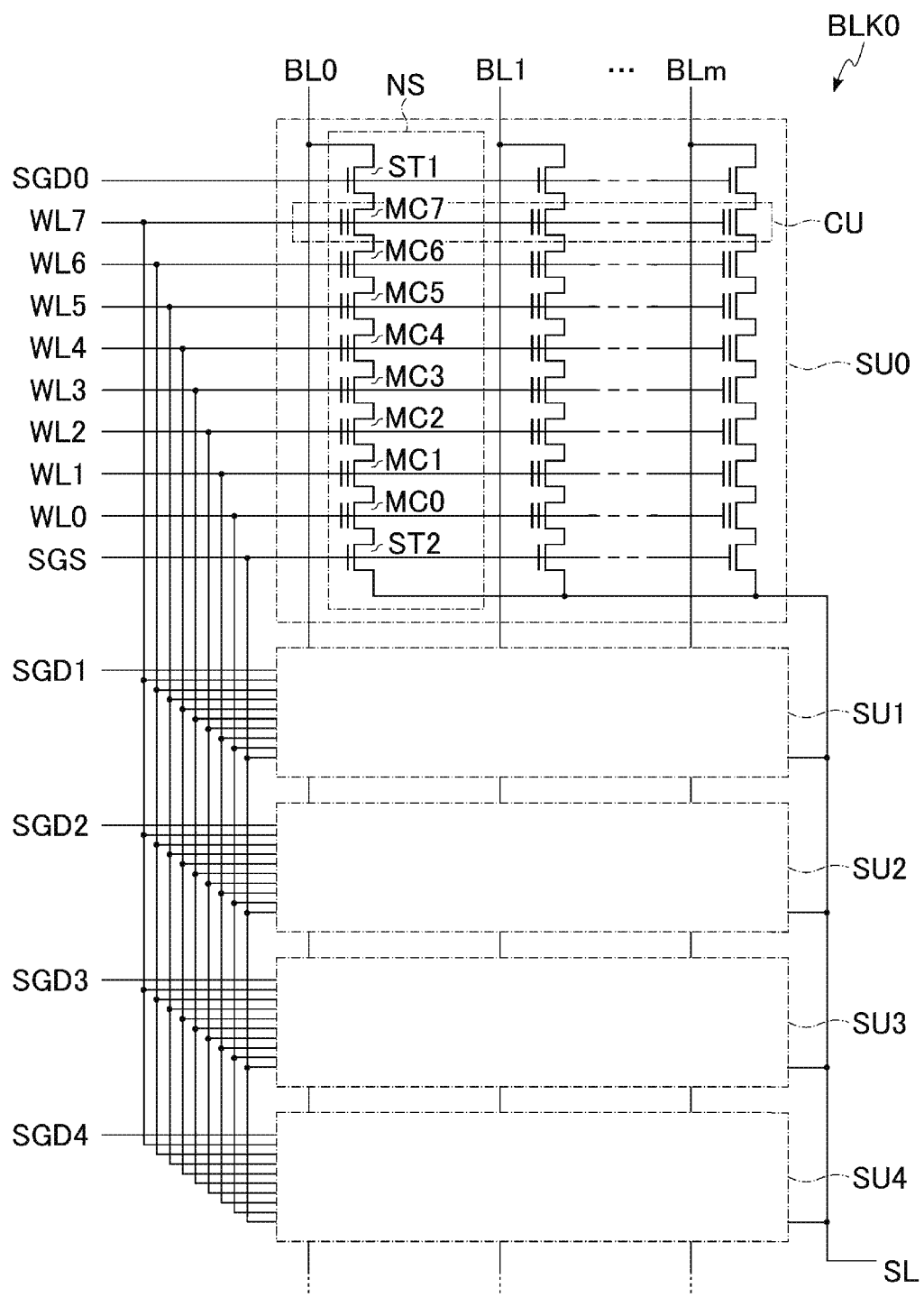
FIG. 3 is a circuit diagram of a memory cell array in the semiconductor memory according to the first embodiment.

A circuit configuration of the memory cell array 37 will be described with reference to FIG. 3. FIG. 3 is a circuit diagram of the memory cell array 37. FIG. 3 shows a circuit configuration of the block BLK0 in the memory cell array 37 as an example of the circuit configuration of the memory cell array 37. The other blocks BLK have the same configuration as that shown in FIG. 3.

For example, the block BLK includes five string units SU0 to SU4. For example, each string unit SU is a set of a plurality of NAND strings NS that are collectively selected in the write or read operation. Each string unit SU includes a plurality of NAND strings NS respectively associated with bit lines BL0 to BLm (m is an integer of 1 or more). The NAND string NS is a set of the plurality of memory cell transistors connected in series. For example, each NAND string NS includes memory cell transistors MC0 to MC7 and select transistors ST1 and ST2. The memory cell transistor MC stores data in a nonvolatile manner. The memory cell transistor MC includes a control gate and a charge storage layer. The select transistors ST1 and ST2 are switching elements. Each of the select transistors ST1 and ST2 is used for selecting the string unit SU during various operations.

In each NAND string NS, the memory cell transistors MC0 to MC7 are connected in series. A drain of the select transistor ST1 is connected to the associated bit line BL. A source of the select transistor ST1 is connected to one end of the memory cell transistors MC0 to MC7 connected in series. A drain of the select transistor ST2 is connected to the other end of the memory cell transistors MC0 to MC7 connected in series. A source of the select transistor ST2 is connected to a source line SL.

In the same block BLK, control gates of the memory cell transistors MC0 to MC7 are connected to word lines WL0 to WL7, respectively. Gates of the select transistors ST1 in the string units SU0 to SU4 are connected to the select gate lines SGD0 to SGD4, respectively. Gates of the select transistors ST2 in the same block BLK are commonly connected to the select gate line SGS.

For example, in the circuit configuration of the memory cell array 37 described above, the bit line BL is shared by the NAND strings NS assigned with the same column address CA in each string unit SU. For example, the source line SL is shared by a plurality of blocks BLK.

For example, a set of a plurality of memory cell transistors MC connected to a common word line WL in one string unit SU is referred to as a cell unit CU. The block BLK includes a plurality of cell units CU. Data, which is stored in the cell unit CU including the plurality of memory cell transistors MC each storing 1-bit data according to a threshold voltage, corresponds to one page data. The cell unit CU can store data of two pages or more based on the number of bits of data stored by the memory cell transistor MC.

It is noted that the circuit configuration of the memory cell array 37 is not limited to the configuration described above. For example, there may be any number of string units SU in each block BLK and there may be any number of memory cell transistors MC and select transistors ST1 and ST2 in each NAND string NS. Hereinafter, the memory cell transistor MC may also be referred to as the memory cell MC.

1.1.4 Configuration of Sense Amplifier Module

Figure 4:
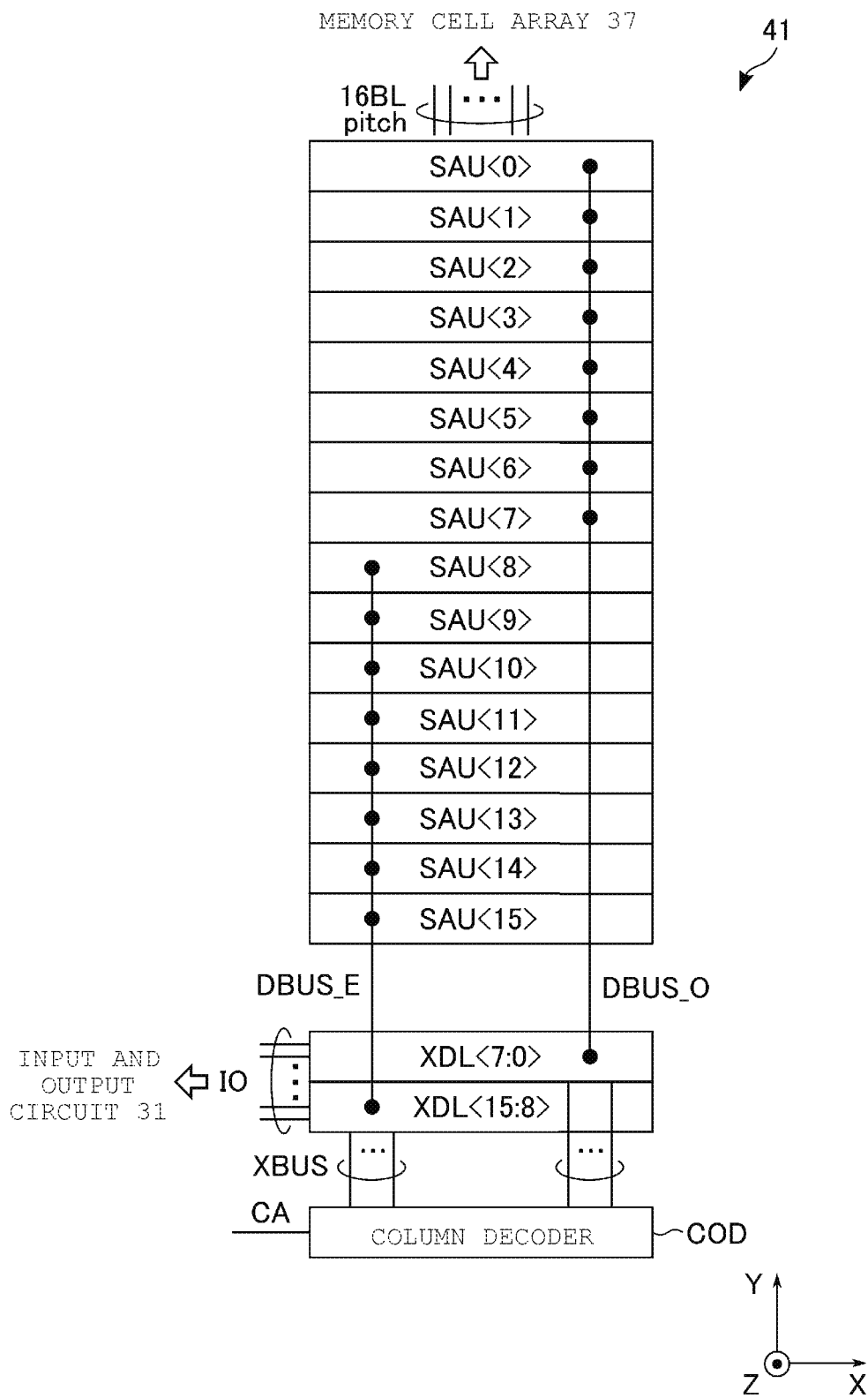
FIG. 4 is a block diagram of an example of a configuration of a sense amplifier module in the semiconductor memory according to the first embodiment.

A configuration of the sense amplifier module 41 will be described with reference to FIG. 4. FIG. 4 is a block diagram of an example of the configuration of the sense amplifier module 41. In the drawings referenced below, an X direction corresponds to an extending direction of the word line WL, a Y direction corresponds to an extending direction of the bit line BL, and a Z direction corresponds to a direction perpendicular to a surface of a semiconductor substrate used for forming the NAND flash memory 30.

The sense amplifier module 41 includes a plurality of sense amplifier units SAU, a plurality of latch circuits XDL, and a column decoder COD. The sense amplifier module 41 includes a plurality of sets including the plurality of sense amplifier units SAU and the plurality of latch circuits XDL shown in FIG. 4. Although FIG. 4 shows an example in which 16 sets including the sense amplifier units SAU and the latch circuits XDL are provided in the Y direction, any number of sets may be provided. For example, 12 sets or 8 sets including the sense amplifier units SAU and the latch circuits XDL may be provided in the Y direction.

The sense amplifier unit SAU is a circuit that senses data read from the memory cells MC in the memory cell array 37. The sense amplifier unit SAU is provided for each bit line BL. The sense amplifier unit SAU senses the read data on the corresponding bit line BL in the read operation. The sense amplifier unit SAU transfers the sensed result to the input and output circuit 31. In addition, the sense amplifier unit SAU transfers write data to the corresponding bit line BL in the write operation. In the example of FIG. 4, eight sense amplifier units SAU<0> to SAU<7> are commonly connected to one bus DBUS (hereinafter, referred to as "DBUS_O"). Eight sense amplifier units SAU<8> to SAU<15> are commonly connected to one bus DBUS (hereinafter, referred to as "DBUS_E"). It is noted that any number of sense amplifier units SAU may be connected to one bus DBUS. The sense amplifier unit SAU is connected to a latch circuit XDL via the corresponding bus DBUS.

The latch circuit XDL is a circuit that temporarily stores the data related to the bit line BL. The latch circuit XDL is provided for each sense amplifier unit SAU. In the example of FIG. 4, eight latch circuits XDL<7:0> respectively corresponding to the sense amplifier units SAU<0> to SAU<7> are commonly connected to the bus DBUS_O. Eight latch circuits XDL<15:8> respectively corresponding to the sense amplifier units SAU<8> to SAU<15> are commonly connected to the bus DBUS_E. Each latch circuit XDL is connected to a bus XBUS. The bus XBUS is provided for each latch circuit XDL. The latch circuit XDL is connected to the column decoder COD via the corresponding bus XBUS. In addition, the latch circuit XDL is connected to a data line IO. The data line IO is provided for each latch circuit XDL. The latch circuit XDL is connected to the input and output circuit 31 via the corresponding data line IO.

The column decoder COD is a circuit that decodes the column address CA. The column decoder COD receives the column address CA from the address register 34B. The column decoder COD selects the latch circuit XDL based on the result of decoding the column address CA.

For example, data received from the memory controller 10 by the input and output circuit 31 is first transferred via the data line IO and stored in the latch circuit XDL selected by the column decoder COD. Then, the data is transferred to the sense amplifier unit SAU via the bus DBUS. In addition, data in the sense amplifier unit SAU is first transferred via the bus DBUS and stored in the latch circuit XDL. Then, the data is transferred to the input and output circuit 31 via the data line IO, and then transmitted from the input and output circuit 31 to the memory controller 10.

1.1.5 Circuit Configuration of Sense Amplifier Module

A circuit configuration of the sense amplifier module 41 will be described with reference to FIGS. 5 and 6.

Figure 5:
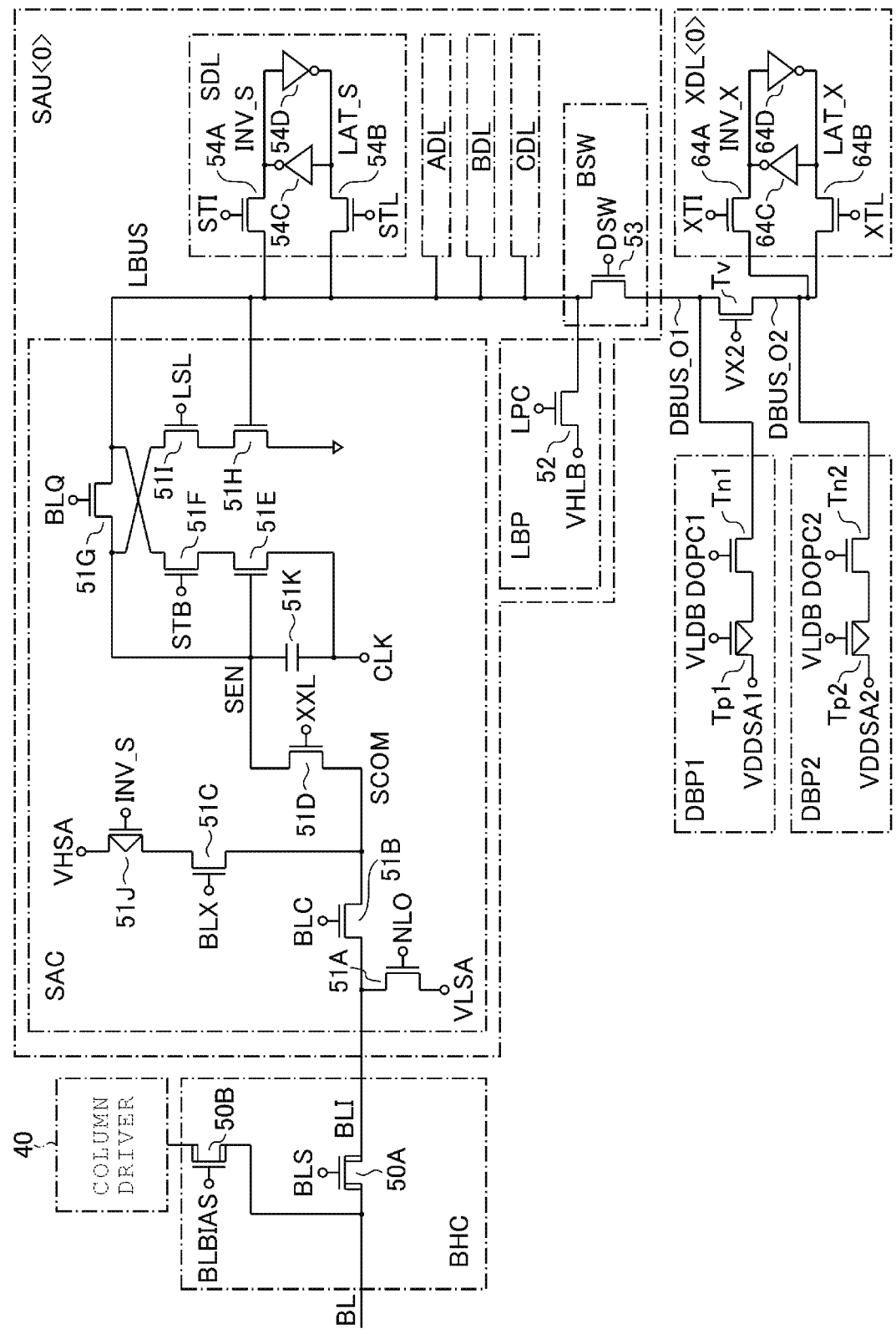
FIG. 5 is a circuit diagram showing an example of a circuit configuration of the sense amplifier module in the semiconductor memory according to the first embodiment.

FIG. 5 is a circuit diagram showing an example of the circuit configuration of the sense amplifier module 41. It is noted that FIG. 5 particularly shows the sense amplifier unit SAU<0> in the sense amplifier module 41 as a representative example. The sense amplifier units SAU<1> to SAU<7> have the same configuration as the sense amplifier unit SAU<0>. In the following description, when a source and a drain of a transistor are not limited, either one of the source or the drain of the transistor is referred to as "one end (or a first end) of the transistor" and the other of the source and the drain of the transistor is referred to as "the other end (or a second end) of the transistor".

The sense amplifier module 41 further includes a BL hookup circuit BHC and pre-charge circuits DBP (DBP1 and DBP2 in the example of FIG. 5). It is noted that the bus XBUS and the column decoder COD are omitted in FIG. 5.

The BL hookup circuit BHC is a circuit connecting the bit line BL and the sense amplifier unit SAU. The BL hookup circuit BHC is provided for each sense amplifier unit SAU. The BL hookup circuit BHC includes high breakdown voltage n-channel MOS transistors 50A and 50B.

One end of the transistor 50A is connected to a wiring BLI inside the sense amplifier module 41. The other end of the transistor 50A is connected to the corresponding bit line BL. A control signal BLS is input to the gate of the transistor 50A. For example, the control signal BLS is generated by the sequencer 35. For example, the transistor 50A is used for preventing high voltage from being supplied to the sense amplifier unit SAU when the high voltage is applied to the bit line BL via the transistor 50B.

One end of the transistor 50B is connected to the column driver 40. The other end of the transistor 50B is connected to the corresponding bit line BL. A control signal BLBIAS is input to the gate of the transistor 50B. For example, the control signal BLBIAS is generated by the sequencer 35. For example, in the erasing operation, the transistor 50B is used when an erasing voltage is applied from the column driver 40 to the bit line BL.

The pre-charge circuit DBP is a circuit pre-charging the bus DBUS. The pre-charge circuit DBP is provided for each bus DBUS. The pre-charge circuit DBP includes an n-channel MOS transistor Tn and a p-channel MOS transistor Tp. For example, the transistors Tn (Tn1 and Tn2 in the example of FIG. 5) are used when controlling pre-charge timing. For example, the transistors Tp (Tp1 and Tp2 in the example of FIG. 5) are used when supplying a pre-charge voltage to the bus DBUS.

In the present embodiment, a bus DBUS_O1 is provided as the bus DBUS_O connected to the sense amplifier units SAU<0> to SAU<7>. A bus DBUS_O2 is provided as the bus DBUS_O connected to the latch circuits XDL<0> to XDL<7>. An n-channel MOS transistor Tv is provided between the bus DBUS_O1 and the bus DBUS_O2. For example, the transistor Tv is used when connecting the sense amplifier units SAU<0> to SAU<7> and the latch circuits XDL<0> to XDL<7>.

One end of the bus DBUS_O1 is connected to the sense amplifier unit SAU<0>. The other end of the bus DBUS_O1 is connected to one end of the transistor Tv. One end of the bus DBUS_O2 is connected to the other end of the transistor Tv. The other end of the bus DBUS_O2 is connected to the latch circuit XDL<0>. A voltage VX2 is applied to the gate of the transistor Tv.

A pre-charge circuit DBP1 connected to the bus DBUS_O1 includes an n-channel MOS transistor Tn1 and a p-channel MOS transistor Tp1.

One end of the transistor Tn1 is connected to the bus DBUS_O1. The other end of the transistor Tn1 is connected to one end of the transistor Tp1. A control signal DOPC1 is input to the gate of the transistor Tn1. For example, the control signal DOPC1 is generated by the sequencer 35.

A voltage VDDSA1 is applied to the other end of the transistor Tp1. For example, the voltage VDDSA1 is a voltage VDD. A voltage VLDB is applied to the gate of the transistor Tp1. For example, the voltage VLDB is a ground voltage VSS. When the transistors Tp1 and Tn1 are in an on state, the voltage VDDSA1 is applied to the bus DBUS_O1. As a result, the bus DBUS_O1 is charged.

A pre-charge circuit DBP2 connected to the bus DBUS_O2 includes an n-channel MOS transistor Tn2 and a p-channel MOS transistor Tp2.

One end of the transistor Tn2 is connected to the bus DBUS_O2. The other end of the transistor Tn2 is connected to one end of the transistor Tp2. A control signal DOPC2 is input to the gate of the transistor Tn2. For example, the control signal DOPC2 is generated by the sequencer 35.

A voltage VDDSA2 is applied to the other end of the transistor Tp2. For example, the voltage VDDSA2 is a voltage VDD. The voltage VLDB is applied to the gate of the transistor Tp2. When the transistors Tp2 and Tn2 are in an on state, the voltage VDDSA2 is applied to the bus DBUS_O2. As a result, the bus DBUS_O2 is charged.

Voltages may be applied to the buses DBUS_O1 and DBUS_O2 by the pre-charge circuits DBP1 and DBP2 at the same timing or at different timings. In other words, the sequencer 35 may turn on the transistors Tn1 and Tn2 at the same timing or at different timings.

When the transistor Tv is in an on state and the transistors Tp1 and Tn1 are in an on state, the voltage VDDSA1 is applied not only to the bus DBUS_O1 but also to the bus DBUS_O2. When the transistor Tv is in the on state and the transistors Tp2 and Tn2 are in an on state, the voltage VDDSA2 is applied not only to the bus DBUS_O2 but also to the bus DBUS_O1. In other words, when the transistor Tv is in the on state, the buses DBUS_O1 and DBUS_O2 can be charged simultaneously.

Meanwhile, when the transistor Tv is in an off state and the transistors Tp1 and Tn1 are in the on state, the voltage VDDSA1 is applied to the bus DBUS_O1. In addition, when the transistor Tv is in the off state and the transistors Tp2 and Tn2 are in the on state, the voltage VDDSA2 is applied to the bus DBUS_O2. In other words, when the transistor Tv is in the off state, the buses DBUS_O1 and DBUS_O2 can be charged separately.

Next, the circuit configuration of the sense amplifier unit SAU will be described.

The sense amplifier unit SAU includes a sense amplifier circuit SAC, a pre-charge circuit LBP, a bus switch BSW, and four latch circuits SDL, ADL, BDL, and CDL. It is noted that the number of latch circuits in the sense amplifier unit SAU is not limited to four, and any number of latch circuits can be designed. For example, the number of latch circuits in the sense amplifier unit SAU is designed based on the number of bits of data stored in each memory cell transistor MC.

The sense amplifier circuit SAC is a circuit sensing the data read from the memory cell transistor MC and determine a bit value of the read data. In the read operation, the sense amplifier circuit SAC senses the read data on the bit line BL and determines whether the read data is "0" or "1". In the write operation, the sense amplifier circuit SAC applies a voltage to the bit line BL based on the write data. In addition, the sense amplifier circuit SAC performs an AND operation or an OR operation using the data in the latch circuits SDL, ADL, BDL, and CDL.

The sense amplifier circuit SAC includes re-channel MOS transistors 51A to 51I, a p-channel MOS transistor 51J, and a capacitive element 51K.

One end of the transistor 51A is connected to the wiring BLI. A voltage VLSA is applied to the other end of the transistor 51A. For example, the voltage VLSA is the ground voltage VSS. A control signal NLO is input to the gate of the transistor 51A. For example, the control signal NLO is generated by the sequencer 35. For example, the transistor 51A is used when charging or discharging the corresponding bit line BL.

One end of the transistor 51B is connected to the wiring BLI. The other end of the transistor 51B is connected to a node SCOM. A control signal BLC is input to the gate of the transistor 51B. For example, the control signal BLC is generated by the sequencer 35. For example, the transistor 51B is used when clamping the corresponding bit line BL to the voltage corresponding to the signal BLC.

One end of the transistor 51C is connected to the node SCOM. The other end of the transistor 51C is connected to one end of the transistor 51J. A control signal BLX is input to the gate of the transistor 51C. For example, the control signal BLX is generated by the sequencer 35.

One end of the transistor 51D is connected to the node SCOM. The other end of the transistor 51D is connected to a node SEN. A control signal XXL is input to the gate of the transistor 51D. For example, the control signal XXL is generated by the sequencer 35. The transistor 51D is used when controlling the period for sensing the data in the memory cell MC. When reading data, the node SEN serves as a sense node for sensing data in the target memory cell MC. More specifically, when reading, the charges pre-charged in the node SEN (and the capacitive element 51K) are transferred to the bit line BL according to whether the target memory cell MC is in an on state or an off state. Data is read by sensing the voltage of the node SEN.

A clock signal CLK is input to one end of the transistor 51E. The other end of the transistor 51E is connected to one end of the transistor 51F. The gate of the transistor 51E is connected to the node SEN.

The other end of the transistor 51F is connected to a bus LBUS. A control signal STB is input to the gate of the transistor 51F. For example, the control signal STB is generated by the sequencer 35.

One end of the transistor 51G is connected to the node SEN. The other end of the transistor 51G is connected to the bus LBUS. A control signal BLQ is input to the gate of the transistor 51G. For example, the control signal BLQ is generated by the sequencer 35.

One end of the transistor 51H is grounded. The other end of the transistor 51H is connected to one end of the transistor 51I. The gate of the transistor 51H is connected to the bus LBUS.

The other end of the transistor 51I is connected to the node SEN. A control signal LSL is input to the gate of the transistor 51I. For example, the control signal LSL is generated by the sequencer 35.

A voltage VHSA is applied to the other end of the transistor 51J. For example, the voltage VHSA is a power supply voltage VDD. The gate of the transistor 51J is connected to a node INV_S, which will be described below.

One electrode of the capacitive element 51K is connected to the node SEN. The clock signal CLK is input to the other electrode of the capacitive element 51K.

Next, the circuit configuration of the pre-charge circuit LBP will be described.

The pre-charge circuit LBP is a circuit pre-charging the bus LBUS. The pre-charge circuit LBP includes an n-channel MOS transistor 52.

One end of the transistor 52 is connected to the bus LBUS. A voltage VHLB is applied to the other end of the transistor 52. For example, the voltage VHLB is a power supply voltage VDD. A control signal LPC is input to the gate of the transistor 52. For example, the control signal LPC is generated by the sequencer 35. When the transistor 52 is in an on state, the voltage VHLB is applied to the bus LBUS. As a result, the bus LBUS is charged.

Next, the circuit configuration of the bus switch BSW will be described.

The bus switch BSW is a switch connecting the bus LBUS and the bus DBUS. The bus switch BSW includes an n-channel MOS transistor 53.

One end of the transistor 53 is connected to the bus LBUS. The other end of the transistor 53 is connected to the bus DBUS_O1. A control signal DSW is input to the gate of the transistor 53. For example, the control signal DSW is generated by the sequencer 35.

Next, the circuit configurations of the latch circuits SDL, ADL, BDL, and CDL will be described.

The latch circuits SDL, ADL, BDL, and CDL are circuits that temporarily store data. The latch circuit SDL includes n-channel MOS transistors 54A and 54B and inverters 54C and 54D.

One end of the transistor 54A is connected to the bus LBUS. The other end of the transistor 54A is connected to a node INV_S. A control signal STI is input to the gate of the transistor 54A. For example, the control signal STI is generated by the sequencer 35.

One end of the transistor 54B is connected to the bus LBUS. The other end of the transistor 54B is connected to a node LAT_S. A control signal STL is input to the gate of the transistor 54B. For example, the control signal STL is generated by the sequencer 35.

An input terminal of the inverter 54C is connected to the node LAT_S. An output terminal of the inverter 54C is connected to the node INV_S.

An input terminal of the inverter 54D is connected to the node INV_S. An output terminal of the inverter 54D is connected to the node LAT_S.

The latch circuits ADL, BDL, and CDL have the same configuration as the latch circuit SDL.

In each sense amplifier unit SAU, the sense amplifier circuit SAC and the latch circuits SDL, ADL, BDL, and CDL are connected to the bus LBUS so as to transmit and receive data to and from each other.

Next, the circuit configuration of the latch circuit XDL will be described.

The latch circuit XDL<0> has the same configuration as the latch circuit SDL. That is, the latch circuit XDL<0> includes n-channel MOS transistors 64A and 64B and inverters 64C and 64D.

One end of the transistor 64A is connected to the bus DBUS_O2. The other end of the transistor 64A is connected to a node INV_X. A control signal XTI is input to the gate of the transistor 64A. For example, the control signal XTI is generated by the sequencer 35.

One end of the transistor 64B is connected to the bus DBUS_O2. The other end of the transistor 64B is connected to a node LAT_X. A control signal XTL is input to the gate of the transistor 64B. For example, the control signal XTL is generated by the sequencer 35.

Another latch circuit XDL also has the same configuration as that shown in FIG. 5.

As shown in FIG. 5, when the control signal LPC is an H level, the transistor 52 is turned on and the voltage VHLB is applied to the bus LBUS. When the transistor Tp1 is in the on state and the control signal DOPC1 is the H level, the transistors Tp1 and Tn1 are turned on and the voltage VDDSA1 is applied to the bus DBUS_O1. When the transistor Tp2 is in the on state and the control signal DOPC2 is the H level, the transistors Tp2 and Tn2 are turned on and the voltage VDDSA2 is applied to the bus DBUS_O2.

When the control signal STL is the H level, the transistor 54B is turned on to enable data transfer between the node LAT_S of the latch circuit SDL and the bus LBUS. When the control signal STI is the H level, the transistor 54A is turned on to enable data transfer between the node INV_S of the latch circuit SDL and the bus LBUS.

When the control signal DSW is the H level, the transistor 53 is turned on to connect the bus LBUS and the bus DBUS_O1. When the control signal DSW is the H level and the voltage VX2 is the H level, the transistors 53 and Tv are turned on to enable data transfer between the bus LBUS and the bus DBUS_O2.

When the control signal XTL is the H level, the transistor 64B is turned on to enable data transfer between the node LAT_X of the latch circuit XDL and the bus DBUS_O2. When the control signal XTI is the H level, the transistor 64A is turned on to enable data transfer between the node INV_X of the latch circuit XDL and the bus DBUS_O2.

Figure 6:
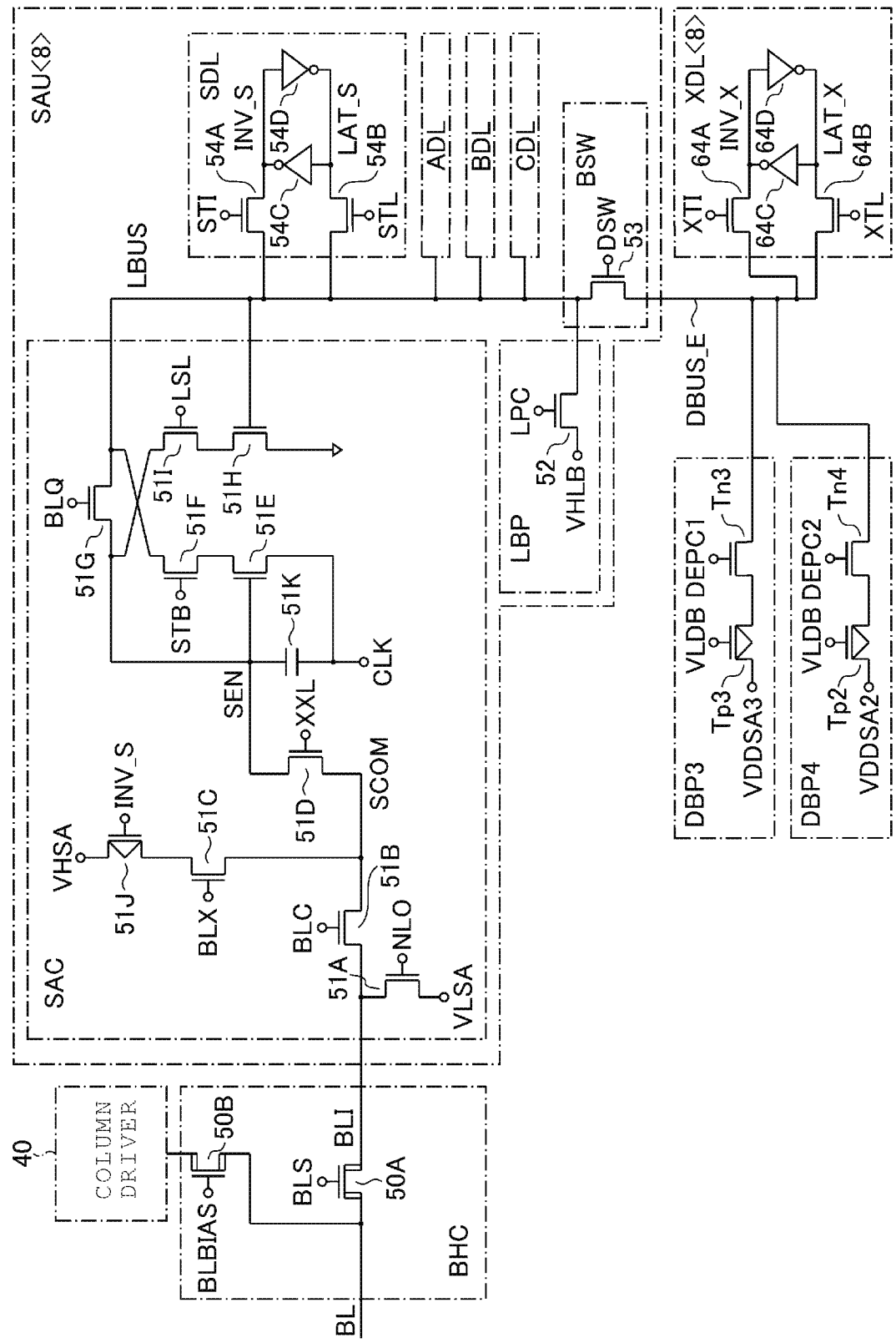
FIG. 6 is a circuit diagram showing an example of the circuit configuration of the sense amplifier module in the semiconductor memory according to the first embodiment.

FIG. 6 is a circuit diagram showing an example of the circuit configuration of the sense amplifier module 41. It is noted that FIG. 6 particularly shows the sense amplifier unit SAU<8> in the sense amplifier module 41 as a representative example. The sense amplifier units SAU<9> to SAU<15> have the same configuration as the sense amplifier unit SAU<8>. The sense amplifier unit SAU<8> has the same configuration as the sense amplifier unit SAU<0> in FIG. 5. The latch circuit XDL<8> has the same configuration as the latch circuit XDL<0> in FIG. 5. The BL hookup circuit BHC has the same configuration as that shown in FIG. 5.

In the present embodiment, a bus DBUS_E is provided as the bus DBUS connected to the sense amplifier units SAU<8> to SAU<15> and the latch circuits XDL<8> to XDL<15>.

A pre-charge circuit DBP3 connected to the bus DBUS_E includes an n-channel MOS transistor Tn3 and a p-channel MOS transistor Tp3.

One end of the transistor Tn3 is connected to the bus DBUS_E. The other end of the transistor Tn3 is connected to one end of the transistor Tp3. A control signal DEPC1 is input to the gate of the transistor Tn3. For example, the control signal DEPC1 is generated by the sequencer 35.

A voltage VDDSA3 is applied to the other end of the transistor Tp3. For example, the voltage VDDSA3 is a voltage VDD. The voltage VLDB is applied to the gate of the transistor Tp3. When the transistors Tp3 and Tn3 are in an on state, the voltage VDDSA3 is applied to the bus DBUS_E.

A pre-charge circuit DBP4 connected to the bus DBUS_E includes an n-channel MOS transistor Tn4 and the p-channel MOS transistor Tp2.

One end of the transistor Tn4 is connected to the bus DBUS_E. The other end of the transistor Tn4 is connected to one end of the transistor Tp2. A control signal DEPC2 is input to the gate of the transistor Tn4. For example, the control signal DEPC2 is generated by the sequencer 35.

The voltage VDDSA2 is applied to the other end of the transistor Tp2. The voltage VLDB is applied to the gate of the transistor Tp2. When the transistors Tp2 and Tn4 are in an on state, the voltage VDDSA2 is applied to the bus DBUS_E.

Voltages may be applied to the bus DBUS_E by the pre-charge circuits DBP3 and DBP4 at the same timing or at different timings. In other words, the sequencer 35 may turn on the transistors Tn3 and Tn4 at the same timing or at different timings.

1.1.6 Layout of Column Driver and Sense Amplifier Module

Figure 7:
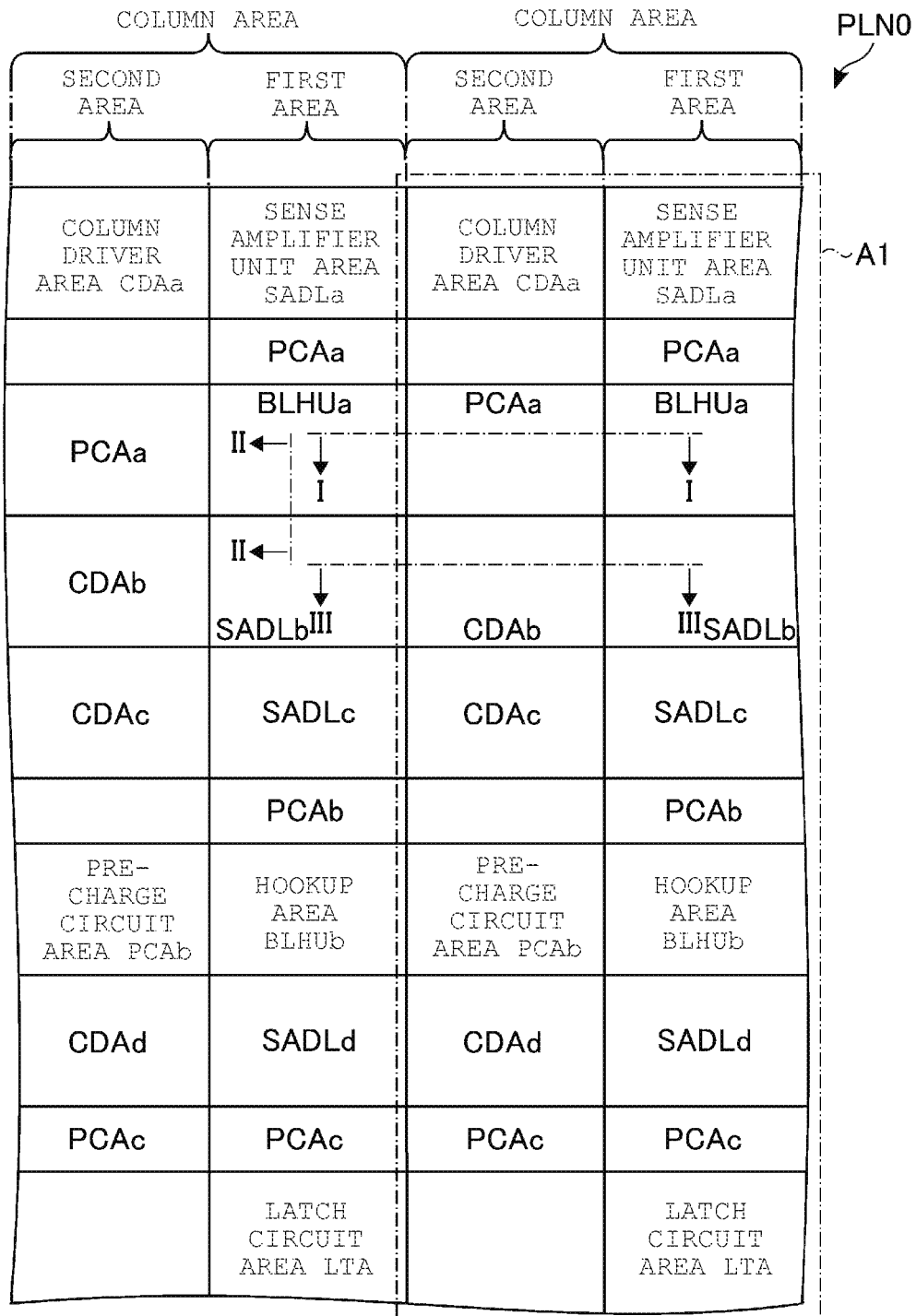
FIG. 7 is a plan view diagram showing an example of a layout of column drivers and sense amplifier modules in the semiconductor memory according to the first embodiment.

A layout of the column driver 40 and the sense amplifier module 41 will be described with reference to FIG. 7. FIG. 7 is a plan view diagram showing an example of the layout of the column driver 40 and the sense amplifier module 41. FIG. 7 shows the layout of the column driver 40 and the sense amplifier module 41 in the plane PLN0. The layouts of the column drivers 40 and the sense amplifier modules 41 in the other planes PLN are the same as that shown in FIG. 7.

In the plane PLN, an area in which the column driver 40 and the sense amplifier module 41 are provided is divided into a plurality of areas. Hereinafter, one divided area is referred to as a "column area". The column area corresponds to any number of bit lines BL. For example, the column areas are provided side by side in the X direction. Although two column areas are shown in the example of FIG. 7, the number of column areas in the plane PLN is not limited to two. In addition, in the example of FIG. 7, two column areas are provided adjacent to each other in the X direction, but another area may be provided between the two column areas. For example, an area in which the row driver 38 and the row decoder 39 are provided may be provided between two column areas.

The column area includes a first area and a second area. For example, the first area and the second area are provided side by side in the X direction. It is noted that the positions of the first area and the second area may be reversed.

The first area includes circuit areas, such as sense amplifier unit areas SADLa to SADLd, pre-charge circuit areas PCAa to PCAc, hookup areas BLHUa and BLHUb, and a latch circuit area LTA. The sense amplifier unit areas SADLa to SADLd are areas in which the sense amplifier units SAU are provided. The pre-charge circuit areas PCAa to PCAc are areas in which the pre-charge circuits DBP are provided. The hookup areas BLHUa and BLHUb are areas in which the BL hookup circuits BHC are provided. The latch circuit area LTA is an area in which the latch circuit XDL is provided. In the first area, the above areas are provided in the order of, from the upper side of the drawing, the sense amplifier unit area SADLa, the pre-charge circuit area PCAa, the hookup area BLHUa, the sense amplifier unit area SADLb, the sense amplifier unit area SADLc, the pre-charge circuit area PCAb, the hookup area BLHUb, the sense amplifier unit area SADLd, the pre-charge circuit area PCAc, and the latch circuit area LTA.

The second area includes circuit areas such as column driver areas CDAa to CDAd and pre-charge circuit areas PCAa to PCAc. The column driver areas CDAa to CDAd are areas in which the column drivers 40 are provided. The column driver area CDAa of the second area and the sense amplifier unit area SADLa of the first area are provided side by side in the X direction. An area adjacent to the pre-charge circuit area PCAa of the first area in the X direction is an area in which circuits such as a spare circuit and the like, which are not essential but useful for operation, are provided. The pre-charge circuit area PCAa of the second area and the hookup area BLHUa of the first area are provided side by side in the X direction. The pre-charge circuit DBP straddles the pre-charge circuit area PCAa of the second area and the pre-charge circuit area PCAa of the first area. The column driver area CDAb of the second area and the sense amplifier unit area SADLb of the first area are provided side by side in the X direction.

The column driver area CDAc of the second area and the sense amplifier unit area SADLc of the first area are provided side by side in the X direction. An area adjacent to the pre-charge circuit area PCAb of the first area in the X direction is an area in which circuits such as a spare circuit and the like, which are not essential but useful for operation, are provided. The pre-charge circuit area PCAb of the second area and the hookup area BLHUb of the first area are provided side by side in the X direction. The pre-charge circuit DBP straddles the pre-charge circuit area PCAb of the second area and the pre-charge circuit area PCAb of the first area. The column driver area CDAd of the second area and the sense amplifier unit area SADLd of the first area are provided side by side in the X direction. The pre-charge circuit area PCAc of the second area and the pre-charge circuit area PCAc of the first area are provided side by side in the X direction. The pre-charge circuit DBP straddles the pre-charge circuit area PCAc of the second area and the pre-charge circuit area PCAc of the first area. An area adjacent to the latch circuit area LTA of the first area in the X direction is an area in which circuits such as a spare circuit and the like, which are not essential but useful for operation, are provided.

1.1.7 Layout of Memory Cell Array

Figure 8:
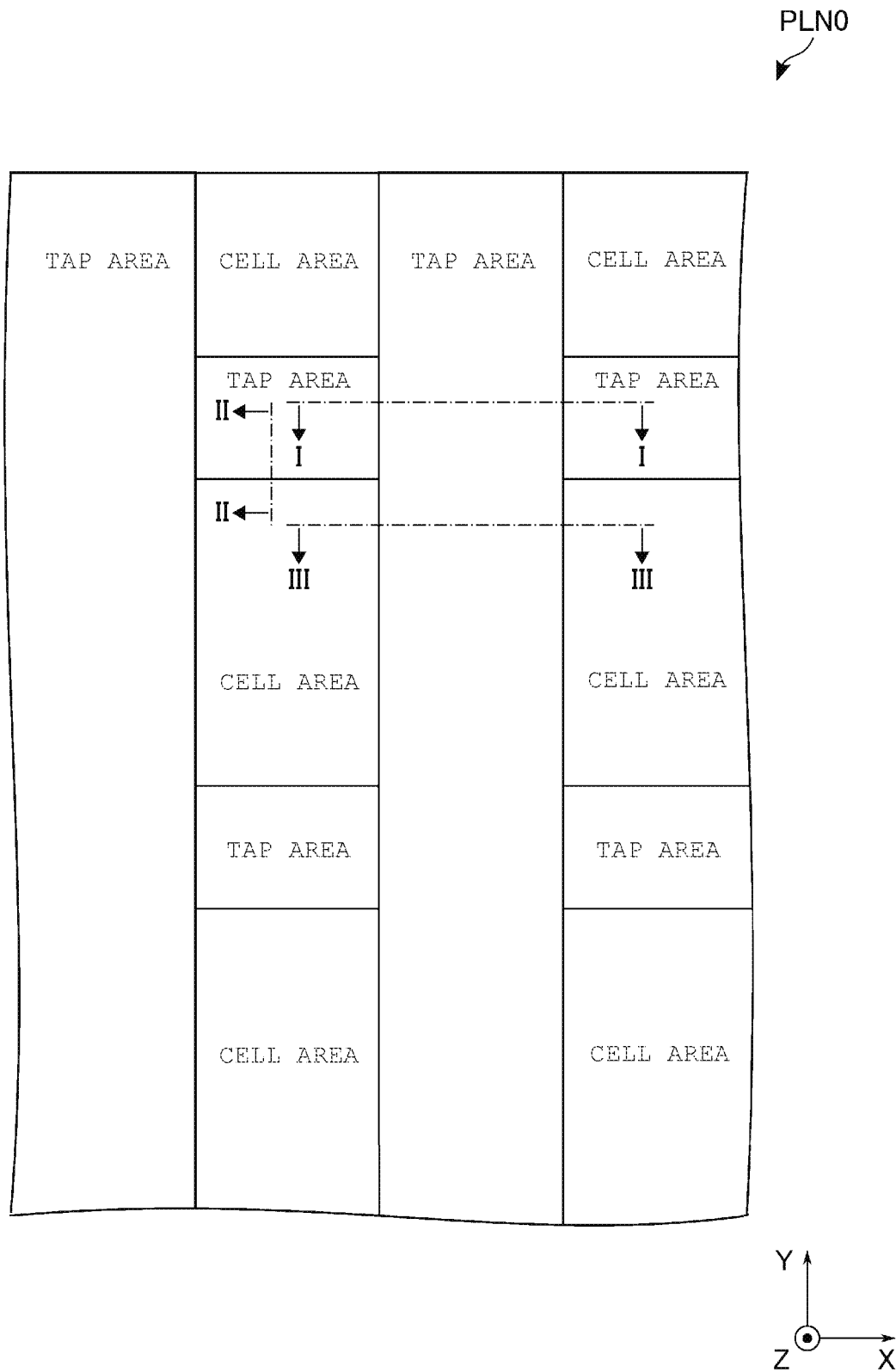
FIG. 8 is a plan view diagram showing an example of a layout of a memory cell array in the semiconductor memory according to the first embodiment.

A layout of the memory cell array 37 will be described with reference to FIG. 8. FIG. 8 is a plan view diagram showing an example of the layout of the memory cell array 37. FIG. 8 shows the layout of a portion of the memory cell array 37 in the plane PLN0. The layouts of the memory cell arrays 37 in the other planes PLN are the same as that shown in FIG. 8.

In the present embodiment, the NAND flash memory 30 has a structure in which peripheral circuits (the row driver 38, the row decoder 39, the column driver 40, the sense amplifier module 41, and the like) are provided under the memory cell array 37.

As shown in FIG. 8, the memory cell array 37 includes cell areas and tap areas. The cell area is provided above the area other than the hookup areas BLHUa and BLHUb of the first area of the column area shown in FIG. 7. Memory pillars MP are provided in the cell area. Details of the memory pillar MP will be described below. The tap area is provided above the hookup areas BLHUa and BLHUb of the first area of the column area shown in FIG. 7. In addition, the tap area is provided above the second area of the column area shown in FIG. 7. A contact plug C4 is provided in the tap area. The contact plug C4 electrically connects a wiring provided above the memory cell array 37 and a circuit provided below the memory cell array 37. Although the tap area and the cell area have the same width in the X direction for the sake of convenience, this is merely an example. The width of the cell area in the X direction may be greater than the width of the tap area in the X direction.

1.1.8 Cross-Sectional Structure of NAND Flash Memory

A cross-sectional structure of the NAND flash memory 30 will be described.

Figure 9:
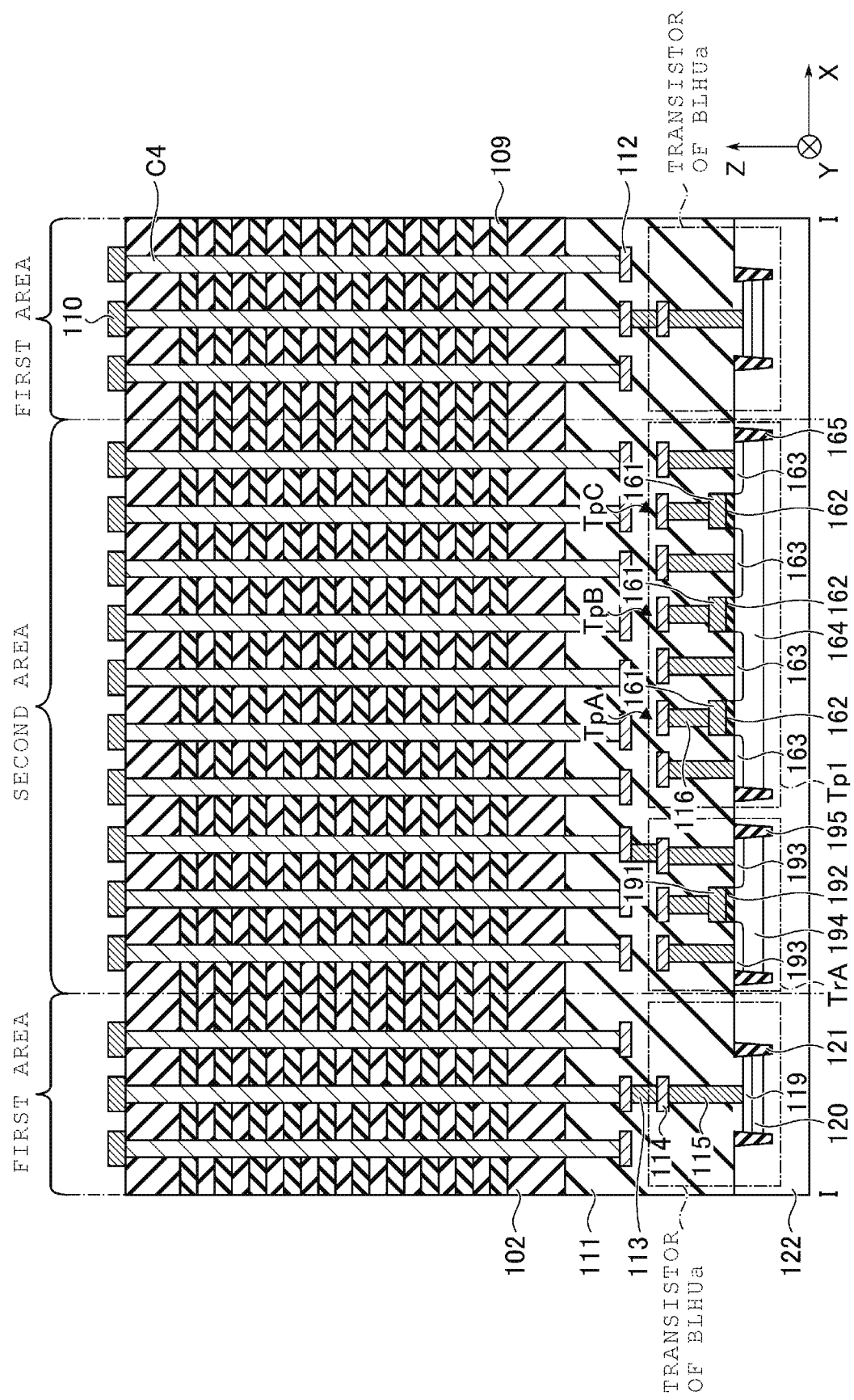
FIG. 9 is a cross-sectional diagram showing an example of a cross-sectional structure of the semiconductor memory according to the first embodiment.

FIG. 9 is a cross-sectional diagram showing a cross section taken along line I-I of FIGS. 7 and 8, showing an example of the cross-sectional structure of the NAND flash memory 30.

An insulating layer 111 is provided on a semiconductor substrate 122. The insulating layer 111 is made of an insulating material such as silicon oxide.

An insulating layer 102 is provided on the insulating layer 111 in the first area and the second area. The insulating layer 102 is made of an insulating material such as silicon oxide.

A plurality of (e.g., 10) insulating layers 109 are stacked and spaced apart from each other in the Z direction on the insulating layer 102. The insulating layer 102 is provided between the respective insulating layers 109. The insulating layer 102 is provided on the uppermost insulating layer 109. The insulating layer 109 is made of an insulating material such as silicon nitride.

The contact plug C4 passes through a plurality of insulating layers 102 and 109. The contact plug C4 electrically connects the wiring provided above the memory cell array 37 and the transistor provided below the memory cell array 37. For example, the contact plug C4 is made of a conductive material such as tungsten. A wiring layer 110 is provided on the contact plug C4. The wiring layer 110 is made of a conductive material such as tungsten, copper, and the like. A lower end of the contact plug C4 is in contact with a wiring layer 112 provided in the insulating layer 111. The wiring layer 112 is made of a conductive material such as tungsten or the like.

The transistor is provided in the semiconductor substrate 122 and the insulating layer 111 in the first area. The example of FIG. 9 shows the transistor provided in the hookup area BLHUa. The transistor provided in the hookup area BLHUa includes a gate electrode 117 to be described below, an insulating layer 118 to be described below, and two impurity diffusion layer areas 119.

The two impurity diffusion layer areas 119 are provided in a well region 120 in the semiconductor substrate 122. The two impurity diffusion layer areas 119 serve as a source (a source diffusion layer) and a drain (a drain diffusion layer) of the transistor. Hereinafter, the impurity diffusion layer area 119 will be referred to as a "source layer 119" or a "drain layer 119". For example, one impurity diffusion layer area 119 shown in FIG. 9 is the drain layer 119.

For example, an insulating layer 121 is provided on an upper surface (in the vicinity of a surface) of the semiconductor substrate 122. The insulating layer 121 is in contact with the upper surface of the semiconductor substrate 122. The insulating layer 121 electrically isolates the well region 120 (e.g., N-type well region and P-type well region). The insulating layer 121 is made of an insulating material.

A contact plug 115 is provided on the drain layer 119. The contact plug 115 electrically connects the drain layer 119 and a wiring layer 114. The contact plug 115 is made of a conductive material such as tungsten and the like. The wiring layer 114 is provided on the contact plug 115. The wiring layer 114 is made of a conductive material.

In the example of FIG. 9, a contact plug 113 is provided on the wiring layer 114 electrically connected to the drain layer 119. The contact plug 113 electrically connects the wiring layer 114 and the wiring layer 112. The contact plug 113 is made of a conductive material such as tungsten and the like. The wiring layer 112 is provided on the contact plug 113. A transistor in the hookup area BLHUa is electrically connected to the contact plug C4 via the contact plug 115, the wiring layer 114, the contact plug 113, and the wiring layer 112.

A plurality of transistors are provided in the semiconductor substrate 122 and the insulating layer 111 in the second area. The example of FIG. 9 shows the transistors Tp1 and TrA provided in the pre-charge circuit area PCAa. The transistor Tp1 includes three transistors TpA to TpC. Each of the transistors TpA to TpC includes a gate electrode 161, an insulating layer 162, a source layer 163, and a drain layer 163. For example, the transistor TrA is a transistor electrically connected to a wiring (for example, word line WL or the like) provided above the memory cell array 37 via the contact plug C4. The transistor TrA includes a gate electrode 191, an insulating layer 192, a source layer 193, and a drain layer 193.

Two source layers 163 and two drain layers 163 are provided in a well region 164 in the semiconductor substrate 122. For example, these source layers 163 and drain layers 163 are provided in the order of, from the left side of the paper, the source layer 163, the drain layer 163, the source layer 163, and the drain layer 163. The transistors TpA and TpB share the drain layer 163. The transistors TpB and TpC share the source layer 163.

The insulating layer 162 is provided between the source layer 163 and the drain layer 163 on the semiconductor substrate 122. The insulating layer 162 serves as a gate insulating film of the transistor. The insulating layer 162 is made of an insulating material. The gate electrode 161 is provided on the insulating layer 162. The gate electrode 161 is made of a conductive material.

For example, an insulating layer 165 is provided on the upper surface (in the vicinity of the surface) of the semiconductor substrate 122. The insulating layer 165 is in contact with the upper surface of the semiconductor substrate 122. The insulating layer 165 electrically isolates the well region 164. The insulating layer 165 is made of an insulating material.

The contact plug 115 is provided on the source layer 163 and the drain layer 163. The contact plug 115 electrically connects the source layer 163 and the drain layer 163, and the wiring layer 114. The wiring layer 114 is provided on the contact plug 115.

A contact plug 116 is provided on the gate electrode 161. The contact plug 116 electrically connects the gate electrode 161 and the wiring layer 114. The contact plug 116 is made of a conductive material such as tungsten and the like. The wiring layer 114 is provided on the contact plug 116.

A well region 194 in the semiconductor substrate 122 includes the source layer 193 and the drain layer 193.

The insulating layer 192 is provided between the source layer 193 and the drain layer 193 on the semiconductor substrate 122. The insulating layer 192 serves as a gate insulating film of the transistor. The insulating layer 192 is made of an insulating material. The gate electrode 191 is provided on the insulating layer 192. The gate electrode 191 is made of a conductive material.

For example, an insulating layer 195 is provided on the upper surface (in the vicinity of the surface) of the semiconductor substrate 122. The insulating layer 195 is in contact with the upper surface of the semiconductor substrate 122. The insulating layer 195 electrically isolates the well region 194. The insulating layer 195 is made of an insulating material.

The contact plug 115 is provided on the source layer 193 and the drain layer 193. The contact plug 115 electrically connects the source layer 193 and the drain layer 193, and the wiring layer 114. The wiring layer 114 is provided on the contact plug 115.

The contact plug 116 is provided on the gate electrode 191. The contact plug 116 electrically connects the gate electrode 191 and the wiring layer 114. The wiring layer 114 is provided on the contact plug 116.

In the example of FIG. 9, the contact plug 113 is provided on the wiring layer 114 electrically connected to the source layer 193 or the drain layer 193. The contact plug 113 electrically connects the wiring layer 114 and the wiring layer 112. The wiring layer 112 is provided on the contact plug 113. The transistor TrA provided in the pre-charge circuit area PCAa is electrically connected to the contact plug C4 via the contact plug 115, the wiring layer 114, the contact plug 113, and the wiring layer 112.

Figure 10:
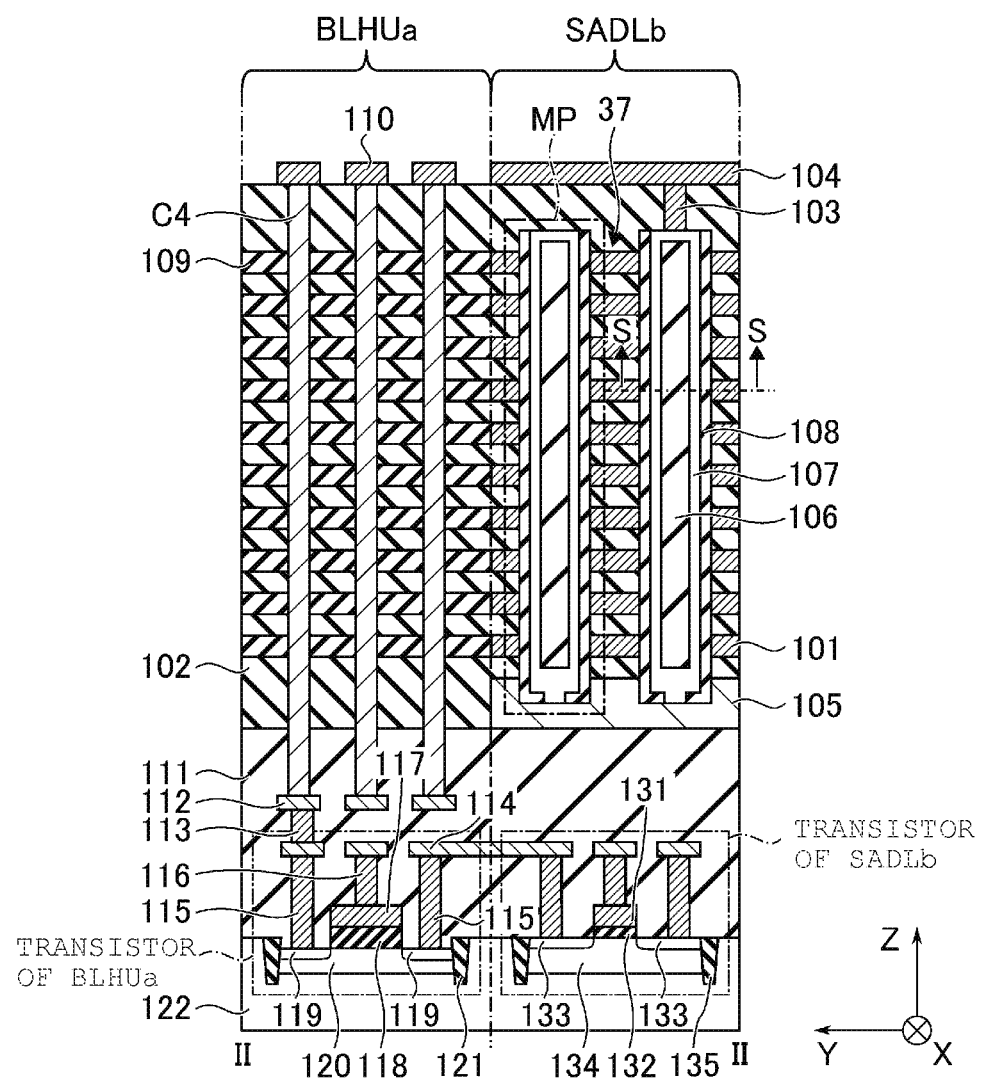
FIG. 10 is a cross-sectional diagram showing an example of a cross-sectional structure of the semiconductor memory according to the first embodiment.

FIG. 10 is a cross-sectional diagram showing a cross section taken along line II-II of FIGS. 7 and 8, showing an example of the cross-sectional structure of the NAND flash memory 30.

A wiring layer 105 is provided on the insulating layer 111 in the sense amplifier unit area SADLb. For example, the wiring layer 105 is formed in a plate shape extending along the X-Y plane and serves as the source line SL. For example, the wiring layer 105 is made of a conductive material such as phosphorus-doped silicon, tungsten silicide, or titanium nitride.

The insulating layer 102 is provided on the wiring layer 105.

A plurality of (e.g., 10) wiring layers 101 are stacked and spaced apart from each other in the Z direction on the insulating layer 102. The wiring layers 101 are provided in the same layer as the insulating layer 109. The wiring layers 101 serve as word lines WL and select gate lines SGD and SGS. The insulating layer 102 is provided between the respective wiring layers 101. The insulating layer 102 is provided on the uppermost wiring layer 101. The wiring layers 101 are made of a conductive material.

The memory pillar MP extends along the Z direction and passes through the plurality of wiring layers 101 and insulating layers 102. For example, the memory pillar MP serves as one NAND string NS. A lower end of the memory pillar MP is in contact with the wiring layer 105. For example, the memory pillar MP has a cylindrical shape, with its cross-sectional area along the X-Y plane (X-Y cross-sectional area) increasing from bottom to top. It is noted that the cross-sectional shape of the memory pillar MP is not limited to the above.

An intersection between the memory pillar MP and the lowermost wiring layer 101 serves as the select transistor ST2. An intersection between the memory pillar MP and the uppermost wiring layer 101 serves as the select transistor ST1. An intersection between the memory pillar MP and another wiring layer 101 serves as one memory cell transistor MC.

For example, the memory pillar MP includes a core film 106, a semiconductor film 107, and a stacked film 108.

The core film 106 extends along the Z direction. For example, an upper end of the core film 106 is positioned above the uppermost wiring layer 101, and a lower end of the core film 106 is positioned above the wiring layer 105. The core film 106 is made of an insulating material such as silicon oxide.

The semiconductor film 107 covers the periphery of the core film 106. A portion of the semiconductor film 107 is in contact with the wiring layer 105 at the lower end of the memory pillar MP. For example, the semiconductor film 107 includes silicon.

The stacked film 108 covers side and bottom surfaces of the semiconductor film 107 except for the contacting portion between the semiconductor film 107 and the wiring layer 105. For example, the stacked film 108 is a stacked film including a first insulating layer, a second insulating layer, and a third insulating layer stacked in order.

Figure 11:
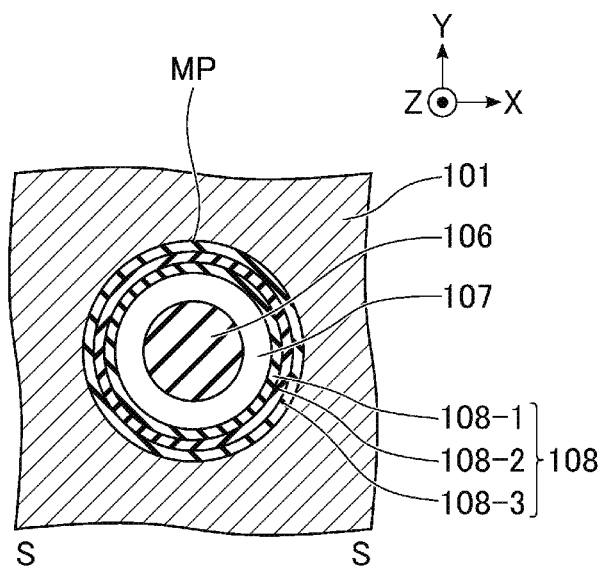
FIG. 11 is a cross-sectional diagram showing an example of a cross-sectional structure of a memory pillar in the semiconductor memory according to the first embodiment.

FIG. 11 is a cross-sectional diagram showing a cross section taken along line S-S of FIG. 10, showing an example of a cross-sectional structure of the memory pillar MP. Specifically, FIG. 11 shows the cross-sectional structure of the memory pillar MP in a layer parallel to the surface of the semiconductor substrate 122 and including the wiring layer 101. For example, as shown in FIG. 11, the stacked film 108 includes a first insulating layer 108-1, a second insulating layer 108-2, and a third insulating layer 108-3.

The first insulating layer 108-1 covers the periphery of the semiconductor film 107. The first insulating layer 108-1 serves as a tunnel insulating film of the memory cell transistor MC. The first insulating layer 108-1 is made of an insulating material, such as silicon oxide and silicon oxynitride. The second insulating layer 108-2 covers the periphery of the first insulating layer 108-1. The second insulating layer 108-2 serves as a charge storage layer of the memory cell transistor MC. For example, the second insulating layer 108-2 is made of an insulating material, such as silicon nitride. The third insulating layer 108-3 covers the periphery of the second insulating layer 108-2. The third insulating layer 108-3 serves as a block insulating film of the memory cell transistor MC. For example, the third insulating layer 108-3 is made of an insulating material, such as silicon oxide and aluminum oxide. The wiring layer 101 covers the periphery of the third insulating layer 108-3.

As shown in FIG. 10, a columnar contact plug 103 is provided on the semiconductor film 107. The contact plug 103 electrically connects the memory pillar MP and a wiring layer 104 provided above the memory cell array 37. For example, the contact plug 103 is made of a conductive material, the conductive material including such as tungsten. The wiring layer 104 is provided on the contact plug 103. For example, the wiring layer 104 is formed in a line shape extending along the Y direction and serves as a bit line BL. The wiring layer 104 is electrically connected to the BL hookup circuit BHC via the contact plug C4 in a tap area (not shown). For example, the wiring layer 104 is made of a conductive material, the conductive material including such as tungsten or copper.

A cross-sectional structure above the insulating layer 111 in the hookup area BLHUa is the same as the cross-sectional structure above the insulating layer 111 shown in FIG. 9. The contact plug C4 passes through the plurality of insulating layers 102 and 109. That is, the contact plug C4 is separated from the plurality of wiring layers 101 and 105.

A plurality of transistors are provided in the semiconductor substrate 122 and the insulating layer 111. The example of FIG. 10 shows the transistors provided in the hookup area BLHUa and the transistors provided in the sense amplifier unit area SADLb shown in FIG. 9. The transistor provided in the sense amplifier unit area SADLb includes a gate electrode 131, an insulating layer 132, a source layer 133, and a drain layer 133.

The insulating layer 118 is provided between the source layer 119 and the drain layer 119 on the semiconductor substrate 122 in the hookup area BLHUa. The insulating layer 118 serves as a gate insulating film of the transistor. The insulating layer 118 is made of an insulating material. The gate electrode 117 is provided on the insulating layer 118. The gate electrode 117 is made of a conductive material.

The contact plug 115 is provided on the source layer 119 and the drain layer 119. The contact plug 115 electrically connects the source layer 119 and the drain layer 119, to the wiring layer 114. The wiring layer 114 is provided on the contact plug 115.

In the example of FIG. 10, the contact plug 113 is provided on the wiring layer 114 electrically connected to the drain layer 119. The contact plug 113 electrically connects the wiring layer 114 and the wiring layer 112. The wiring layer 112 is provided on the contact plug 113.

The contact plug 116 is provided on the gate electrode 117. The contact plug 116 electrically connects the gate electrode 117 and the wiring layer 114. The wiring layer 114 is provided on the contact plug 116.

In the sense amplifier unit area SADLb, the source layer 133 and the drain layer 133 are provided in a well region 134 in the semiconductor substrate 122.

The insulating layer 132 is provided between the source layer 133 and the drain layer 133 on the semiconductor substrate 122. The insulating layer 132 serves as a gate insulating film of the transistor. The insulating layer 132 is made of an insulating material. The insulating layer 132 is thinner than the insulating layer 118. The gate electrode 131 is provided on the insulating layer 132. The gate electrode 131 is made of a conductive material.

For example, an insulating layer 135 is provided on the upper surface (in the vicinity of the surface) of the semiconductor substrate 122. The insulating layer 135 is in contact with the upper surface of the semiconductor substrate 122. The insulating layer 135 electrically isolates the well region 134. The insulating layer 135 is made of an insulating material.

The contact plug 115 is provided on the source layer 133 and the drain layer 133. The wiring layer 114 is provided on the contact plug 115. In the example of FIG. 10, for example, the wiring layer 114, which is provided via the contact plug 115 on either the source layer 133 or the drain layer 133 of the transistor in the sense amplifier unit area SADLb, extends from the sense amplifier unit area SADLb to the hookup area BLHUa along the Y direction. The wiring layer 114 is in contact with the contact plug 115 provided on the source layer 119 of the transistor in the hookup area BLHUa.

The contact plug 116 is provided on the gate electrode 131. The contact plug 116 electrically connects the gate electrode 131 and the wiring layer 114. The wiring layer 114 is provided on the contact plug 116.

Figure 12:
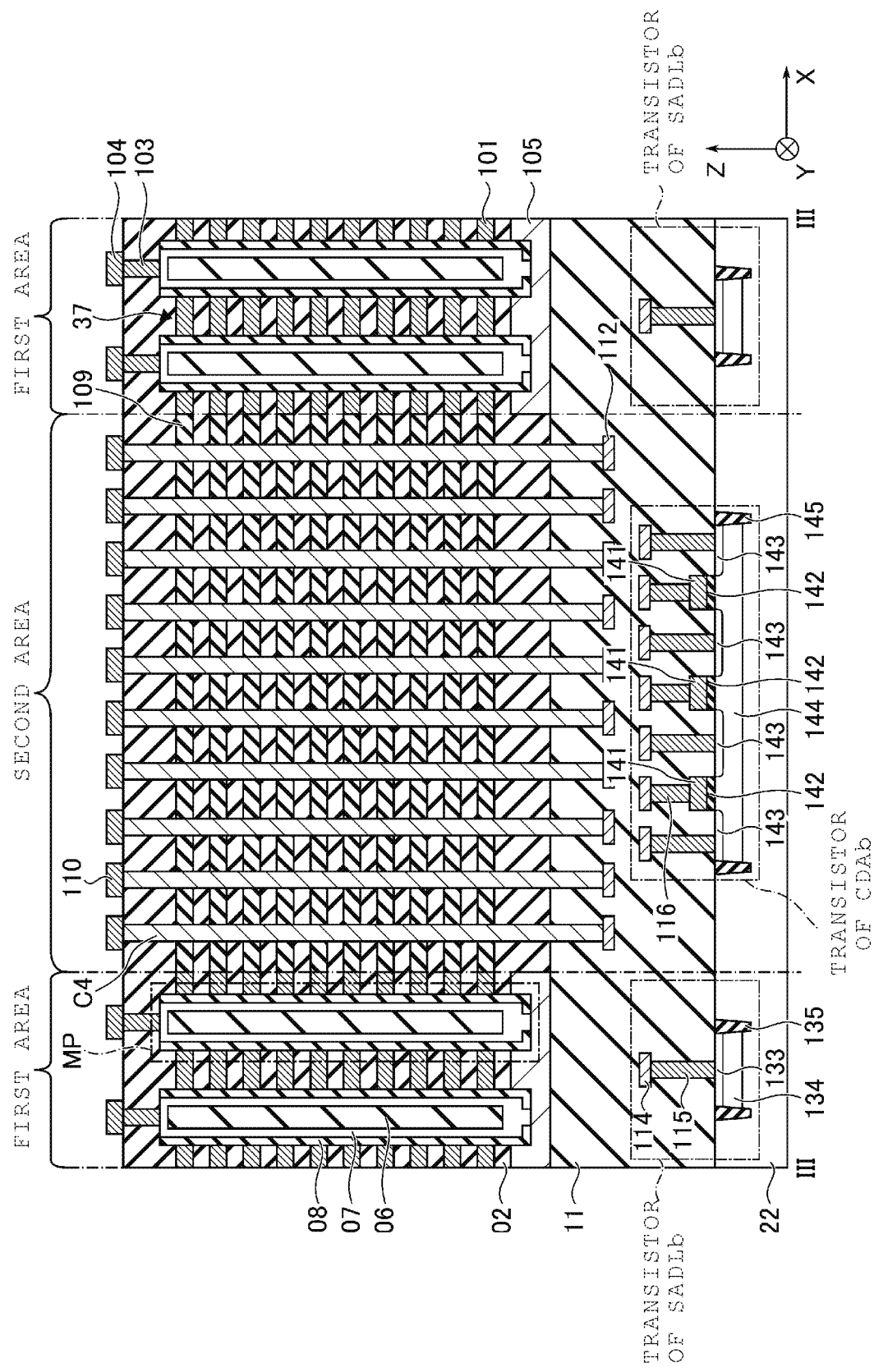
FIG. 12 is a cross-sectional diagram showing an example of a cross-sectional structure of the semiconductor memory according to the first embodiment.

FIG. 12 is a cross-sectional diagram showing a cross section taken along line of FIGS. 7 and 8, showing an example of the cross-sectional structure of the NAND flash memory 30.

A cross-sectional structure above the insulating layer 111 in the first area is the same as the cross-sectional structure above the insulating layer 111 in the sense amplifier unit area SADLb shown in FIG. 10.

A cross-sectional structure above the insulating layer 111 in the second area is the same as the cross-sectional structure above the insulating layer 111 shown in FIG. 9.

The transistor is provided in the semiconductor substrate 122 and the insulating layer 111 in the first area. The example of FIG. 12 shows the transistors provided in the sense amplifier unit area SADLb shown in FIG. 10. One impurity diffusion layer area 133 shown in FIG. 12 is the source layer 133 or the drain layer 133.

The transistor is provided in the semiconductor substrate 122 and the insulating layer 111 in the second area. The example of FIG. 12 shows the transistors provided in the column driver area CDAb. For example, the transistors provided in the column driver area CDAb include three transistors. Each of the three transistors includes a gate electrode 141, an insulating layer 142, a source layer 143, and a drain layer 143.

A well region 144 in the semiconductor substrate 122 includes the source layer 143 and the drain layer 143. For example, these source and drain layers 143 are provided in the order of, from the left side of the paper, the source layer 143, the drain layer 143, the source layer 143, and the drain layer 143. Two of the three transistors, which are adjacent in the X direction, share the source layer 143 or the drain layer 143.

The insulating layer 142 is provided between the source layer 143 and the drain layer 143 on the semiconductor substrate 122. The insulating layer 142 serves as a gate insulating film of the transistor. The insulating layer 142 is made of an insulating material. The gate electrode 141 is provided on the insulating layer 142. The gate electrode 141 is made of a conductive material.

For example, an insulating layer 145 is provided on the upper surface (in the vicinity of the surface) of the semiconductor substrate 122. The insulating layer 145 is in contact with the upper surface of the semiconductor substrate 122. The insulating layer 145 electrically isolates the well region 144. The insulating layer 145 is made of an insulating material.

The contact plug 115 is provided on the source layer 143 and the drain layer 143. The contact plug 115 electrically connects the source layer 143 and the drain layer 143, and the wiring layer 114. The wiring layer 114 is provided on the contact plug 115.

The contact plug 116 is provided on the gate electrode 141. The contact plug 116 electrically connects the gate electrode 141 and the wiring layer 114. The wiring layer 114 is provided on the contact plug 116.

1.1.9 Details of Layout of Column Driver and Sense Amplifier Module

Details of the layout of the column driver 40 and the sense amplifier module 41 will be described.

Figure 13:
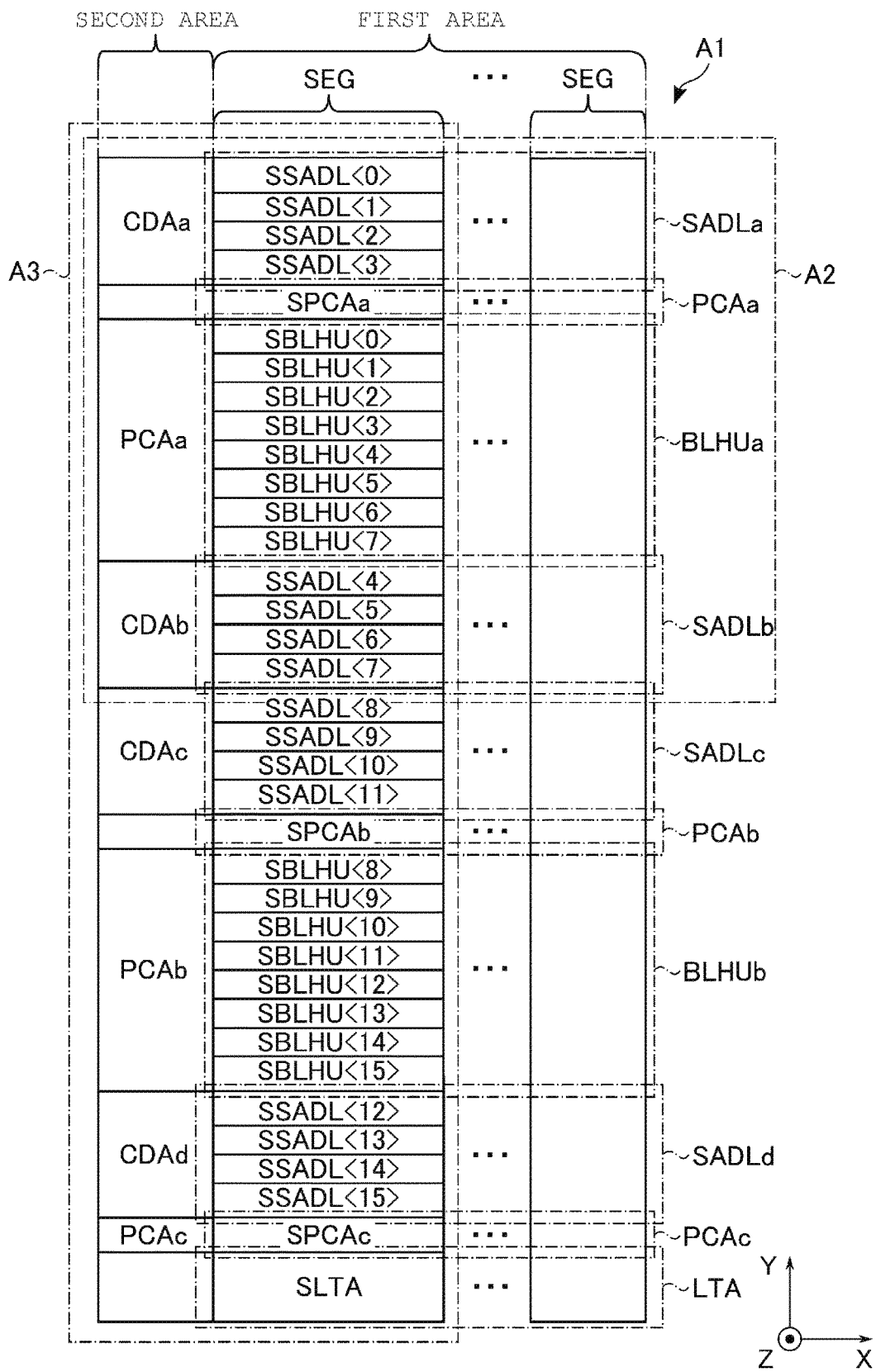
FIG. 13 is a diagram showing an example of a detailed layout of the column drivers and the sense amplifier modules in the semiconductor memory according to the first embodiment.

FIG. 13 is a diagram showing an example of the detailed layout of the column driver 40 and the sense amplifier module 41. FIG. 13 shows an area A1 in FIG. 7.

The first area includes a plurality of segments SEG. For example, the plurality of segments SEG are provided side by side in the X direction.

The segments SEG include circuit areas such as sense amplifier unit areas SSADL<0> to SSADL<15>, pre-charge circuit areas SPCAa to SPCAc, hookup areas SBLHU<0> to SBLHU<15>, and a latch circuit area SLTA.

The sense amplifier unit areas SSADL<0> to SSADL<3> are in the sense amplifier unit area SADLa of the first area. The sense amplifier unit areas SSADL<4> to SSADL<7> are in the sense amplifier unit area SADLb of the first area. The sense amplifier unit areas SSADL<8> to SSADL<11> are in the sense amplifier unit area SADLc of the first area. The sense amplifier unit areas SSADL<12> to SSADL<15> are in the sense amplifier unit area SADLd of the first area.

For example, the sense amplifier unit SAU<0> is provided in the sense amplifier unit area SSADL<0>. The sense amplifier unit SAU<1> is provided in the sense amplifier unit area SSADL<1>. The same applies to the sense amplifier unit areas SSADL<2> to SSADL<15>.

The pre-charge circuit area SPCAa is in the pre-charge circuit area PCAa of the first area. The pre-charge circuit area SPCAb is in the pre-charge circuit area PCAb of the first area. The pre-charge circuit area SPCAc is in the pre-charge circuit area PCAc of the first area.

The hookup areas SBLHU<0> to SBLHU<7> are in the hookup area BLHUa of the first area. The hookup areas SBLHU<8> to SBLHU<15> are in the hookup area BLHUb of the first area.

The hookup area SBLHU<0> is provided with the BL hookup circuit BHC corresponding to the sense amplifier unit SAU<0>. The hookup area SBLHU<1> is provided with the BL hookup circuit BHC corresponding to the sense amplifier unit SAU<1>. The same applies to the hookup areas SBLHU<2> to SBLHU<15>.

The latch circuit area SLTA is in the latch circuit area LTA of the first area. The latch circuits XDL<15:0> are provided in the latch circuit area SLTA.

Figure 14:
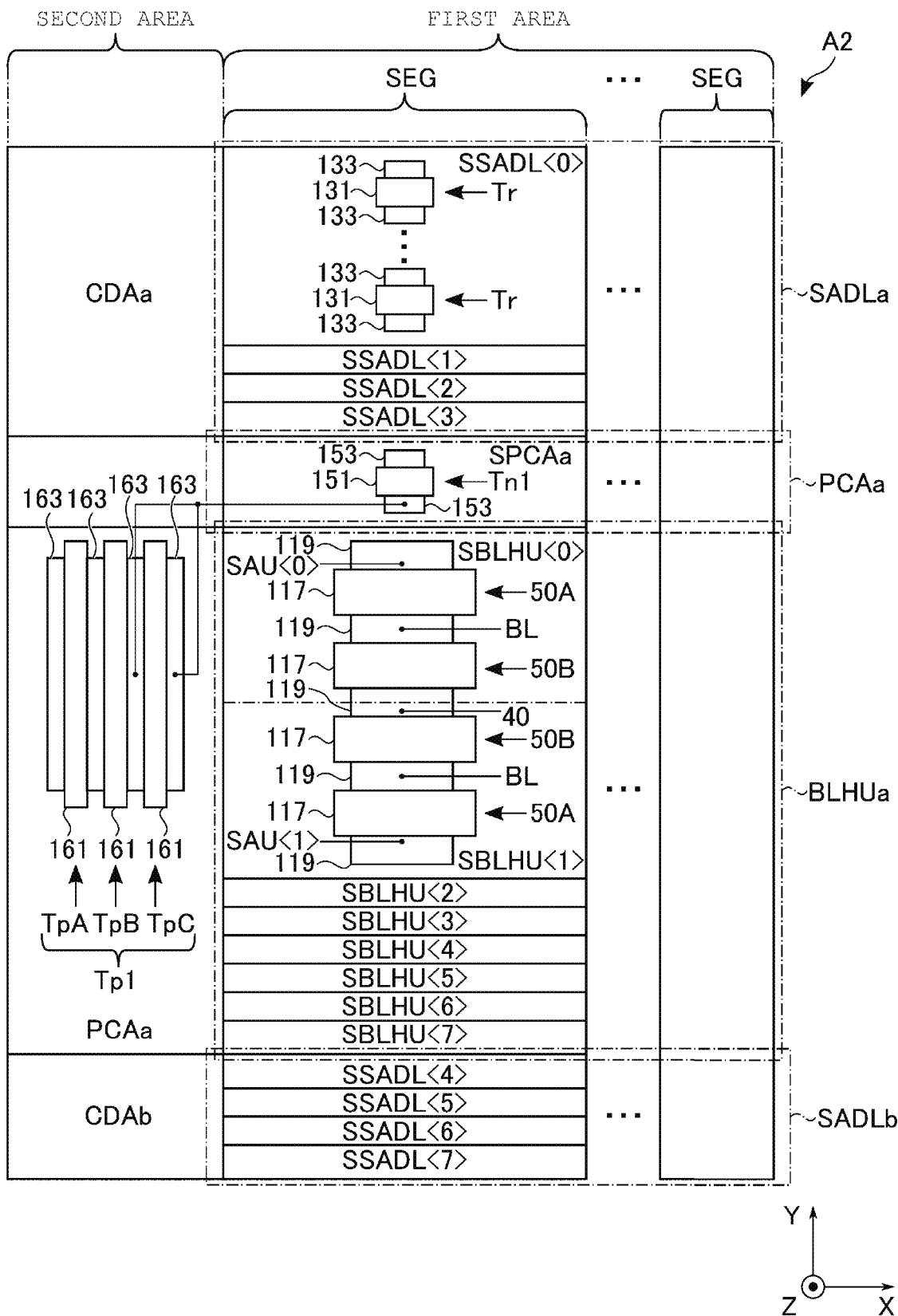
FIG. 14 is a diagram showing an example of a layout of elements in the sense amplifier module in the semiconductor memory according to the first embodiment.

FIG. 14 is a diagram showing an example of a layout of elements in the sense amplifier module 41. FIG. 14 shows an area A2 in FIG. 13. FIG. 14 shows transistors of the sense amplifier unit SAU, transistors of the BL hookup circuit BHC, and transistors of the pre-charge circuit DBP. Other elements are omitted. In a specific implementation, relative footprints of the transistors shown in FIG. 14 show actual relationship among them.

For example, the ratio of the length of the first area to the length of the second area in the X direction is 10 to 40:1.

In the first area, a plurality of transistors Tr are provided in the sense amplifier unit area SSADL<0> in the segment SEG. For example, the plurality of transistors Tr are provided side by side in the Y direction. The source layer 133 and the drain layer 133 of the transistor Tr are provided in the semiconductor substrate 122 (not shown). The source layer 133 and the drain layer 133 are spaced apart from each other along the Y direction. The gate electrode 131 of the transistor Tr is provided between the source layer 133 and the drain layer 133 on the semiconductor substrate with an insulating layer (not shown) interposed therebetween. The plurality of transistors Tr form the sense amplifier unit SAU<0>. The plurality of transistors Tr are provided in the sense amplifier unit areas SSADL<1> to SSADL<7> as in the sense amplifier unit area SSADL<0>.

The transistors 50A and 50B are provided in the hookup area SBLHU<0> in the segment SEG. For example, the transistors 50A and 50B are provided side by side in the Y direction. The source layer 119 and the drain layer 119 of the transistor 50A are provided in the semiconductor substrate 122 (not shown). The source layer 119 and the drain layer 119 are spaced apart from each other along the Y direction. The gate electrode 117 of the transistor 50A is provided between the source layer 119 and the drain layer 119 of the transistor 50A on the semiconductor substrate with an insulating layer (not shown) interposed therebetween. In addition, the source layer 119 and the drain layer 119 of the transistor 50B are provided in the semiconductor substrate. The source layer 119 and the drain layer 119 are spaced apart from each other along the Y direction. The gate electrode 117 of the transistor 50B is provided between the source layer 119 and the drain layer 119 of the transistor 50B on the semiconductor substrate with an insulating layer (not shown) interposed therebetween. The transistors 50A and 50B share either the source layer 119 or the drain layer 119. This shared source layer 119 or drain layer 119 is connected to the bit line BL. The source layer 119 or the drain layer 119 of the transistor 50A, which is not shared with the transistor 50B, is connected to the sense amplifier unit SAU<0>. The transistors 50A and 50B form the BL hookup circuit BHC corresponding to the sense amplifier unit SAU<0>.

The transistors 50A and 50B are provided in the hookup area SBLHU<1> as in the hookup area SBLHU<0>. The transistor 50B in the hookup area SBLHU<0> and the transistor 50B in the hookup area SBLHU<1> share either the source layer 119 or the drain layer 119. This shared source layer 119 or drain layer 119 is connected to the column driver 40. The source layer 119 or the drain layer 119 of the transistor 50A, which is not shared with the transistor 50B, is connected to the sense amplifier unit SAU<1>. Two transistors 50A and two transistors 50B are provided in the hookup areas SBLHU<2> and SBLHU<3>, the hookup areas SBLHU<4> and SBLHU<5>, and the hookup areas SBLHU<6> and SBLHU<7>, as in the hookup areas SBLHU<0> and SBLHU<1>.

The transistor Tn1 is provided in the pre-charge circuit area SPCAa in the section SEG. A source layer 153 and a drain layer 153 of the transistor Tn1 are provided in the semiconductor substrate 122 (not shown). The source layer 153 and the drain layer 153 are spaced apart from each other along the Y direction. A gate electrode 151 of the transistor Tn1 is provided between the source layer 153 and the drain layer 153 on the semiconductor substrate with an insulating layer (not shown) interposed therebetween.

In the second area, three transistors TpA to TpC are provided in the pre-charge circuit area PCAa. For example, the three transistors TpA to TpC are provided side by side in the X direction. The source layer 163 and the drain layer 163 of transistors TpA to TpC are provided in the semiconductor substrate 122 (not shown). The source layer 163 and the drain layer 163 are spaced apart from each other along the X direction. For example, these source and drain layers 163 correspond to the source layer 163, the drain layer 163, the source layer 163, and the drain layer 163 in order from the left side of the paper. The transistors TpA and TpB share the drain layer 163. The transistors TpB and TpC share the source layer 163. The gate electrode 161 of one of the transistors TpA to TpC is provided between the source layer 163 and the drain layer 163 on the semiconductor substrate with an insulating layer (not shown) interposed therebetween. The transistor Tp1 is formed of three transistors TpA to TpC. The source layer 163 and the drain layer 163 of the transistor TpC are connected to the source layer 153 or the drain layer 153 of the transistor Tn1. The transistor Tp1 is a low breakdown voltage p-channel MOS transistor. Since the transistor Tp1 charges a plurality of buses DBUS via the transistors Tn1 in the plurality of segments SEG, the transistor Tp1 is necessary to flow a large current and has a gate width larger than that of the transistor Tn1.

Figure 15:
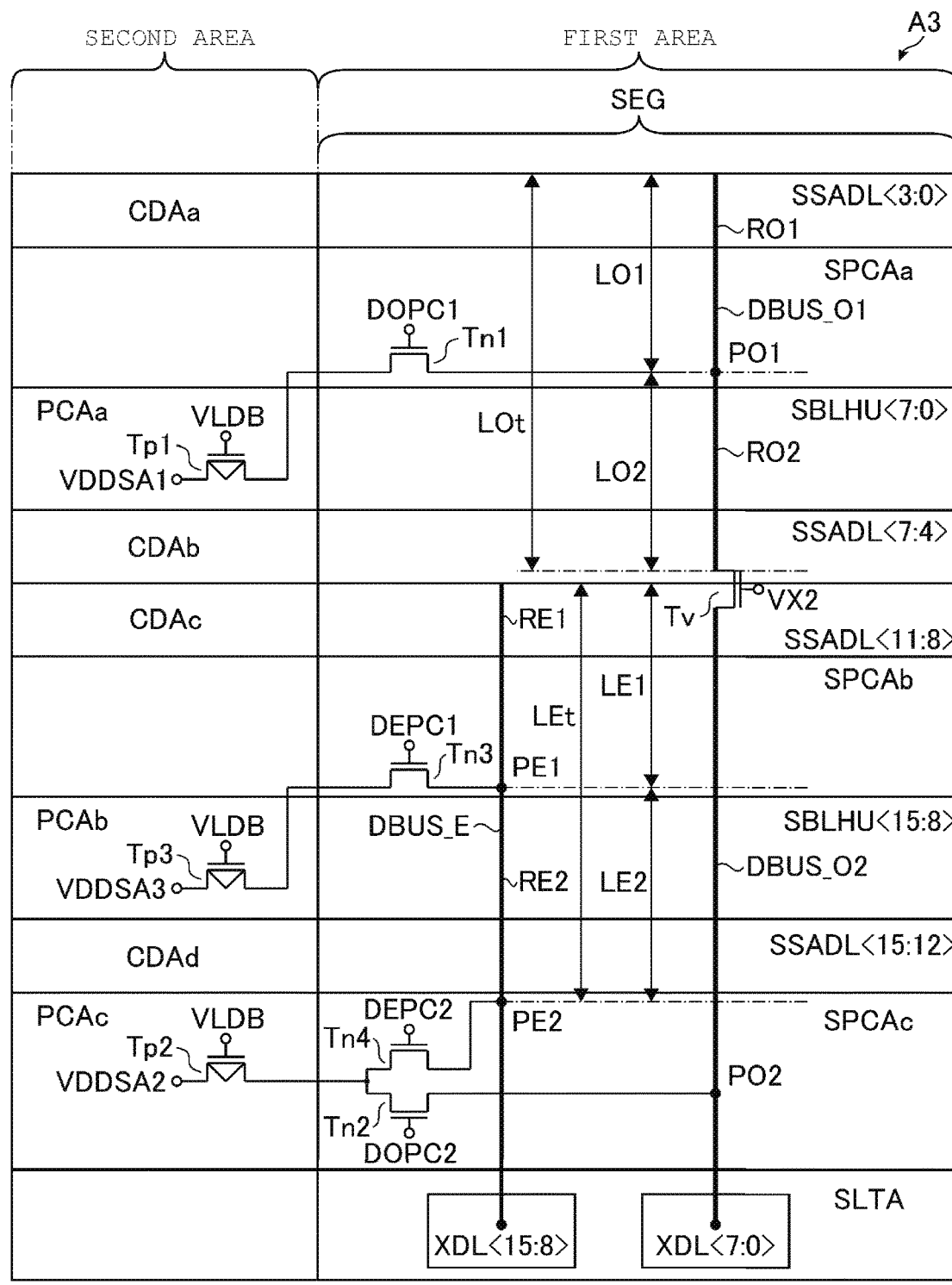
FIG. 15 is a diagram showing an example of a layout of buses and circuits in the sense amplifier module in the semiconductor memory according to the first embodiment.

FIG. 15 is a diagram showing an example of a layout of the buses DBUS and circuits in the sense amplifier module 41. FIG. 15 shows an area A3 in FIG. 13. FIG. 15 shows the buses DBUS_O1, DBUS_O2, and DBUS_E, the pre-charge circuits DBP, and the latch circuits XDL. Other circuits are omitted in FIG. 15.

The segment SEG of the first area includes the buses DBUS_O1, DBUS_O2, and DBUS_E. The buses DBUS_O1, DBUS_O2, and DBUS_E extend along the Y direction. The buses DBUS_O1 and DBUS_O2, and the bus DBUS_E are spaced apart from each other in the X direction. The transistor Tv is provided between the bus DBUS_O1 and the bus DBUS_O2. For example, the transistor Tv is provided in either the sense amplifier unit area SSADL<7:4> or the sense amplifier unit area SSADL<11:8>. Alternatively, the transistor Tv is provided between, or straddles these areas.

The bus DBUS_O1 is connected to the sense amplifier unit SAU<7:0> (not shown) in the sense amplifier unit area SSADL<7:0>. One end of the bus DBUS_O1 is positioned in the sense amplifier unit area SSADL<0> and connected to the sense amplifier unit SAU<0>. The other end of the bus DBUS_O1 is connected to one end of the transistor Tv. One end of the bus DBUS_O2 is connected to the other end of the transistor Tv. The other end of the bus DBUS_O2 is connected to the latch circuit XDL<7:0>.

The bus DBUS_E is connected to the sense amplifier unit SAU<15:8> (not shown) in the sense amplifier unit area SSADL<15:8>. One end of the bus DBUS_E is positioned in the sense amplifier unit area SSADL<8> and connected to the sense amplifier unit SAU<8>. The other end of the bus DBUS_E is connected to the latch circuit XDL<15:8>.

The transistor Tn1 is provided in the pre-charge circuit area SPCAa in the segment SEG, that is, in the area adjacent to the hookup area SBLHU<7:0> in the segment SEG in the Y direction. The transistor Tp1 is provided in the pre-charge circuit area PCAa of the second area, that is, in the area adjacent to the hookup area SBLHU<7:0> in the segment SEG of the second area in the X direction. One end of the transistor Tn1 is connected to the bus DBUS_O1 at a position PO1. For example, the position PO1 is positioned in the pre-charge circuit area SPCAa. The other end of the transistor Tn1 is connected to one end of the transistor Tp1. The control signal DOPC1 is input to the gate of the transistor Tn1. The voltage VDDSA1 is applied to the other end of the transistor Tp1. The voltage VLDB is applied to the gate of the transistor Tp1.

The transistor Tn3 is provided in the pre-charge circuit area SPCAb in the segment SEG, that is, in the area adjacent to the hookup area SBLHU<15:8> in the segment SEG in the Y direction. The transistor Tp3 is provided in the pre-charge circuit area PCAb of the second area, that is, in the area adjacent to the hookup area SBLHU<15:8> in the segment SEG of the second area in the X direction. One end of the transistor Tn3 is connected to the bus DBUS_E at a position PE1. For example, the position PE1 is positioned in the pre-charge circuit area SPCAb. The other end of the transistor Tn3 is connected to one end of the transistor Tp3. The control signal DEPC1 is input to the gate of the transistor Tn3. The voltage VDDSA3 is applied to the other end of the transistor Tp3. The voltage VLDB is applied to the gate of the transistor Tp3.

The transistors Tn2 and Tn4 are provided in the pre-charge circuit area SPCAc in the segment SEG, that is in an area of the sense amplifier unit area SSADL<15:12> positioned on the opposite side of the hookup area SBLHU<15:8> in the Y direction. The transistor Tp2 is provided in the pre-charge circuit area PCAc of the second area. One end of the transistor Tn2 is connected to the bus DBUS_O2 at a position PO2. For example, the position PO2 is positioned in the pre-charge circuit area SPCAc. The other end of the transistor Tn2 is connected to one end of the transistor Tp2. The control signal DOPC2 is input to the gate of the transistor Tn2. The voltage VDDSA2 is applied to the other end of the transistor Tp2. The voltage VLDB is applied to the gate of the transistor Tp2. One end of the transistor Tn4 is connected to the bus DBUS_E at a position PE2. For example, the position PE2 is positioned in the pre-charge circuit area SPCAc. The other end of the transistor Tn4 is connected to one end of the transistor Tp2. The control signal DEPC2 is input to the gate of the transistor Tn4.

Here, the length and parasitic resistance of the bus DBUS_O1 from one end of the bus DBUS_O1 (the sense amplifier unit area SSADL<0>) to the position PO1 are referred to as LO1 and RO1, respectively. The length and the parasitic resistance of the bus DBUS_O1 from the position PO1 to the other end of the bus DBUS_O1 are referred to as LO2 and RO2, respectively. The length and parasitic resistance of the bus DBUS_E from one end of the bus DBUS_E (the sense amplifier unit area SSADL<8>) to the position PE1 are referred to as LE1 and RE1, respectively. The length and parasitic resistance of the bus DBUS_E from the position PE1 to the position PE2 are referred to as LE2 and RE2, respectively. The length of the bus DBUS_O1 from one end of the bus DBUS_O1 to the other end of the bus DBUS_O1 is referred to as LOt. The length of the bus DBUS_E from one end of the bus DBUS_E to the position PE2 is referred to as LEt.

The parasitic resistances RO1 and RO2 vary according to the position (position PO1) where the transistor Tn1 and the bus DBUS_O1 are connected to each other. When these resistance values are different, the parasitic resistance value of the wiring from the transistor Tp1 to one end of the bus DBUS_O1 and the parasitic resistance value of the wiring from the transistor Tp1 to the other end of the bus DBUS_O1 are also different. For that reason, the time required for charging the bus DBUS_O1 is different. This charging time becomes shorter as the difference between the length LO1 and the length LO2 becomes smaller, that is, as the variation in the parasitic resistances RO1 and RO2 becomes smaller. Likewise, the parasitic resistances RE1 and RE2 vary according to the position (the position PE1) where the transistor Tn3 and the bus DBUS_E are connected to each other. When these resistance values are different, the parasitic resistance value of the wiring from the transistor Tp3 to one end of the bus DBUS_E and the parasitic resistance value of the wiring from the transistor Tp3 to the position PE2 also are different. For that reason, the time required for charging the bus DBUS_E from one end of the bus DBUS_E to the position PE2 is different. This charging time becomes shorter as the difference between the length LE1 and the length LE2 becomes smaller, that is, as the variation in the parasitic resistances RE1 and RE2 becomes smaller.

As described above, it is preferable that the position PO1 of the bus DBUS_O1 is a position at which the difference between the length LO1 and the length LO2 is smaller. It is more preferable that the position PO1 is a position at which the length LO1 and the length LO2 are equal to each other, that is, a position to be at approximately half the length LOt. It is preferable that the position PE1 of the bus DBUS_E is a position at which the difference between the length LE1 and the length LE2 is smaller. It is more preferable that the position PE1 is a position at which the length LE1 and the length LE2 are equal to each other, that is, a position to be at approximately half the length LEt.

The position PO1 may be set in the central area of the bus DBUS_O1. The position PE1 may be set in the central area of the bus DBUS_E. For example, the central area of the bus DBUS is an area including the center and vicinity of the bus DBUS in a longitudinal direction (Y direction), an area extending from the center of the bus DBUS in the longitudinal direction (Y direction) toward each of the both ends of the bus DBUS in the longitudinal direction, and the like.

1.2 Data Transfer Operation

A data transfer operation using the bus DBUS in the NAND flash memory 30 according to the present embodiment will be described. Hereinafter, the data transfer operation using the buses DBUS_O1 and DBUS_O2 between the latch circuit SDL and the latch circuit XDL<0> in the sense amplifier unit SAU<0> shown in FIG. 5 will be described as an example. It is noted that the same applies to the data transfer operations between the latch circuit XDL<0> and the other latch circuits in the sense amplifier unit SAU<0>. Further, the same applies to the data transfer operation using the bus DBUS_E.

Figure 16:
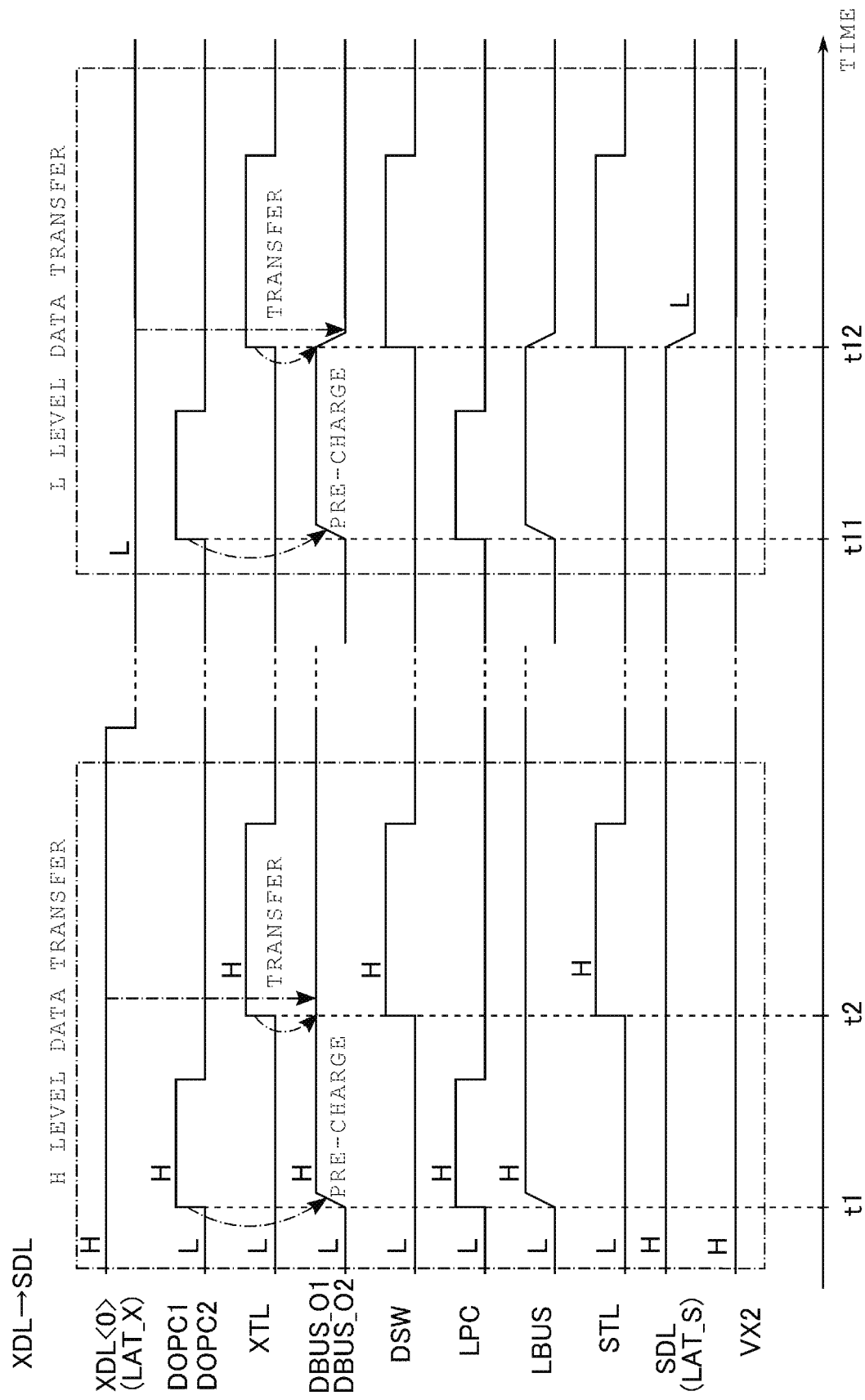
FIG. 16 is a timing chart showing an example of temporal changes in voltages of various control signals and voltages applied to various circuit components in a data transfer operation of the semiconductor memory according to the first embodiment.

FIG. 16 is a timing chart showing an example of temporal changes in voltages of various control signals and voltages applied to various circuit components in an operation of transferring data from the latch circuit XDL<0> to the latch circuit SDL. FIG. 16 shows an example in which data corresponding to an L level is transferred after data corresponding to the H level is transferred as the data write to the node LAT_S of the latch circuit SDL. Further, an example is shown herein, in which the data stored in the latch circuit XDL<0> is output from the node LAT_X. It is noted that FIG. 16 illustrates a case in which the transistors Tn1 and Tn2 are turned on or off at the same time, with the transistor Tv in the on state.

First, an operation of transferring data corresponding to the H level will be described.

At time t1, the control signals DOPC1 and DOPC2 are the H level, whereby the buses DBUS_O1 and DBUS_O2 are pre-charged to the H level. Then, the control signals DOPC1 and DOPC2 are the L level. Then, at time t2, the control signal XTL is the H level, whereby the node LAT_X of the latch circuit XDL<0> is the H level, and in response, the buses DBUS_O1 and DBUS_O2 maintain the H level. Then, the control signal XTL is the L level.

Meanwhile, at time t1, the control signal LPC is the H level, whereby the bus LBUS is pre-charged to the H level. Then, the control signal LPC is the L level. Then, at time t2, the control signal DSW is the H level, whereby the buses DBUS_O1 and DBUS_O2 are the H level, and in response, the bus LBUS maintains the H level. Then, the control signal DSW is the L level.

In addition, at time t2, the control signal STL is the H level, whereby the bus LBUS is the H level, and in response, the node LAT_S of the latch circuit SDL maintains the preset H level. Then, the control signal STL is the L level.

Next, an operation of transferring data corresponding to the L level will be described.

At time t11, the control signals DOPC1 and DOPC2 are the H level, whereby the buses DBUS_O1 and DBUS_O2 are pre-charged to the H level. Then, the control signals DOPC1 and DOPC2 are the L level. Then, at time t12, the control signal XTL is the H level, whereby the node LAT_X of the latch circuit XDL<0> is the H level, and in response, the buses DBUS_O1 and DBUS_O2 change from the H level to the L level. Then, the control signal XTL is the L level.

Meanwhile, at time t11, the control signal LPC is the H level, whereby the bus LBUS is pre-charged to the H level. Then, the control signal LPC is the L level. Then, at time t12, the control signal DSW is the H level, whereby the buses DBUS_O1 and DBUS_O2 to which data is transferred under the control of the control signal XTL are the L level, and in response, the bus LBUS changes from the H level to the L level. Then, the control signal DSW is the L level.

In addition, at time t12, the control signal STL is the H level, whereby the bus LBUS is the L level, and in response, the node LAT_S of the latch circuit SDL changes from the preset H level to the L level. Then, the control signal STL is the L level.

As described above, by controlling the voltages of the control signals DOPC1, DOPC2, XTL, DSW, LPC, and STL, the data stored in the node LAT_X of the latch circuit XDL<0> is transferred to the node LAT_S of the latch circuit SDL.

Figure 17:
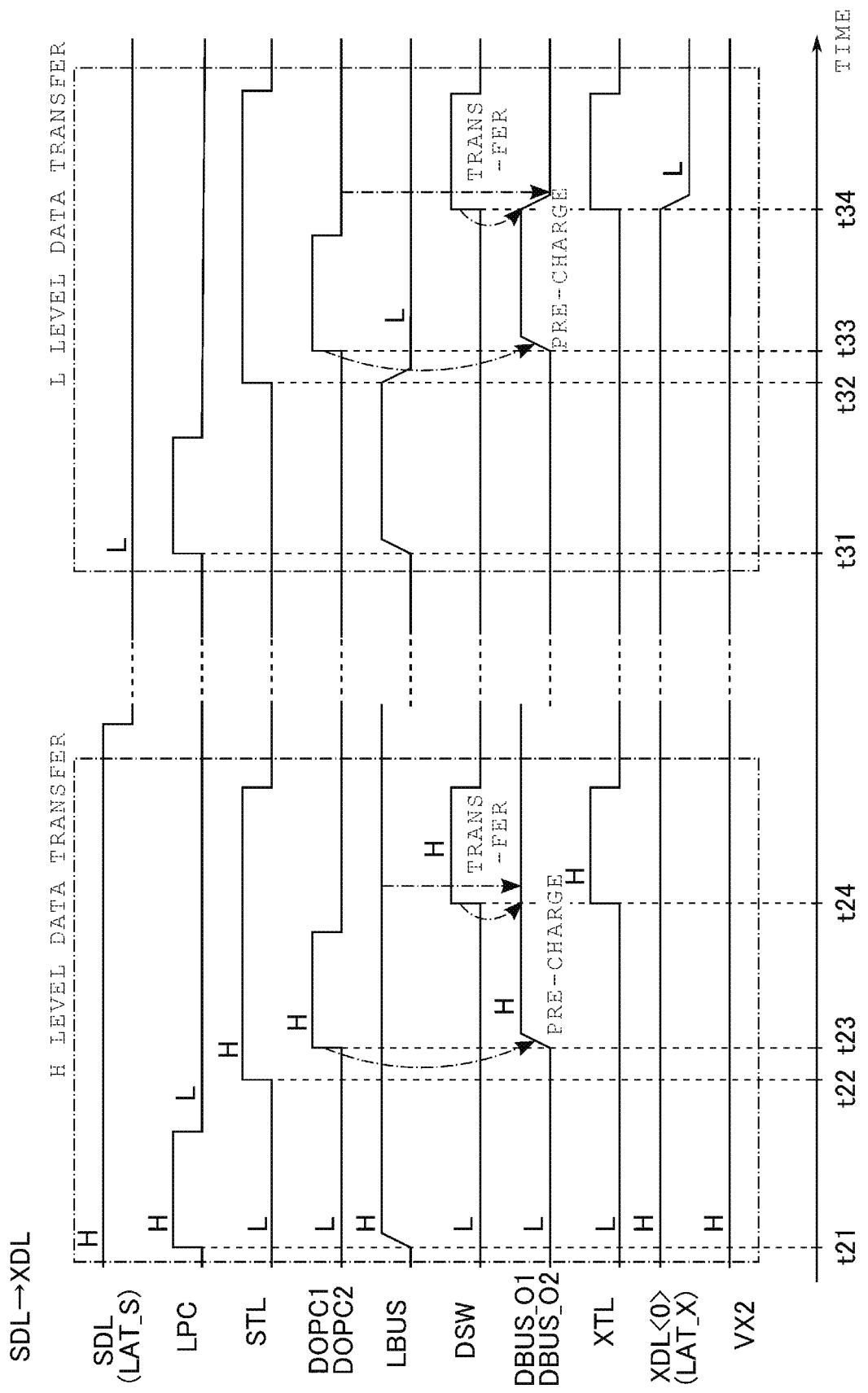
FIG. 17 is a timing chart showing an example of temporal changes in voltages of various control signals and voltages applied to various circuit components in the data transfer operation of the semiconductor memory according to the first embodiment.

FIG. 17 is a timing chart showing an example of temporal changes in voltages of various control signals and voltages applied to various circuit components in an operation of transferring data from the latch circuit SDL to the latch circuit XDL<0>. FIG. 17 shows an example in which the data corresponding to the L level is transferred after the data corresponding to the H level is transferred, as the data write to the node LAT_X of the latch circuit XDL<0>. Further, an example is shown herein, in which the data stored in the latch circuit SDL is output from the node LAT_S. It is noted that FIG. 17 illustrates an example in which the transistors Tn1 and Tn2 are turned on or off at the same time, with the transistor Tv in the on state.

First, the operation of transferring the data corresponding to the H level will be described.

At time t21, the control signal LPC is the H level, whereby the bus LBUS is pre-charged to the H level. Then, the control signal LPC is the L level. Then, at time t22, the control signal STL is the H level, whereby the node LAT_S of the latch circuit SDL is the H level, and in response, the bus LBUS maintains the H level. Then, the control signal STL is the L level.

Next, at time t23, the control signals DOPC1 and DOPC2 are the H level, whereby the buses DBUS_O1 and DBUS_O2 are pre-charged to the H level. Then, the control signals DOPC1 and DOPC2 are the L level. Then, at time t24, the control signal DSW is the H level, whereby the bus LBUS is the H level, and in response, the buses DBUS_O1 and DBUS_O2 maintain the H level. Then, the control signal DSW is the L level.

In addition, at time t24, the control signal XTL is the H level, whereby the buses DBUS_O1 and DBUS_O2 are the H level, and in response, the node LAT_X of the latch circuit XDL<0> maintains the preset H level. Then, the control signal XTL is the L level.

Next, the operation of transferring the data corresponding to the L level will be described.

At time t31, the control signal LPC is the H level, whereby the bus LBUS is pre-charged to the H level. Then, the control signal LPC is the L level. Then, at time t32, the control signal STL is the H level, whereby the node LAT_S of the latch circuit SDL is the L level, and in response, the bus LBUS changes from the H level to the L level. Then, the control signal STL is the L level.

Next, at time t33, the control signals DOPC1 and DOPC2 are the H level, whereby the buses DBUS_O1 and DBUS_O2 are pre-charged to the H level. Then, the control signals DOPC1 and DOPC2 are the L level. Then, at time t34, the control signal DSW is the H level, whereby the bus LBUS is the L level, and in response, the buses DBUS_O1 and DBUS_O2 change from the H level to the L level. Then, the control signal DSW is the L level.

In addition, at time t34, the control signal XTL is the H level, whereby the buses DBUS_O1 and DBUS_O2 are the L level, and in response, the node LAT_X of the latch circuit XDL<0> changes from the preset H level to the L level. Then, the control signal XTL is the L level.

As described above, by controlling the voltages of the control signals STL, LPC, DSW, XTL, DOPC1, and DOPC2, the data stored in the node LAT_S of the latch circuit SDL is transferred to the node LAT_X of the latch circuit XDL<0>.

1.3 Advantage

According to the present embodiment, the operation speed of the NAND flash memory 30 can be increased. This advantage will be described below.

Figure 18:
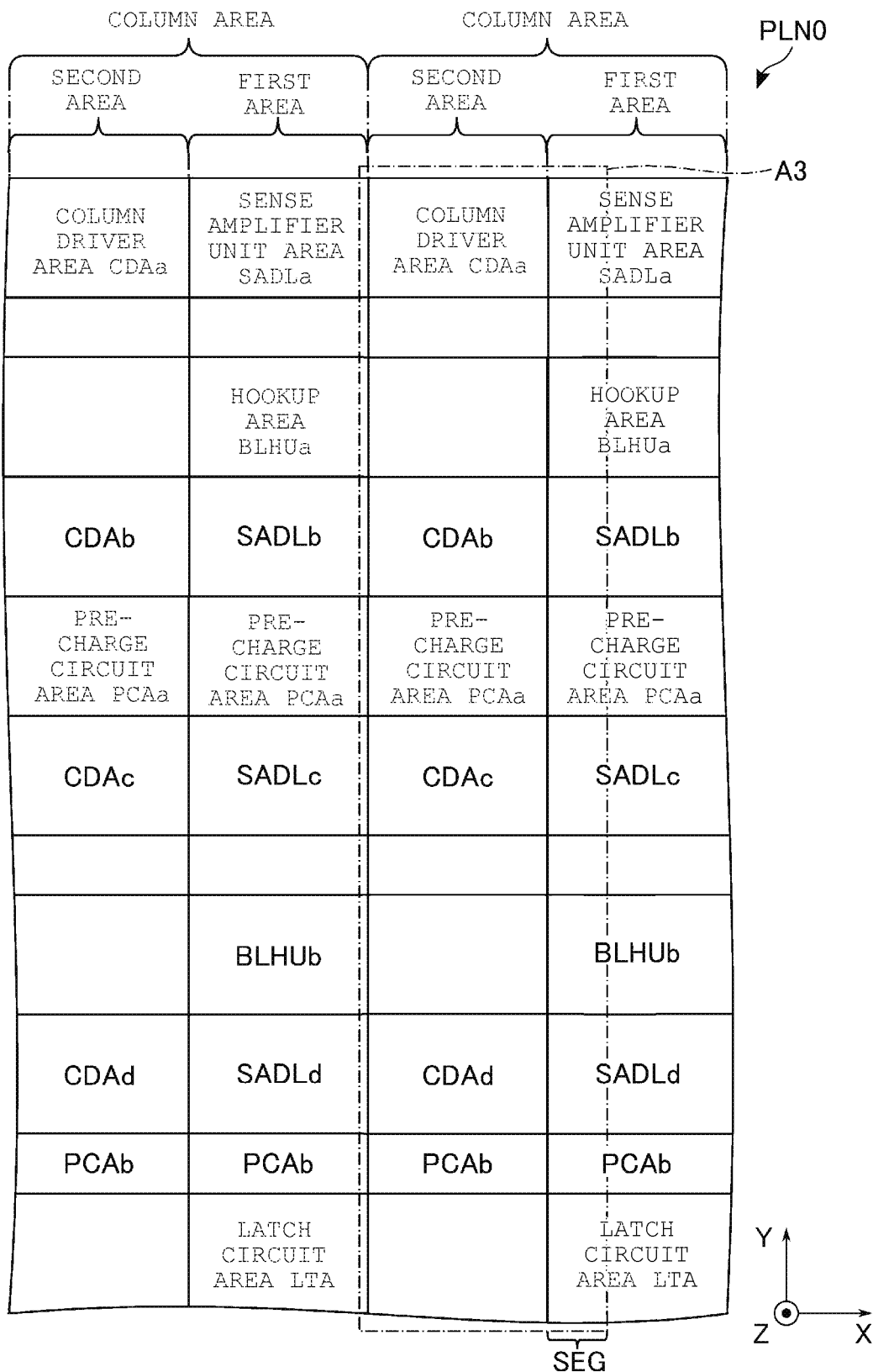
FIG. 18 is a plan view diagram showing an example of a layout of column drivers and sense amplifier modules in a semiconductor memory according to a comparative example.

First, FIG. 18 shows an example of a layout of the column driver 40 and the sense amplifier module 41 of a comparative example.

As shown in FIG. 18, there is an area in which the pre-charge circuit area PCAa is provided, between the sense amplifier unit area SADLb and the sense amplifier unit area SADLc of the first area and between the column driver area CDAb and the column driver area CDAc of the second area. The pre-charge circuit DBP straddles the pre-charge circuit area PCAa of the second area and the pre-charge circuit area PCAa of the first area.

In addition, in the first area, circuits such as a spare circuit and the like, which are not essential but useful for operation, are provided in the area between the sense amplifier unit area SADLa and the hookup area BLHUa. Circuits such as a spare circuit and the like, which are not essential but useful for operation, are provided in the area between the sense amplifier unit area SADLc and the hookup area BLHUb. The pre-charge circuit area PCAb is provided in the area between the sense amplifier unit area SADLd and the latch circuit area LTA.

In the second area, no circuit or the like is provided in the area adjacent to the hookup area BLHUa of the first area in the X direction. No circuit or the like is provided in the area adjacent to the hookup area BLHUb of the first area in the X direction. The pre-charge circuit area PCAb of the second area and the pre-charge circuit area PCAb of the first area are provided side by side in the X direction. The pre-charge circuit DBP straddles the pre-charge circuit area PCAb of the second area and the pre-charge circuit area PCAb of the first area.

The other areas of the first area and the second area have the same layout as that shown in FIG. 7 of the first embodiment.

Figure 19:
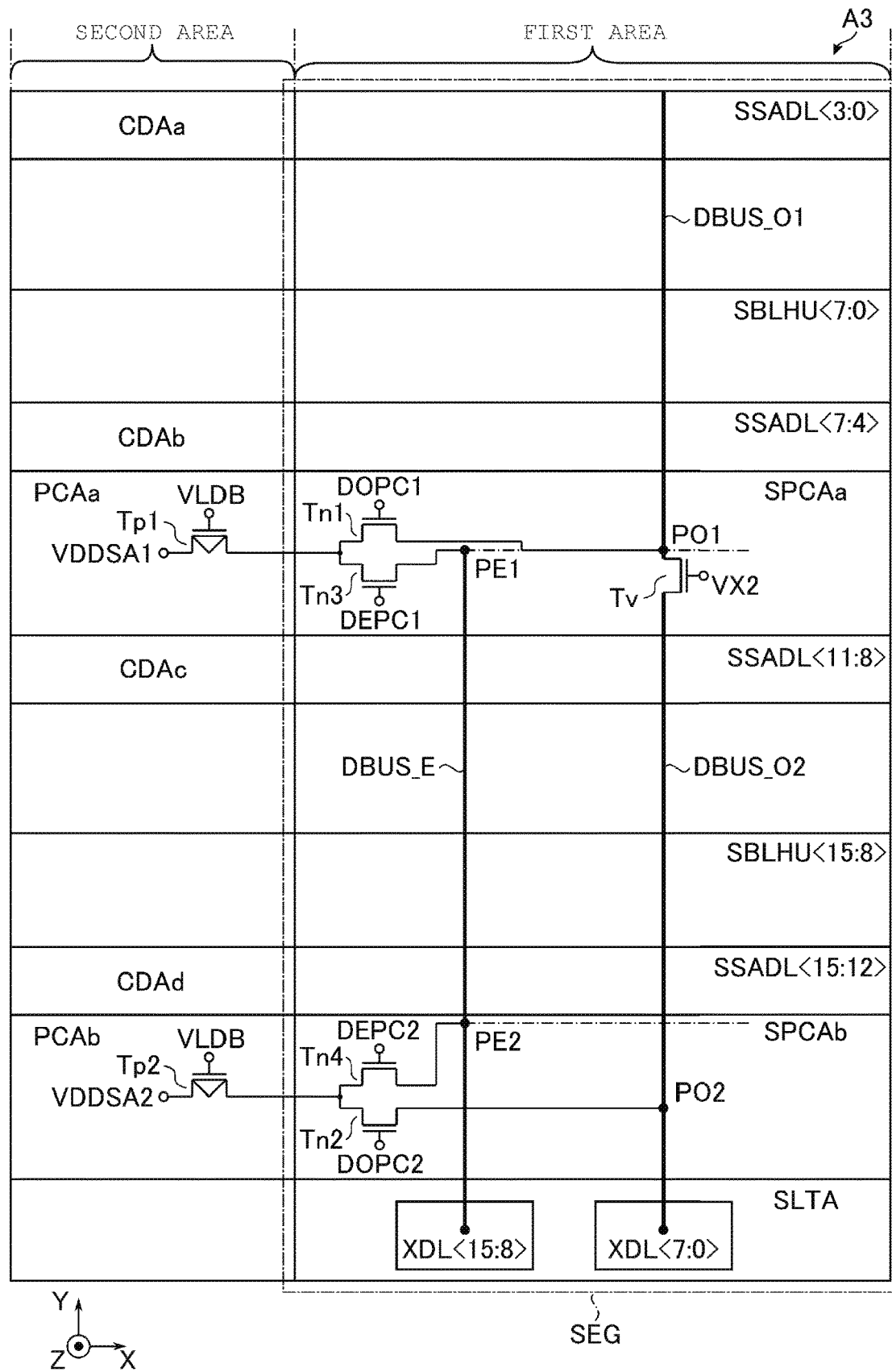
FIG. 19 is a diagram showing an example of a layout of buses and circuits in the sense amplifier module in the semiconductor memory according to the comparative example.

FIG. 19 is a diagram showing an example of a layout of the buses DBUS and the circuits in the sense amplifier module 41 of the comparative example. FIG. 19 shows an area A3 in FIG. 18. FIG. 19 shows the buses DBUS_O1, DBUS_O2, and DBUS_E, the pre-charge circuits DBP, and the latch circuits XDL. Other circuits are omitted in FIG. 19.

As shown in FIG. 19, the segment SEG of the first area includes the buses DBUS_O1, DBUS_O2, and DBUS_E. The buses DBUS_O1, DBUS_O2, and DBUS_E extend along the Y direction. The buses DBUS_O1 and DBUS_O2, and the bus DBUS_E are spaced apart from each other in the X direction. The transistor Tv is provided between the bus DBUS_O1 and the bus DBUS_O2. For example, the transistor Tv is provided in the pre-charge circuit area SPCAa.

The bus DBUS_O1 is connected to the sense amplifier unit SAU<7:0> (not shown) in the sense amplifier unit area SSADL<7:0>. One end of the bus DBUS_O1 is positioned in the sense amplifier unit area SSADL<0> and connected to the sense amplifier unit SAU<0>. The other end of the bus DBUS_O1 is connected to one end of the transistor Tv. One end of the bus DBUS_O2 is connected to the other end of the transistor Tv. The other end of the bus DBUS_O2 is connected to the latch circuit XDL<7:0>.

The bus DBUS_E is connected to the sense amplifier unit SAU<15:8> (not shown) in the sense amplifier unit area SSADL<15:8>. One end of the bus DBUS_E is positioned at the position PE1. The other end of the bus DBUS_E is connected to the latch circuit XDL<15:8>.

The transistors Tn1 and Tn3 are provided in the pre-charge circuit area SPCAa in the segment SEG. The transistor Tp1 is provided in the pre-charge circuit area PCAa of the second area. One end of the transistor Tn1 is connected to the bus DBUS_O1 at the position PO1. For example, the position PO1 is positioned in the pre-charge circuit area SPCAa. The other end of the transistor Tn1 is connected to one end of the transistor Tp1. The control signal DOPC1 is input to the gate of the transistor Tn1. The voltage VDDSA1 is applied to the other end of the transistor Tp1. The voltage VLDB is applied to the gate of the transistor Tp1. One end of the transistor Tn3 is connected to the bus DBUS_E at the position PE1. For example, the position PE1 is positioned in the pre-charge circuit area SPCAa. The other end of the transistor Tn3 is connected to one end of the transistor Tp1. The control signal DEPC1 is input to the gate of the transistor Tn3.

The transistors Tn2 and Tn4 are provided in the pre-charge circuit area SPCAb in the segment SEG. The transistor Tp2 is provided in the pre-charge circuit area PCAb of the second area. One end of the transistor Tn2 is connected to the bus DBUS_O2 at the position PO2. For example, the position PO2 is positioned in the pre-charge circuit area SPCAb. The other end of the transistor Tn2 is connected to one end of the transistor Tp2. The control signal DOPC2 is input to the gate of the transistor Tn2. The voltage VDDSA2 is applied to the other end of the transistor Tp2. The voltage VLDB is applied to the gate of the transistor Tp2. One end of the transistor Tn4 is connected to the bus DBUS_E at the position PE2. For example, the position PE2 is positioned in the pre-charge circuit area SPCAb. The other end of the transistor Tn4 is connected to one end of the transistor Tp2. The control signal DEPC2 is input to the gate of the transistor Tn4.

In contrast, in the present embodiment, the transistor Tp1 is provided in the pre-charge circuit area PCAa of the second area (the area adjacent to the hookup area SBLHU<7:0> in the segment SEG of the first area in the X direction). The transistor Tn1 is provided in the pre-charge circuit area SPCAa in the segment SEG of the first area (the area adjacent to the hookup area SBLHU<7:0> in the Y direction). As a result, the position PO1 where one end of the transistor Tn1 and the bus DBUS_O1 are connected to each other is close to the center of the length LOt of the bus DBUS_O1 from one end of the bus DBUS_O1 to the other end of the bus DBUS_O1. Therefore, compared to the case where the position PO1 is closer to the end of the bus DBUS_O1 on the transistor Tv side than in the present embodiment as in the comparative example, variations in the parasitic resistance RO1 of the bus DBUS_O1 from one end of the bus DBUS_O1 to the position PO1 and in the parasitic resistance RO2 of the bus DBUS_O1 from the position PO1 to the other end of the bus DBUS_O1 can be reduced. Therefore, the charging time of the bus DBUS_O1 can be shortened.

Further, the transistor Tp3 is provided in the pre-charge circuit area PCAb of the second area (the area adjacent to the hookup area SBLHU<15:8> in the segment SEG of the first area in the X direction). The transistor Tn3 is provided in the pre-charge circuit area SPCAb (the area adjacent to the hookup area SBLHU<15:8> in the Y direction) in the segment SEG of the first area. The transistor Tn4 is provided in the pre-charge circuit area SPCAc in the segment SEG of the first area. As a result, the position PE1 where one end of the transistor Tn3 and the bus DBUS_E are connected to each other is close to the center of the length LEt of the bus DBUS_E from one end of the bus DBUS_E to the position PE2 where one end of the transistor Tn4 and the bus DBUS_E are connected to each other. Therefore, like the bus DBUS_O1, variations in the parasitic resistance RE1 of the bus DBUS_E from one end of the bus DBUS_E to the position PE1 and in the parasitic resistance RE2 of the bus DBUS_E from the position PE1 to the position PE2 can be reduced. In addition, the parasitic resistances RE1 and RE2 are smaller than the parasitic resistance of the bus DBUS_E from the position PE1 to the position PE2 in the comparative example in which the length of the bus DBUS_E from the position PE1 to the position PE2 is longer than that of the present embodiment. Therefore, the charging time of the bus DBUS_E from one end of the bus DBUS_E to the position PE2 can be shortened.

As described above, according to the present embodiment, the speed of the operation of the NAND flash memory 30 (the operation of transferring data from the latch circuit XDL to the latch circuit SDL and the operation of transferring data from the latch circuit SDL to the latch circuit XDL) can be increased.

Further, in the present embodiment, the transistor Tp1 is provided in the pre-charge circuit area PCAa of the second area (the area adjacent to the hookup area SBLHU<7:0> in the segment SEG of the first area in the X direction). The transistor Tp3 is provided in the pre-charge circuit area PCAb of the second area (the area adjacent to the hookup area SBLHU<15:8> in the segment SEG of the first area in the X direction). Therefore, unlike the comparative example, it is not necessary to provide the pre-charge circuit area PCAa between the sense amplifier unit area SADLb and the sense amplifier unit area SADLc of the first area and between the column driver area CDAb and the column driver area CDAc of the second area. That is, the interval between the sense amplifier unit area SADLb and the sense amplifier unit area SADLc of the first area and the interval between the column driver area CDAb and the column driver area CDAc of the second area can be set to zero. Therefore, according to the present embodiment, an area of the NAND flash memory 30 can be reduced.

In the present embodiment, in the second area, the pre-charge circuit areas PCAa and PCAb are provided in the area adjacent to the hookup area BLHUa of the first area in the X direction and the area adjacent to the hookup area BLHUb of the first area in the X direction, that is, in the available areas in the comparative example shown in FIG. 18, respectively. Therefore, according to the present embodiment, the area of the NAND flash memory 30 does not increase because the number of transistors Tp (Tp3) is increased by one compared to the comparative example.

2. Second Embodiment

A second embodiment will be described. In the NAND flash memory 30 according to the second embodiment, a layout of the column driver 40 and the sense amplifier module 41 is different from that of the first embodiment. Hereinafter, the differences from the first embodiment will be mainly described.

2.1 Layout of Column Driver and Sense Amplifier Module

Figure 20:
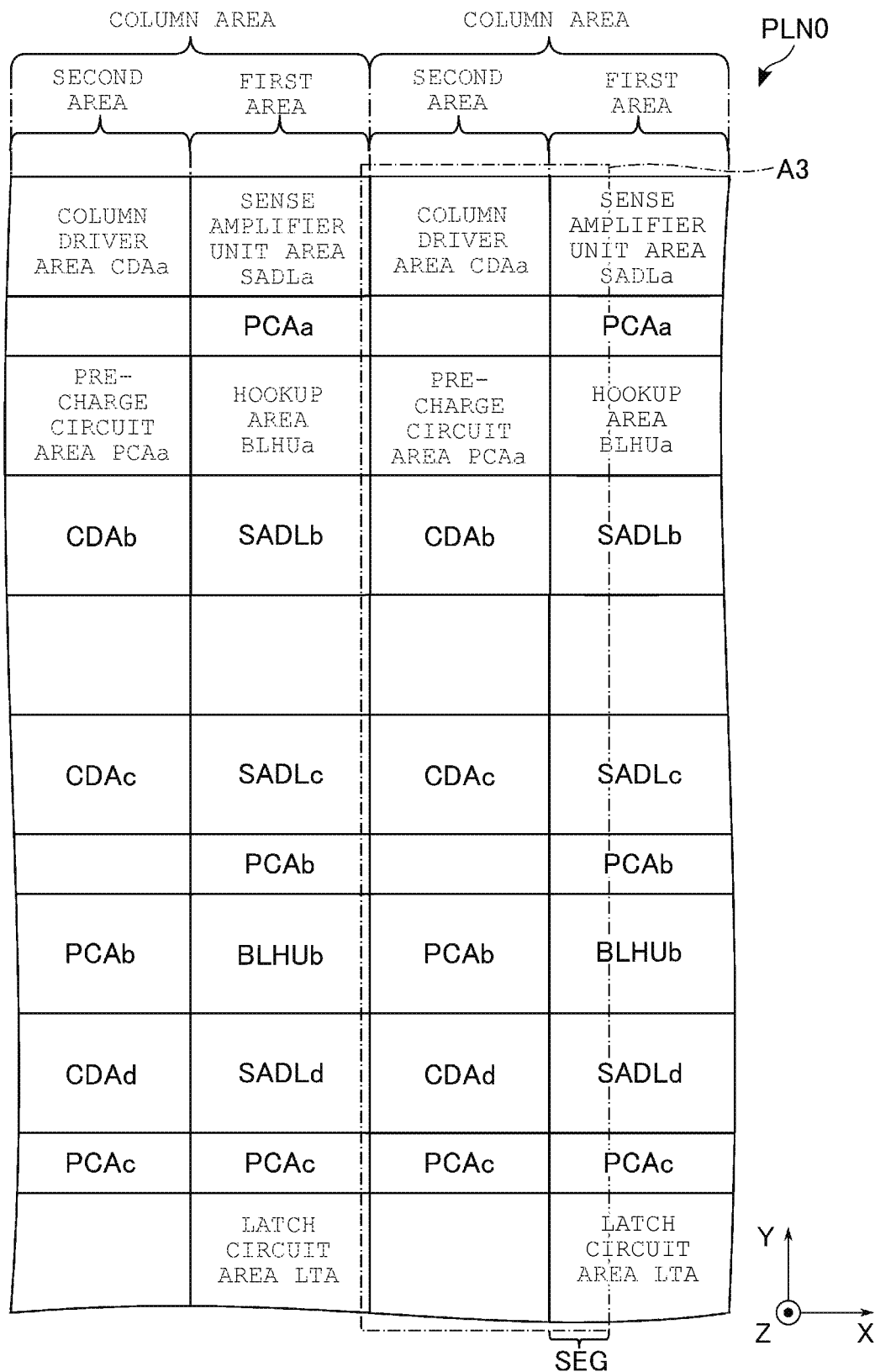
FIG. 20 is a plan view diagram showing an example of a layout of column drivers and sense amplifier modules in a semiconductor memory according to a second embodiment.

FIG. 20 is a plan view diagram showing an example of the layout of the column driver 40 and the sense amplifier module 41. FIG. 20 shows the layout of the column driver 40 and the sense amplifier module 41 in the plane PLN0. The layouts of the column drivers 40 and the sense amplifier modules 41 in the other planes PLN are the same as that shown in FIG. 20.

As shown in FIG. 20, in the first area, there is an area between the sense amplifier unit area SADLb and the sense amplifier unit area SADLc, in which circuits such as a spare circuit and the like, which are not essential but useful for operation, are provided. In the second area, there is an area between the column driver area CDAb and the column driver area CDAc, in which circuits such as a spare circuit and the like, which are not essential but useful for operation, are provided. The other areas of the first area and the second area have the same layout as that shown in FIG. 7 of the first embodiment.

Figure 21:
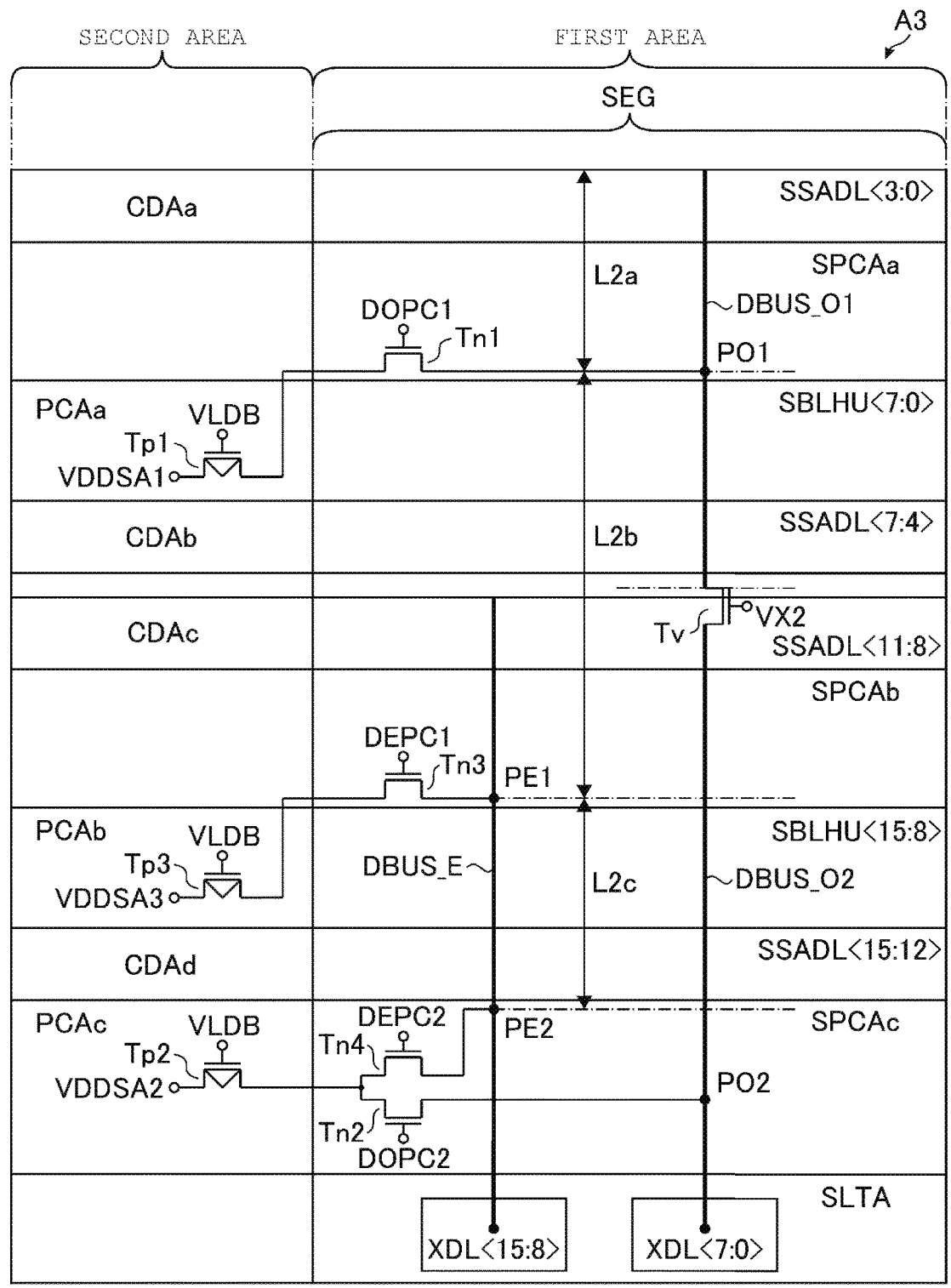
FIG. 21 is a diagram showing an example of a layout of buses and circuits in the sense amplifier module in the semiconductor memory according to the second embodiment.

FIG. 21 is a diagram showing an example of a layout of buses DBUS and circuits in the sense amplifier module 41. FIG. 21 shows an area A3 in FIG. 20. FIG. 21 shows the buses DBUS_O1, DBUS_O2, and DBUS_E, the pre-charge circuits DBP, and the latch circuits XDL. Other circuits are omitted in FIG. 21.

For example, a transistor Tv is provided in any one of the sense amplifier unit area SSADL<7:4>, the area between the sense amplifier unit area SSDL<7:4> and the sense amplifier unit area SSADL<11:8>, and the sense amplifier unit area SSDL<11:8>. Alternatively, the transistor Tv is provided between, or straddles some of these areas. The other areas of the first area and the second area have the same layout as that shown in FIG. 15 of the first embodiment.

Here, the length of the bus DBUS_O1 from one end of the bus DBUS_O1 (the sense amplifier unit area SSADL<0>) to the position PO1 is referred to as L2a. The length from the position PO1 to the position PE1 is referred to as L2b. The length of the bus DBUS_E from the position PE1 to the position PE2 is referred to as L2c.

For example, in the present embodiment, the position PO1 is a position where the length L2a is approximately half the length L2b. The position PE1 is a position where the length L2c is approximately half the length L2b.

2.2 Advantage

According to the present embodiment, as in the first embodiment, the position PO1 where one end of the transistor Tn1 and the bus DBUS_O1 are connected to each other is close to the center of the length of the bus DBUS_O1 from one end of the bus DBUS_O1 to the other end of the bus DBUS_O1. In addition, as in the first embodiment, the position PE1 where one end of the transistor Tn3 and the bus DBUS_E are connected to each other is close to the center of the length of the bus DBUS_E from one end of the bus DBUS_E to the position PE2 where one end of the transistor Tn4 and the bus DBUS_E are connected to each other. Therefore, as in the first embodiment, the charging time of the bus DBUS can be shortened, and the operation speed of the NAND flash memory 30 can be increased.

3. Third Embodiment

A third embodiment will be described. In the NAND flash memory 30 according to the third embodiment, a layout of the column driver 40 and the sense amplifier module 41 is different from that of the second embodiment. Hereinafter, the differences from the second embodiment will be mainly described.

3.1 Layout of Column Driver and Sense Amplifier Module

Figure 22:
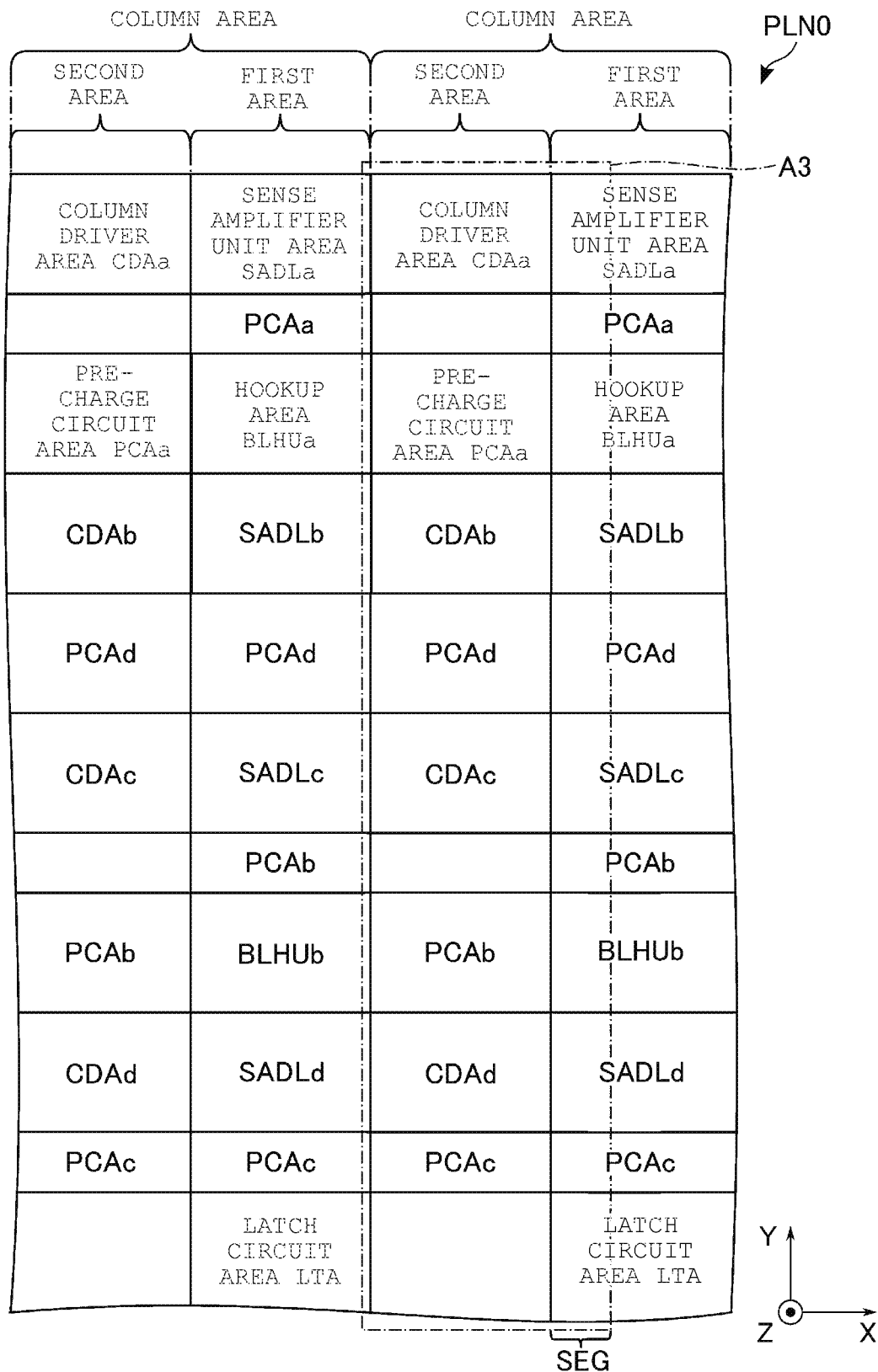
FIG. 22 is a plan view diagram showing an example of a layout of column drivers and sense amplifier modules in a semiconductor memory according to a third embodiment.

FIG. 22 is a plan view diagram showing an example of the layout of the column driver 40 and the sense amplifier module 41. FIG. 22 shows the layout of the column driver 40 and the sense amplifier module 41 in the plane PLN0. The layouts of the column drivers 40 and the sense amplifier modules 41 in the other planes PLN are the same as that shown in FIG. 22.

As shown in FIG. 22, in the first area, the pre-charge circuit area PCAd is provided in the area between the sense amplifier unit area SADLb and the sense amplifier unit area SADLc. In the second area, the pre-charge circuit area PCAd is provided in the area between the column driver area CDAb and the column driver area CDAc. The other areas of the first area and the second area have the same layout as that shown in FIG. 7 of the first embodiment.

Figure 23:
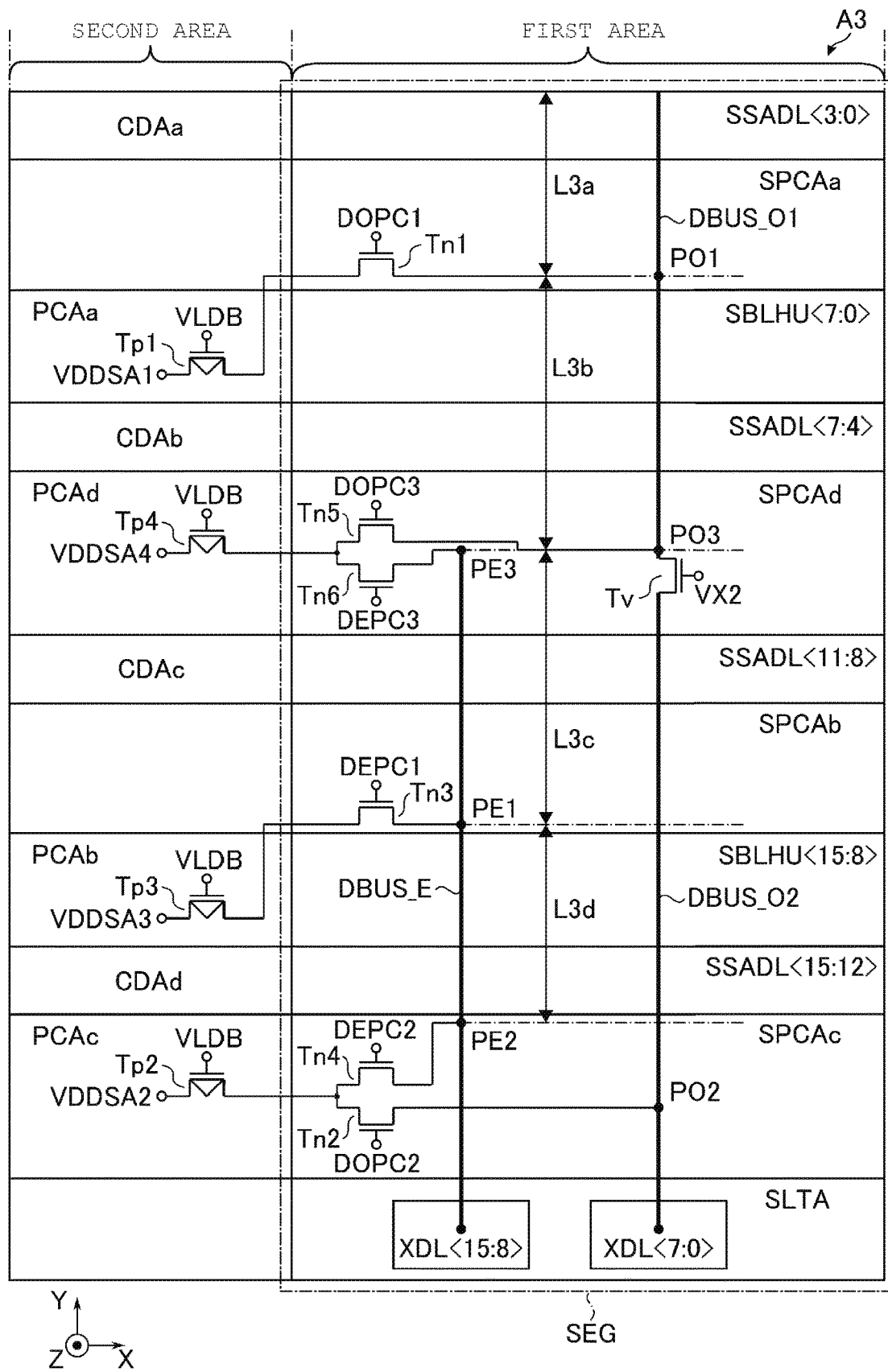
FIG. 23 is a diagram showing an example of a layout of buses and circuits in the sense amplifier module in the semiconductor memory according to the third embodiment.

FIG. 23 is a diagram showing an example of a layout of buses DBUS and circuits in the sense amplifier module 41. FIG. 23 shows an area A3 in FIG. 22. FIG. 23 shows the buses DBUS_O1, DBUS_O2, and DBUS_E, the pre-charge circuits DBP, and the latch circuits XDL. Other circuits are omitted in FIG. 23.

For example, a transistor Tv is provided in the pre-charge circuit area SPCAd.

The transistors Tn5 and Tn6 are provided in the pre-charge circuit area SPCAd in the segment SEG. The transistor Tp4 is provided in the pre-charge circuit area PCAd of the second area. One end of the transistor Tn5 is connected to the bus DBUS_O1 at the position PO3. For example, the position PO3 is positioned in the pre-charge circuit area SPCAd. The other end of the transistor Tn5 is connected to one end of the transistor Tp4. The control signal DOPC3 is input to the gate of the transistor Tn5. The voltage VDDSA4 is applied to the other end of the transistor Tp4. A voltage VLDB is applied to the gate of the transistor Tp4. One end of the transistor Tn6 is connected to the bus DBUS_E at the position PE3. For example, the position PE3 is positioned in the pre-charge circuit area SPCAd. The other end of the transistor Tn6 is connected to one end of the transistor Tp4. The control signal DEPC3 is input to the gate of the transistor Tn6. In FIG. 23, an example in which the positions PO3 and PE3 are the same as each other in the Y direction is described, but the two positions may be different from each other. For example, in the Y direction, the position PO3 may be positioned on the positive side of the position PE3.

The other areas of the first area and the second area have the same layout as that shown in FIG. 15 of the first embodiment.

Here, the length of the bus DBUS_O1 from one end of the bus DBUS_O1 (the sense amplifier unit area SSADL<0>) to the position PO1 is referred to as L3a. The length of the bus DBUS_O1 from the position PO1 to the position PO3 is referred to as L3b. The length of the bus DBUS_E from the position PE3 to the position PE1 is referred to as L3c. The length of the bus DBUS_E from the position PE1 to the position PE2 is referred to as L3d.

For example, in the present embodiment, the position PO3 is near the other end of the bus DBUS_O1, and the position PE3 is near one end of the bus DBUS_E. The positions PO1, PO3, PE3, PE1, and PE2 are positions where the lengths L3a, L3b, L3c, and L3d are approximately the same as each other.

3.2 Advantage

According to the present embodiment, as in the first embodiment, the position PO1 where one end of the transistor Tn1 and the bus DBUS_O1 are connected to each other is close to the center of the length of the bus DBUS_O1 from one end of the bus DBUS_O1 to the other end of the bus DBUS_O1. Further, as in the first embodiment, the position PE1 where one end of the transistor Tn3 and the bus DBUS_E are connected to each other is close to the center of the length of the bus DBUS_E from the position PE3 where one end of the transistor Tn6 and the bus DBUS_E are connected to each other to the position PE2 where one end of the transistor Tn4 and the bus DBUS_E are connected to each other. That is, due to the positional relationship between the positions PO3 and PE3, the difference between the lengths L3a and L3b and the difference between the lengths L3c and L3d are further decreased. Therefore, the charging distances of the buses DBUS_O1 and DBUS_E can be shortened. Therefore, the charging time of the bus DBUS can be shortened.

Further, according to the present embodiment, the voltage VDDSA1 is applied to the position PO1 and the voltage VDDSA4 is applied to the position PO3, thereby making it possible to charge the bus DBUS_O1 not only from the position PO1 but also from the position PO3. The voltage VDDSA3 is applied to the position PE1, the voltage VDDSA2 is applied to the position PE2, and the voltage VDDSA4 is applied to the position PE3, thereby making it possible to charge the bus DBUS_E not only from the positions PE1 and PE2 but also from the position PE3. Therefore, the charging speed of the buses DBUS_O1 and DBUS_E is improved compared to the first embodiment. Therefore, compared to the first embodiment, the charging time of the bus DBUS can be shortened, and the operation speed of the NAND flash memory 30 can be increased.

4. Fourth Embodiment

A fourth embodiment will be described. The NAND flash memory 30 according to the fourth embodiment differs from the second embodiment in that the sense amplifier module 41 includes the transistor connected to the ground voltage VSS. Hereinafter, the differences from the second embodiment will be mainly described.

4.1 Circuit Configuration of Sense Amplifier Module

A circuit configuration of the sense amplifier module 41 will be described with reference to FIGS. 24 and 25.

Figure 24:
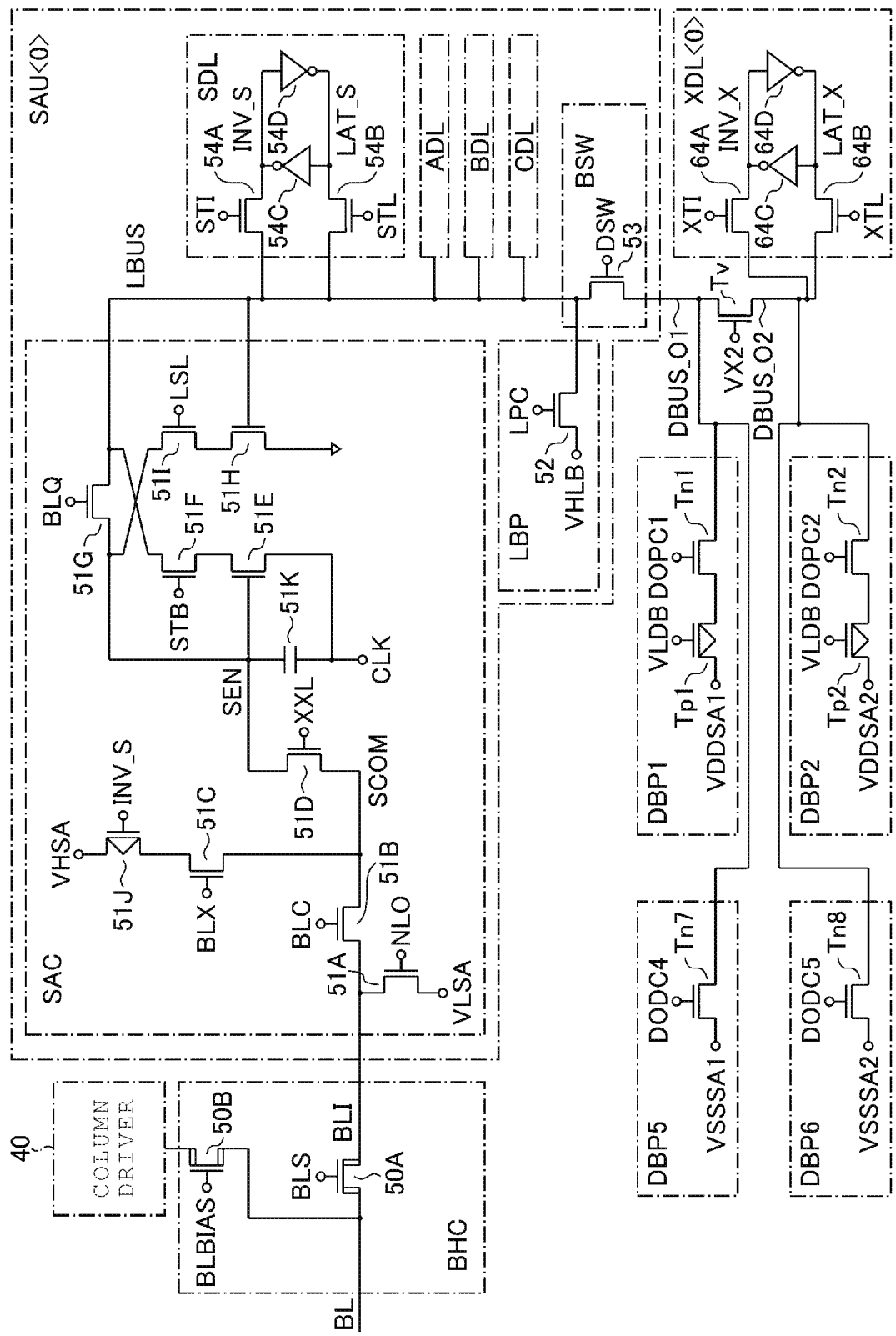
FIG. 24 is a circuit diagram showing an example of a circuit configuration of a sense amplifier module in a semiconductor memory according to a fourth embodiment.

FIG. 24 is a circuit diagram showing an example of the circuit configuration of the sense amplifier module 41. It is noted that FIG. 24 particularly shows the sense amplifier unit SAU<0> in the sense amplifier module 41 as a representative example. The sense amplifier units SAU<1> to SAU<7> have the same configuration as the sense amplifier unit SAU<0>.

As shown in FIG. 24, in the present embodiment, the sense amplifier module 41 further includes pre-charge circuits DBP5 and DBP6 in addition to the circuit components shown in FIG. 5 of the first embodiment.

A pre-charge circuit DBP5 connected to the bus DBUS_O1 includes an n-channel MOS transistor Tn7.

One end of the transistor Tn7 is connected to the bus DBUS_O1. A voltage VSSSA1 is applied to the other end of the transistor Tn7. For example, the voltage VSSSA1 is the ground voltage VSS. A control signal DODC4 is input to the gate of the transistor Tn7. For example, the control signal DODC4 is generated by the sequencer 35. When the transistor Tn7 is in an on state, the voltage VSSSA1 is applied to the bus DBUS_O1. As a result, the bus DBUS_O1 is discharged.

The pre-charge circuit DBP6 connected to the bus DBUS_O2 includes an n-channel MOS transistor Tn8.

One end of the transistor Tn8 is connected to the bus DBUS_O2. A voltage VSSSA2 is applied to the other end of the transistor Tn8. For example, the voltage VSSSA2 is the ground voltage VSS. For example, a control signal DODC5 is generated by the sequencer 35. When the transistor Tn8 is in an on state, the voltage VSSSA2 is applied to the bus DBUS_O2. As a result, the bus DBUS_O2 is discharged.

Voltages may be applied to the buses DBUS_O1 and DBUS_O2 by the pre-charge circuits DBP5 and DBP6 at the same timing or at different timings. In other words, the sequencer 35 may turn on the transistors Tn7 and Tn8 at the same timing or at different timings.

When a transistor Tv is in an on state and the transistor Tn7 is in the on state, the voltage VSSSA1 is applied not only to the bus DBUS_O1 but also to the bus DBUS_O2. In addition, when the transistor Tv is in the on state and the transistor Tn8 is in the on state, the voltage VSSSA2 is applied not only to the bus DBUS_O2 but also to the bus DBUS_O1. In other words, when the transistor Tv is in the on state, the buses DBUS_O1 and DBUS_O2 can be discharged simultaneously.

Meanwhile, when the transistor Tv is in an off state and the transistor Tn7 is in the on state, the voltage VSSSA1 is applied to the bus DBUS_O1. When the transistor Tv is in the off state and the transistor Tn8 is in the on state, the voltage VSSSA2 is applied to the bus DBUS_O2. In other words, when the transistor Tv is in the off state, the buses DBUS_O1 and DBUS_O2 can be discharged separately.

Other configurations in FIG. 24 are the same as those in FIG. 5 of the first embodiment.

Figure 25:
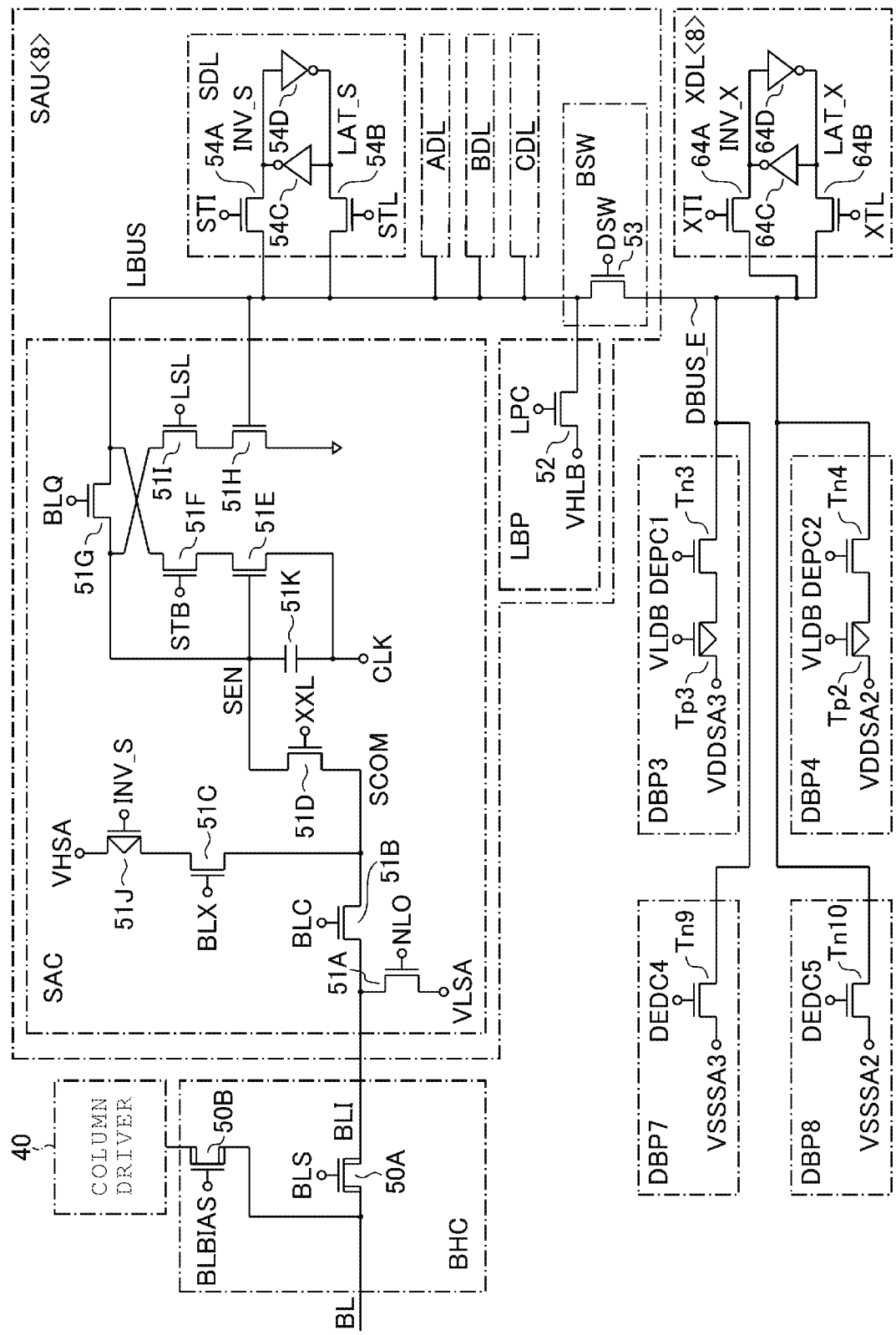
FIG. 25 is a circuit diagram showing an example of the circuit configuration of the sense amplifier module in the semiconductor memory according to the fourth embodiment.

FIG. 25 is a circuit diagram showing an example of a circuit configuration of the sense amplifier module 41. It is noted that FIG. 25 particularly shows the sense amplifier unit SAU<8> in the sense amplifier module 41 as a representative example. The sense amplifier units SAU<9> to SAU<15> have the same configuration as the sense amplifier unit SAU<8>.

As shown in FIG. 25, in the present embodiment, the sense amplifier module 41 further includes pre-charge circuits DBP7 and DBP8 in addition to the circuit components shown in FIG. 6 of the first embodiment.

The pre-charge circuit DBP7 connected to the bus DBUS_E includes an n-channel MOS transistor Tn9.

One end of the transistor Tn9 is connected to the bus DBUS_E. A voltage VSSSA3 is applied to the other end of the transistor Tn9. For example, the voltage VSSSA3 is the ground voltage VSS. A control signal DEDC4 is input to the gate of the transistor Tn9. For example, the control signal DEDC4 is generated by the sequencer 35. When the transistor Tn9 is in an on state, the voltage VSSSA3 is applied to the bus DBUS_E.

The pre-charge circuit DBP8 connected to the bus DBUS_E includes an n-channel MOS transistor Tn10.

One end of the transistor Tn10 is connected to the bus DBUS_E. The voltage VSSSA2 is applied to the other end of the transistor Tn10. A control signal DEDC5 is input to the gate of the transistor Tn10. For example, the control signal DEDC5 is generated by the sequencer 35. When the transistor Tn10 is in an on state, the voltage VSSSA2 is applied to the bus DBUS_E.

Voltages may be applied to the bus DBUS_E by the pre-charge circuits DBP7 and DBP8 at the same timing or at different timings. In other words, the sequencer 35 may turn on the transistors Tn9 and Tn10 at the same timing or at different timings.

Other configurations in FIG. 25 are the same as those in FIG. 6 of the first embodiment.

4.2 Layout of Column Driver and Sense Amplifier Module

A layout of the column driver 40 and the sense amplifier module 41 is the same as that shown in FIG. 20 of the second embodiment.

Figure 26:
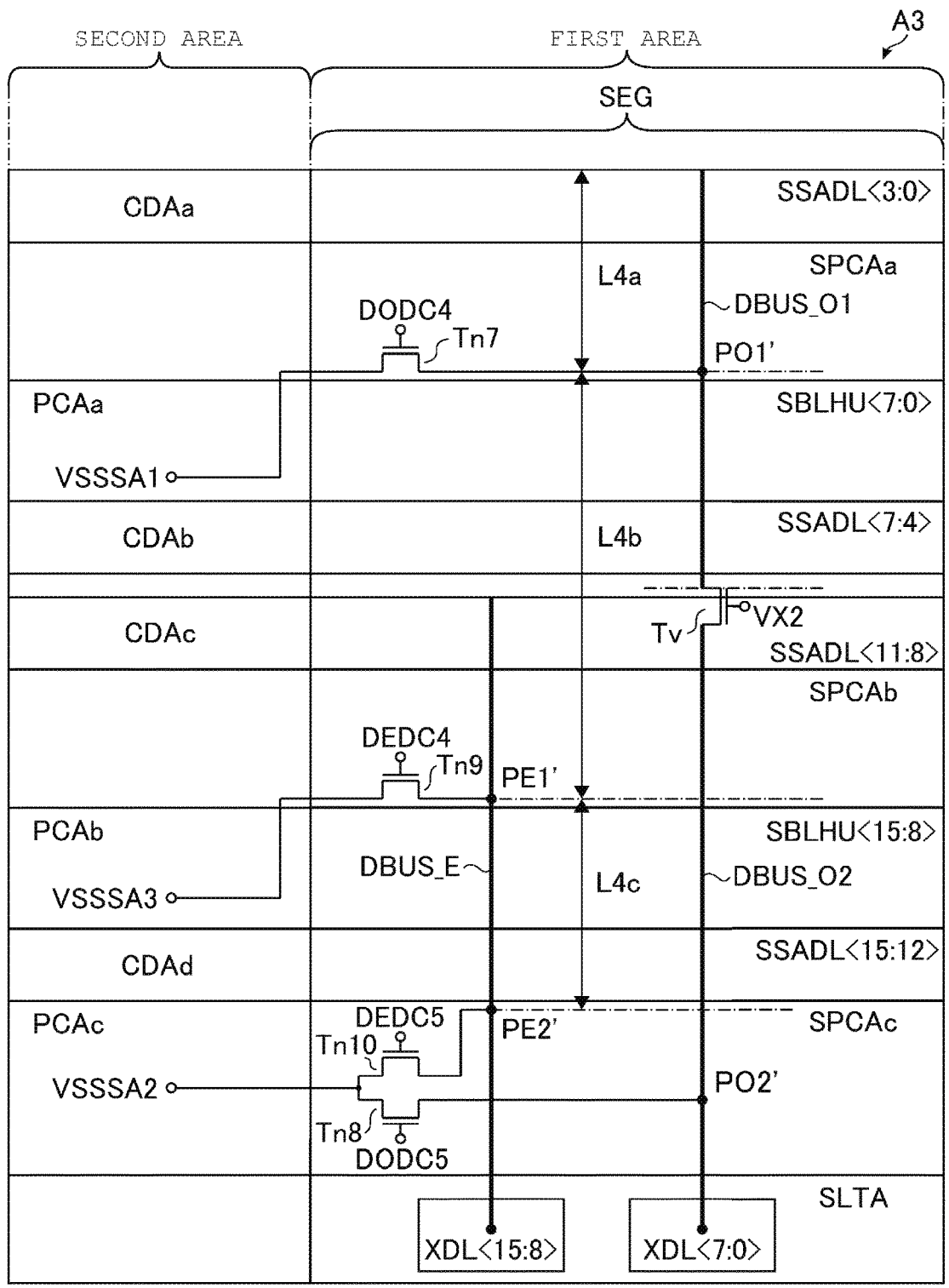
FIG. 26 is a diagram showing an example of a layout of buses and circuits in the sense amplifier module in the semiconductor memory according to the fourth embodiment.

FIG. 26 is a diagram showing an example of a layout of the buses DBUS and circuits in the sense amplifier module 41. FIG. 26 shows an area corresponding to the area A3 in FIG. 20 of the second embodiment. FIG. 26 shows the buses DBUS_O1, DBUS_O2, and DBUS_E, the pre-charge circuits DBP, and the latch circuits XDL. In FIG. 26, the other circuits, and also the transistors Tn1 to Tn4 and Tp1 to Tp3 in FIG. 21 of the second embodiment are omitted.

The transistor Tn7 is provided in the pre-charge circuit area SPCAa in the segment SEG, that is, in the area adjacent to the hookup area SBLHU<7:0> in the segment SEG in the Y direction. One end of the transistor Tn7 is connected to the bus DBUS_O1 at a position PO1'. For example, the position PO1' is positioned in the pre-charge circuit area SPCAa. The voltage VSSSA1 is applied to the other end of the transistor Tn7 via a wiring provided in the pre-charge circuit area PCAa of the second area, that is, in the area adjacent to the hookup area SBLHU<7:0> in the segment SEG of the second area in the X direction. The voltage VSSSA1 may be applied to the other end of the transistor Tn7 via a wiring provided in an area adjacent to the pre-charge circuit area SPCAa in the segment SEG in the X direction. The control signal DODC4 is input to the gate of the transistor Tn7.

The transistor Tn9 is provided in the pre-charge circuit area SPCAb in the segment SEG, that is, in the area adjacent to the hookup area SBLHU<15:8> in the segment SEG in the Y direction. One end of the transistor Tn9 is connected to the bus DBUS_E at a position PE1'. For example, the position PE1' is positioned in the pre-charge circuit area SPCAb. The voltage VSSSA3 is applied to the other end of the transistor Tn9 via a wiring provided in the pre-charge circuit area PCAb of the second area, that is, in the area adjacent to the hookup area SBLHU<15:8> in the segment SEG of the second area in the X direction. The voltage VSSSA3 may be applied to the other end of the transistor Tn9 via a wiring provided in an area adjacent to the pre-charge circuit area SPCAb in the segment SEG in the X direction. The control signal DEDC4 is input to the gate of the transistor Tn9.

The transistors Tn8 and Tn10 are provided in the pre-charge circuit area SPCAc in the segment SEG. One end of the transistor Tn8 is connected to the bus DBUS_O2 at a position PO2'. For example, the position PO2' is positioned in the pre-charge circuit area SPCAc. The voltage VSSSA2 is applied to the other end of the transistor Tn8 via a wiring provided in the pre-charge circuit area PCAc of the second area. The control signal DODC5 is input to the gate of the transistor Tn8. One end of the transistor Tn10 is connected to the bus DBUS_E at a position PE2'. For example, the position PE2' is positioned in the pre-charge circuit area SPCAc. The voltage VSSSA2 is applied to the other end of the transistor Tn10. The control signal DEDC5 is input to the gate of the transistor Tn10.

The other areas of the first area and the second area have the same layout as that shown in FIG. 20 of the second embodiment.

Here, the length of the bus DBUS_O1 from one end of the bus DBUS_O1 (the sense amplifier unit area SSADL<0>) to the position PO1' is referred to as L4a. The length from the position PO1' to the position PE1' is referred to as L4b. The length of the bus DBUS_E from the position PE1' to the position PE2' is referred to as L4c.

For example, in the present embodiment, the position PO1' is a position where the length L4a is approximately half the length L4b. The position PE1' is a position where the length L4c is approximately half the length L4b.

4.3 Discharge Operation

A discharge operation of the bus DBUS in the NAND flash memory 30 according to the present embodiment will be described. Hereinafter, the discharge operation of the buses DBUS_O1 and DBUS_O2 shown in FIG. 24 will be described as an example. The same applies to the discharge operation of DBUS_E.

Figure 27:
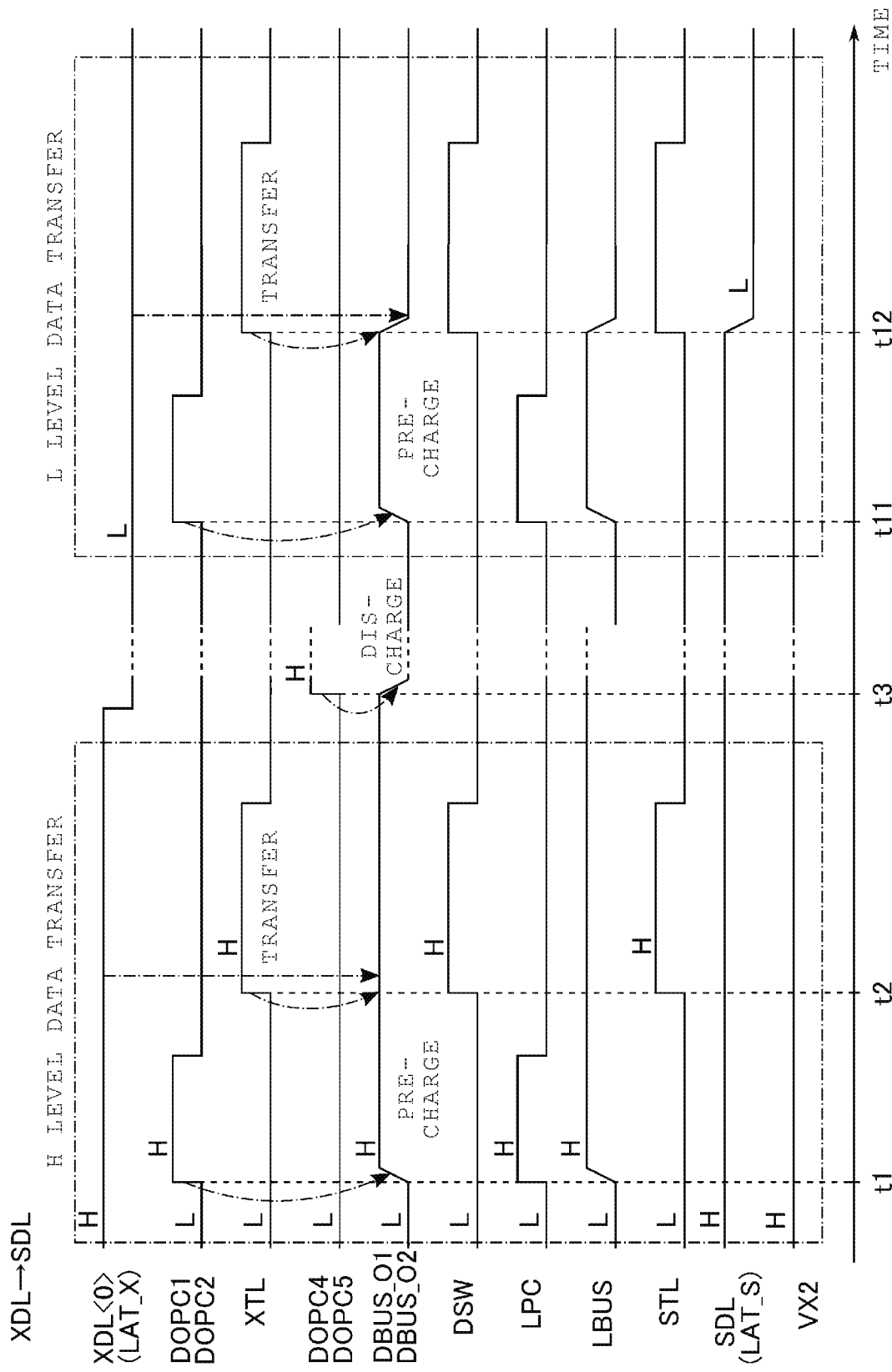
FIG. 27 is a timing chart showing an example of temporal changes in voltages of various control signals and voltages applied to various circuit components in a data transfer operation and a discharge operation of the semiconductor memory according to the fourth embodiment.

FIG. 27 is a timing chart showing an example of temporal changes in voltages of various control signals and voltages applied to various circuit components in an operation of transferring data from the latch circuit XDL<0> to the latch circuit SDL and in the discharge operation of the buses DBUS_O1 and DBUS_O2. FIG. 27 shows an example in which the buses DBUS_O1 and DBUS_O2 are discharged after transferring data corresponding to the H level. The operation of transferring data from the latch circuit XDL<0> to the latch circuit SDL is the same as that shown in FIG. 16 of the first embodiment.

Figure 28:
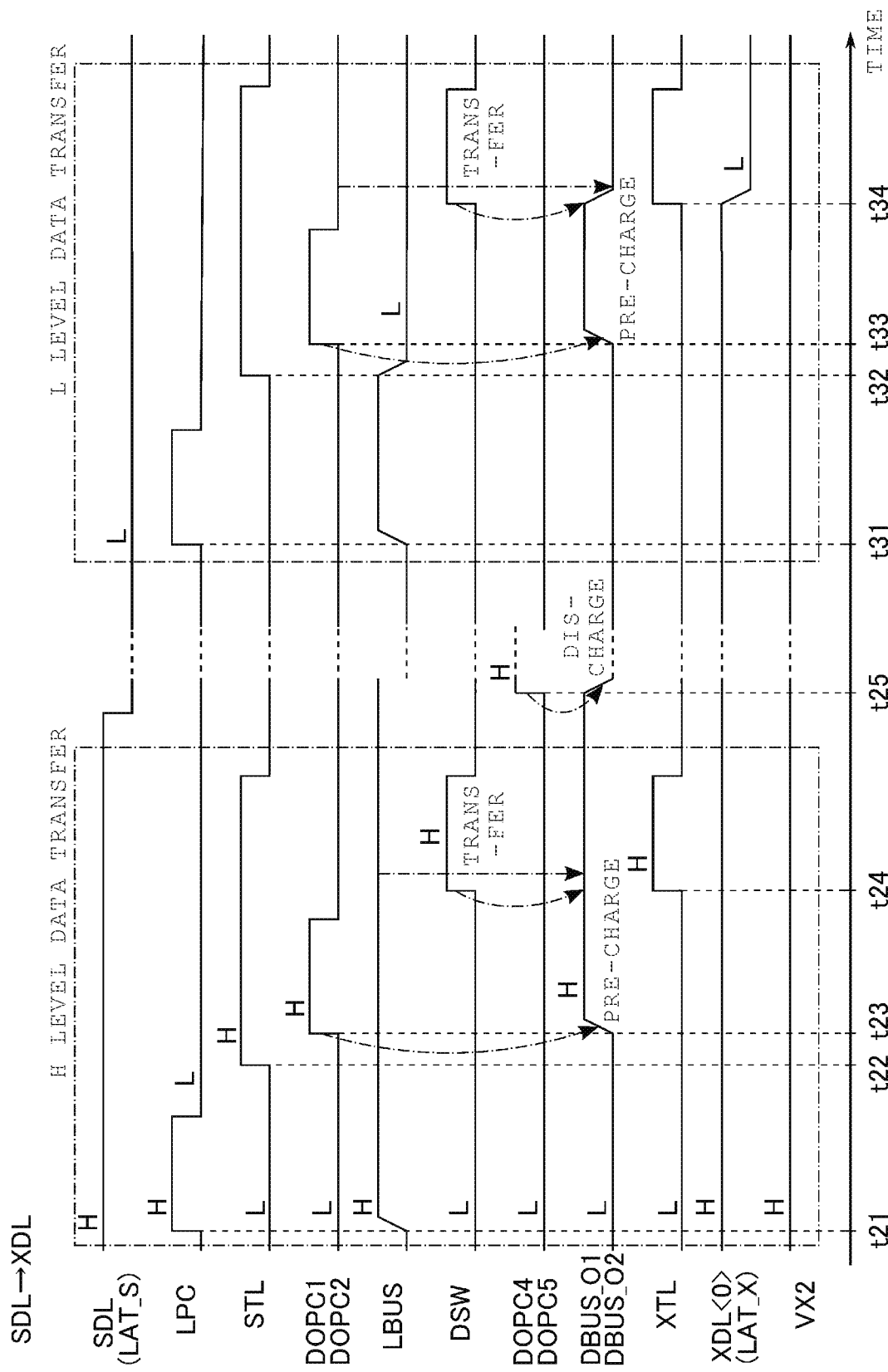
FIG. 28 is a timing chart showing an example of temporal changes in voltages of various control signals and voltages applied to the various circuit components in the data transfer operation and the discharge operation of the semiconductor memory according to the fourth embodiment.

In FIG. 27, when transferring the data corresponding to the H level is completed, the control signals DOPC4 and DOPC5 are the H level at time t3, whereby the buses DBUS_O1 and DBUS_O2 are discharged to the L level. FIG. 28 is a timing chart showing an example of temporal changes in voltages of various control signals and voltages applied to various circuit components in an operation of transferring data from the latch circuit SDL to the latch circuit XDL<0> and in the discharge operation of the buses DBUS_O1 and DBUS_O2. FIG. 28 shows an example in which the buses DBUS_O1 and DBUS_O2 are discharged after transferring the data corresponding to the H level. The operation of transferring data from the latch circuit SDL to the latch circuit XDL<0> is the same as that shown in FIG. 17 of the first embodiment.

In FIG. 28, when transferring the data corresponding to the H level is completed, the control signals DOPC4 and DOPC5 are the H level at time t25, whereby the buses DBUS_O1 and DBUS_O2 are discharged to the L level.

The timing of discharging the buses DBUS_O1 and DBUS_O2 is not limited to after data transfer. For example, in a case where coupling occurs due to the influence of the adjacent buses DBUS_O1 and DBUS_O2 when the buses DBUS_O1 and DBUS_O2 are charged, the buses DBUS_O1 and DBUS_O2 may be discharged in order to reduce the coupling noise. Further, during the read operation, the node SEN needs to be charged to a certain voltage and then further boosted. At this time, for example, the buses DBUS_O1 and DBUS_O2 are charged, and the node SEN is boosted using the coupling capacitance between the node SEN and the bus DBUS. When charging the buses DBUS_O1 and DBUS_O2 in order to boost the node SEN in this way, the buses DBUS_O1 and DBUS_O2 may be discharged once before the charging.

4.4 Advantage

According to the present embodiment, as in the second embodiment, the speed of the operation (the data transfer operation) of the NAND flash memory 30 can be increased.

Further, according to the present embodiment, as in the second embodiment, the position PO1' where one end of the transistor Tn7 and the bus DBUS_O1 are connected to each other is close to the center of the length of the bus DBUS_O1 from one end of the bus DBUS_O1 to the other end of the bus DBUS_O1. Further, as in the second embodiment, the position PE1' where one end of the transistor Tn9 and the bus DBUS_E are connected to each other is close to the center of the length of the bus DBUS_E from one end of the bus DBUS_E to the position PE2' where one end of the transistor Tn10 and the bus DBUS_E are connected to each other. Therefore, the discharging time of the bus DBUS can be shortened, and the speed of the operation (the discharge operation of the buses DBUS_O1, DBUS_O2, and DBUS_E) of the NAND flash memory 30 can be increased.

The layout of the column driver 40 and the sense amplifier module 41 of the present embodiment can also be applied to the first embodiment.

5. Fifth Embodiment

A fifth embodiment will be described. The NAND flash memory 30 according to the present embodiment differs from the third embodiment in that the sense amplifier module 41 includes the transistor connected to the ground voltage VSS. Hereinafter, the differences from the third embodiment will be mainly described.

5.1 Layout of Column Driver and Sense Amplifier Module

A layout of the column driver 40 and the sense amplifier module 41 is the same as that shown in FIG. 22 of the third embodiment.

Figure 29:
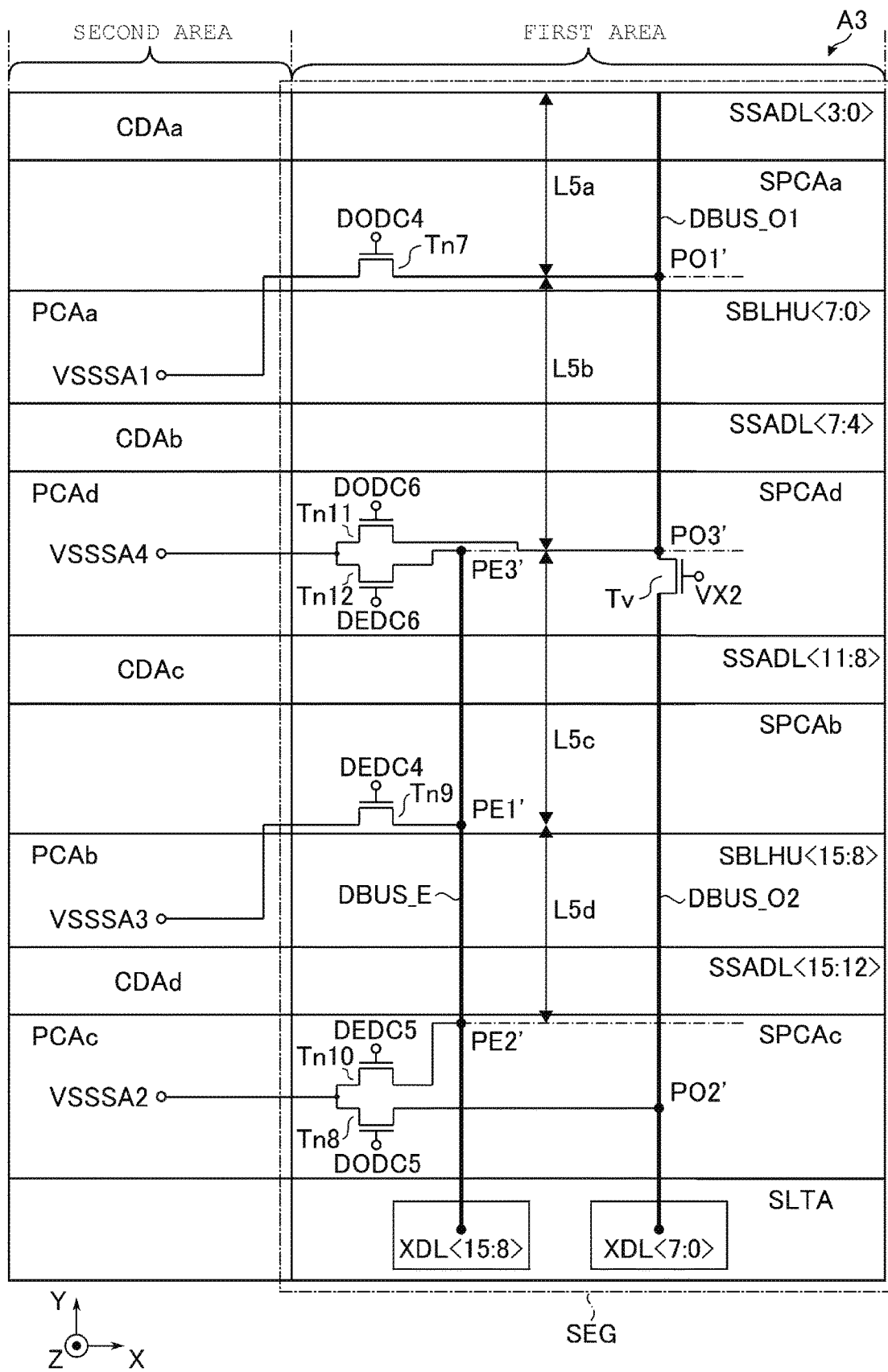
FIG. 29 is a diagram showing an example of a layout of buses and circuits in a sense amplifier module in a semiconductor memory according to a fifth embodiment.

FIG. 29 is a diagram showing an example of a layout of the bus DBUS and the circuit in the sense amplifier module 41. FIG. 29 shows an area corresponding to the area A3 in FIG. 22 of the third embodiment. FIG. 29 shows the buses DBUS_O1, DBUS_O2, and DBUS_E, the pre-charge circuits DBP, and the latch circuits XDL. In FIG. 29, the other circuits, and also the transistors Tn1 to Tn6 and Tp1 to Tp4 in FIG. 23 of the third embodiment are also omitted.

For example, a transistor Tv is provided in the pre-charge circuit area SPCAd.

Transistors Tn11 and Tn12 are provided in the pre-charge circuit area SPCAd in the segment SEG. One end of the transistor Tn11 is connected to the bus DBUS_O1 at a position PO3'. For example, the position PO3' is positioned in the pre-charge circuit area SPCAd. A voltage VSSSA4 is applied to the other end of the transistor Tn11 via a wiring provided in the pre-charge circuit area PCAd of the second area. A control signal DODC6 is input to the gate of the transistor Tn11. One end of the transistor Tn12 is connected to the bus DBUS_E at a position PE3'. For example, the position PE3' is positioned in the pre-charge circuit area SPCAd. The voltage VSSSA4 is applied to the other end of the transistor Tn12. A control signal DEDC6 is input to the gate of the transistor Tn12. In FIG. 29, an example in which the positions PO3' and PE3' are the same as each other in the Y direction is described, but the two positions may be different from each other. For example, in the Y direction, the position PO3' may be positioned on the positive side of the position PE3'.

The transistor Tn7 is provided in the pre-charge circuit area SPCAa in the segment SEG. One end of the transistor Tn7 is connected to the bus DBUS_O1 at the position PO1'. For example, the position PO1' is positioned in the pre-charge circuit area SPCAa. The voltage VSSSA1 is applied to the other end of the transistor Tn7 via a wiring provided in the pre-charge circuit area PCAa of the second area. The voltage VSSSA1 may be applied to the other end of the transistor Tn7 via a wiring provided in an area adjacent to the pre-charge circuit area SPCAa in the segment SEG in the X direction. The control signal DODC4 is input to the gate of the transistor Tn7.

The transistor Tn9 is provided in the pre-charge circuit area SPCAb in the segment SEG. One end of the transistor Tn9 is connected to the bus DBUS_E at the position PE1'. For example, the position PE1' is positioned in the pre-charge circuit area SPCAb. The voltage VSSSA3 is applied to the other end of the transistor Tn9 via a wiring provided in the pre-charge circuit area PCAb of the second area. The voltage VSSSA3 may be applied to the other end of the transistor Tn9 via a wiring provided in an area adjacent to the pre-charge circuit area SPCAb in the segment SEG in the X direction. The control signal DEDC4 is input to the gate of the transistor Tn9.

The transistors Tn8 and Tn10 are provided in the pre-charge circuit area SPCAc in the segment SEG. One end of the transistor Tn8 is connected to the bus DBUS_O2 at the position PO2'. For example, the position PO2' is positioned in the pre-charge circuit area SPCAc. The voltage VSSSA2 is applied to the other end of the transistor Tn8 via a wiring provided in the pre-charge circuit area PCAc of the second area. The control signal DODC5 is input to the gate of the transistor Tn8. One end of the transistor Tn10 is connected to the bus DBUS_E at the position PE2'. For example, the position PE2' is positioned in the pre-charge circuit area SPCAc. The voltage VSSSA2 is applied to the other end of the transistor Tn10. The control signal DEDC5 is input to the gate of the transistor Tn10.

The other areas of the first area and the second area have the same layout as that shown in FIG. 23 of the third embodiment.

In this case, the length of the bus DBUS_O1 from one end of the bus DBUS_O1 (the sense amplifier unit area SSADL<0>) to the position PO1' is referred to as L5a. The length of the bus DBUS_O1 from the position PO1' to the position PO3' is referred to as L5b. The length of the bus DBUS_E from the position PE3' to the position PE1' is referred to as L5c. The length of the bus DBUS_E from the position PE1' to the position PE2' is referred to as L5d.

For example, in the present embodiment, the position PO3' is near the other end of the bus DBUS_O1, and the position PE3' is near one end of the bus DBUS_E. The positions PO1', PO3', PE3', PE1', and PE2' are positions where the lengths L5a, L5b, L5c, and L5d are approximately the same as each other.

5.2 Effects

According to the present embodiment, as in the third embodiment, the speed of the operation (the data transfer operation) of the NAND flash memory 30 can be increased.

Further, according to the present embodiment, the position PO1' where one end of the transistor Tn7 and the bus DBUS_O1 are connected to each other is close to the center of the length of the bus DBUS_O1 from one end of the bus DBUS_O1 to the other end of the bus DBUS_O1. Further, the position PE1' where one end of the transistor Tn9 and the bus DBUS_E are connected to each other is close to the center of the length of the bus DBUS_E from the position PE3' where one end of the transistor Tn12 and the bus DBUS_E are connected to each other to the position PE2' where one end of the transistor Tn10 and the bus DBUS_E are connected to each other. That is, due to the positional relationship between the positions PO3' and PE3', the difference between the lengths L5a and L5b and the difference between the lengths L5c and L5d are further decreased. Therefore, the discharging distances of the buses DBUS_O1 and DBUS_E can be shortened. Therefore, the discharging time of the bus DBUS can be shortened.

Furthermore, according to the present embodiment, the voltage VSSSA1 is applied to the position PO1' and the voltage VSSSA4 is applied to the position PO3', thereby making it possible to discharge the bus DBUS_O1 not only from the position PO1' but also from the position PO3'. The voltage VSSSA3 is applied to the position PE1', the voltage VSSSA2 is applied to the position PE2', and the voltage VSSSA4 is applied to the position PE3', thereby making it possible to discharge the bus DBUS_E not only from the positions PE1' and PE2' but also from the position PE3'. Therefore, the discharging speed of the buses DBUS_O1 and DBUS_E is improved compared to the fourth embodiment. Therefore, compared to the fourth embodiment, the discharging time of the bus DBUS can be shortened, and the operation speed of the NAND flash memory 30 can be increased.

The layout of the column driver 40 and the sense amplifier module 41 of the present embodiment can also be applied to the first embodiment.

6. Modifications, Etc.

As described above, the semiconductor memory according to the above embodiments includes a memory cell (MC), a bit line (BL) electrically connected to the memory cell, a sense amplifier (SAU<0>/SAU<8>) provided in a first area (SSADL<3:0>/SSADL<11:8>), connected to the bit line, and having a first latch circuit (SDL/ADL/BDL/CDL), a second latch circuit (XDL<0>/XDL<8>) connected to the first latch circuit via a first wiring (DBUS_O1/DBUS_E), a first hookup circuit (BHC) provided in a second area (SBLHU<7:0>/SBLHU<15:8>) aligned with the first area in a first direction (Y) and controlling connection between the bit line and the sense amplifier, and a first transistor ((Tn1/Tn3)/(Tn7/Tn9)) provided in a third area (SPCAa/SPCAb) between the first area and the second area in the first direction (Y), in which one end of the first transistor is connected to the first wiring at a first position (PO1/PE1) in the third area and the other end is applied with a first voltage ((VDDSA1/VDDSA3)/(VSSSA1/VSSSA3)).

The embodiments are not limited to those described above, and various modifications are possible.

6.1 First Modification

A first modification of the first embodiment will be described. The NAND flash memory 30 according to the first modification differs from the first embodiment in that the number of buses DBUS is one. Hereinafter, the differences from the first embodiment will be mainly described.

6.1.1 Configuration of Sense Amplifier Module

Figure 30:
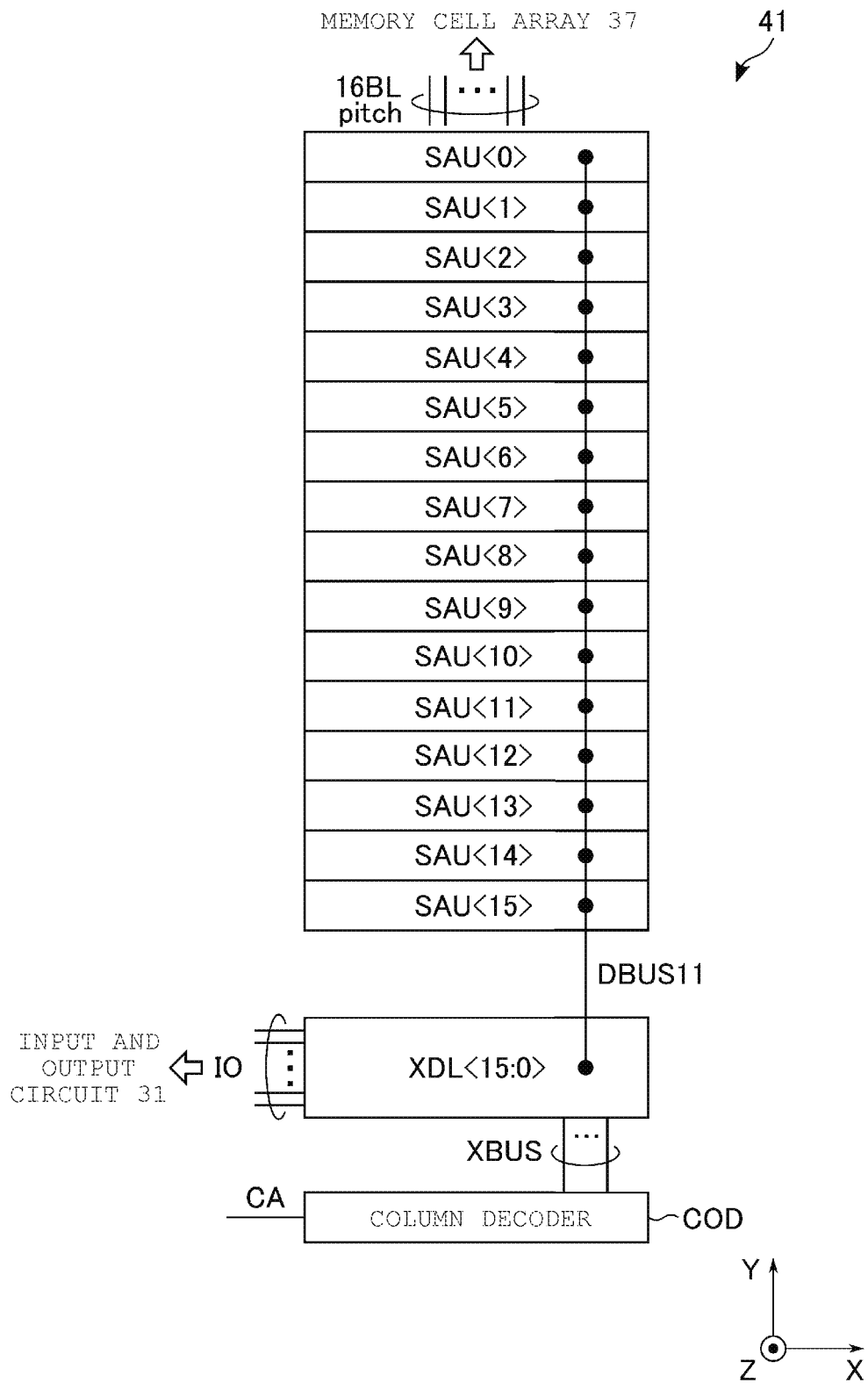
FIG. 30 is a block diagram of an example of a configuration of a sense amplifier module in a semiconductor memory according to a first modification of the first embodiment.

A configuration of the sense amplifier module 41 will be described with reference to FIG. 30. FIG. 30 is a block diagram of an example of the configuration of the sense amplifier module 41.

In the example of FIG. 30, 16 sense amplifier units SAU<0> to SAU<15> are commonly connected to one bus DBUS (hereinafter, referred to as "DBUS11"). It is noted that any number of sense amplifier units SAU may be connected to the one bus DBUS. The sense amplifier unit SAU is connected to the latch circuit XDL via the bus DBUS11. 16 latch circuits XDL<15:0> respectively corresponding to the sense amplifier units SAU<0> to SAU<15> are commonly connected to the bus DBUS11.

Other configurations of the sense amplifier module 41 are the same as those of the first embodiment shown in FIG. 4.

6.1.2 Circuit Configuration of Sense Amplifier Module

A circuit configuration of the sense amplifier module 41 will be described with reference to FIG. 31.

Figure 31:
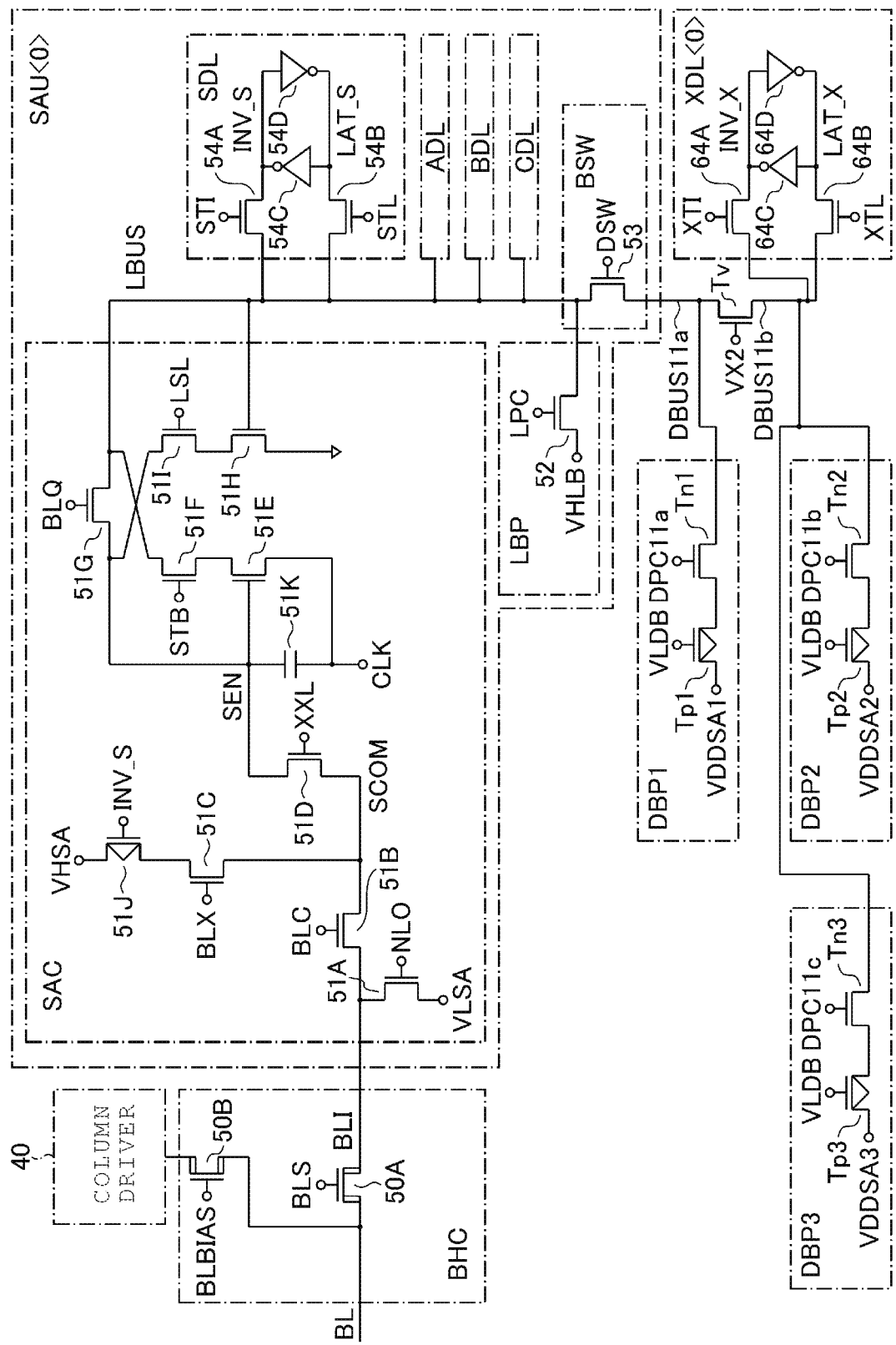
FIG. 31 is a circuit diagram showing an example of a circuit configuration of the sense amplifier module in the semiconductor memory according to the first modification of the first embodiment.

FIG. 31 is a circuit diagram showing an example of the circuit configuration of the sense amplifier module 41. It is noted that FIG. 31 particularly shows the sense amplifier unit SAU<0> in the sense amplifier module 41 as a representative example. The sense amplifier units SAU<1> to SAU<15> have the same configuration as the sense amplifier unit SAU<0>.

In the present modification, a bus DBUS11a is provided as the bus DBUS11 connected to the sense amplifier units SAU<0> to SAU<15>. A bus DBUS11b is provided as the bus DBUS11 connected to the latch circuits XDL<0> to XDL<15>. An n-channel MOS transistor Tv is provided between the bus DBUS11a and the bus DBUS11b.

One end of the bus DBUS11a is connected to the sense amplifier unit SAU<0>. The other end of the bus DBUS11a is connected to one end of the transistor Tv. One end of the bus DBUS11b is connected to the other end of the transistor Tv. The other end of the bus DBUS11b is connected to the latch circuit XDL<0>.

A pre-charge circuit DBP1 connected to the bus DBUS11a includes the n-channel MOS transistor Tn1 and the p-channel MOS transistor Tp1.

One end of the transistor Tn1 is connected to the bus DBUS11a. The other end of the transistor Tn1 is connected to one end of the transistor Tp1. A control signal DPC11a is input to the gate of the transistor Tn1. For example, the control signal DPC11a is generated by the sequencer 35.

The voltage VDDSA1 is applied to the other end of the transistor Tp1. A voltage VLDB is applied to the gate of the transistor Tp1. When the transistors Tp1 and Tn1 are in an on state, the voltage VDDSA1 is applied to the bus DBUS11a. As a result, the bus DBUS11a is charged.

A pre-charge circuit DBP2 connected to the bus DBUS11b includes the n-channel MOS transistor Tn2 and the One end of the transistor Tn2 is connected to the bus DBUS11b. The other end of the transistor Tn2 is connected to one end of the transistor Tp2. A control signal DPC11b is input to the gate of the transistor Tn2. For example, the control signal DPC11b is generated by the sequencer 35.

The voltage VDDSA2 is applied to the other end of the transistor Tp2. The voltage VLDB is applied to the gate of the transistor Tp2. When the transistors Tp2 and Tn2 are in an on state, the voltage VDDSA2 is applied to the bus DBUS11b. As a result, the bus DBUS11b is charged.

A pre-charge circuit DBP3 connected to the bus DBUS11b includes the n-channel MOS transistor Tn3 and the p-channel MOS transistor Tp3.

One end of the transistor Tn3 is connected to the bus DBUS11b. The other end of the transistor Tn3 is connected to one end of the transistor Tp3. A control signal DPC11c is input to the gate of the transistor Tn3. For example, the control signal DPC11c is generated by the sequencer 35.

The voltage VDDSA3 is applied to the other end of the transistor Tp3. The voltage VLDB is applied to the gate of the transistor Tp3. When the transistors Tp3 and Tn3 are in an on state, the voltage VDDSA3 is applied to the bus DBUS11b. As a result, the bus DBUS11b is charged.

Other configurations in FIG. 31 are the same as those in FIG. 5 of the first embodiment.

6.1.3 Layout of Column Driver and Sense Amplifier Module

A layout of the column driver 40 and the sense amplifier module 41 is the same as that shown in FIG. 7 of the first embodiment.

FIG. 32 is a diagram showing an example of a layout of the buses DBUS and circuits in the sense amplifier module 41. FIG. 32 shows an area corresponding to the area A3 in FIG. 13 of the first embodiment. FIG. 32 shows the buses DBUS11a and DBUS11b, the pre-charge circuits DBP, and the latch circuit XDL. Other circuits are omitted in FIG. 32.

The buses DBUS11a and DBUS11b are provided in the segment SEG of the first area. The buses DBUS11a and DBUS11b extend along the Y direction. The transistor Tv is provided between the bus DBUS11a and the bus DBUS11b. For example, the transistor Tv is provided in either the sense amplifier unit area SSDL<7:4> or the sense amplifier unit area SSDL<11:8>. Alternatively, the transistor Tv is provided between, or straddles these areas.

The bus DBUS11a is connected to the sense amplifier unit SAU<15:0> (not shown) in the sense amplifier unit area SSADL<15:0>. One end of the bus DBUS11a is positioned in the sense amplifier unit area SSADL<0> and connected to the sense amplifier unit SAU<0>. The other end of the bus DBUS11a is connected to one end of the transistor Tv. One end of the bus DBUS11b is connected to the other end of the transistor Tv. The other end of the bus DBUS11b is connected to the latch circuit XDL<15:0>.

The transistor Tn1 is provided in the pre-charge circuit area SPCAa in the segment SEG. The transistor Tp1 is provided in the pre-charge circuit area PCAa of the second area. One end of the transistor Tn1 is connected to the bus DBUS11a at a position P11a. For example, the position P11a is positioned in the pre-charge circuit area SPCAa. The other end of the transistor Tn1 is connected to one end of the transistor Tp1. The control signal DPC11a is input to the gate of the transistor Tn1. The voltage VDDSA1 is applied to the other end of the transistor Tp1. The voltage VLDB is applied to the gate of the transistor Tp1.

The transistor Tn3 is provided in the pre-charge circuit area SPCAb in the segment SEG. The transistor Tp3 is provided in the pre-charge circuit area PCAb of the second area. One end of the transistor Tn3 is connected to the bus DBUS11b at a position P11c. For example, the position P11c is positioned in the pre-charge circuit area SPCAb. The other end of the transistor Tn3 is connected to one end of the transistor Tp3. The control signal DPC11c is input to the gate of the transistor Tn3. The voltage VDDSA3 is applied to the other end of the transistor Tp3. The voltage VLDB is applied to the gate of the transistor Tp3.

The transistor Tn2 is provided in the pre-charge circuit area SPCAc in the segment SEG. The transistor Tp2 is provided in the pre-charge circuit area PCAc of the second area. One end of the transistor Tn2 is connected to the bus DBUS11b at a position P11b. For example, the position P11b is positioned in the pre-charge circuit area SPCAc. The other end of the transistor Tn2 is connected to one end of the transistor Tp2. The control signal DPC11b is input to the gate of the transistor Tn2. The voltage VDDSA2 is applied to the other end of the transistor Tp2. The voltage VLDB is applied to the gate of the transistor Tp2.

In the present modification, as in the first embodiment, it is preferable that the position P11a of the bus DBUS 11a is a position at which the difference between the length of the bus DBUS11a from one end of the bus DBUS11a to the position P11a and the length of the bus DBUS11a from the position P11a to the transistor Tv is smaller. It is more preferable that the position P11a is at approximately half the length of the bus DBUS11a from one end of the bus DBUS11a to the transistor Tv. It is preferable that the position P11c of the bus DBUS11b is a position at which the difference between the length of the bus DBUS11b from the transistor Tv to the position P11c and the length of the bus DBUS11b from the position P11c to the position P11b is smaller. It is more preferable that the position P11c is at approximately half the length of the bus DBUS11b from the transistor Tv to the position P11b.

6.1.4 Advantage

According to the present modification, as in the first embodiment, the position P11a where one end of the transistor Tn1 and the bus DBUS11a are connected to each other is close to the center of the length of the bus DBUS11a from one end of the bus DBUS11a to the transistor Tv. Further, as in the first embodiment, the position P11c where one end of the transistor Tn3 and the bus DBUS11b are connected to each other is close to the center of the length of the bus DBUS11b from the transistor Tv to the position P11b where one end of the transistor Tn2 and the bus DBUS11b are connected to each other. Therefore, according to the present modification, the same effects as those of the first embodiment can be achieved. It is noted that the layout of the column driver 40 and the sense amplifier module 41 when the number of buses DBUS is one in the present modification can also be applied to the second to fifth embodiments.

6.2 Second Modification

A second modification of the first embodiment will be described. The NAND flash memory 30 according to the second modification differs from the first embodiment in that the number of buses DBUS is three. Hereinafter, the differences from the first embodiment will be mainly described.

6.2.1 Configuration of Sense Amplifier Module

Figure 33:
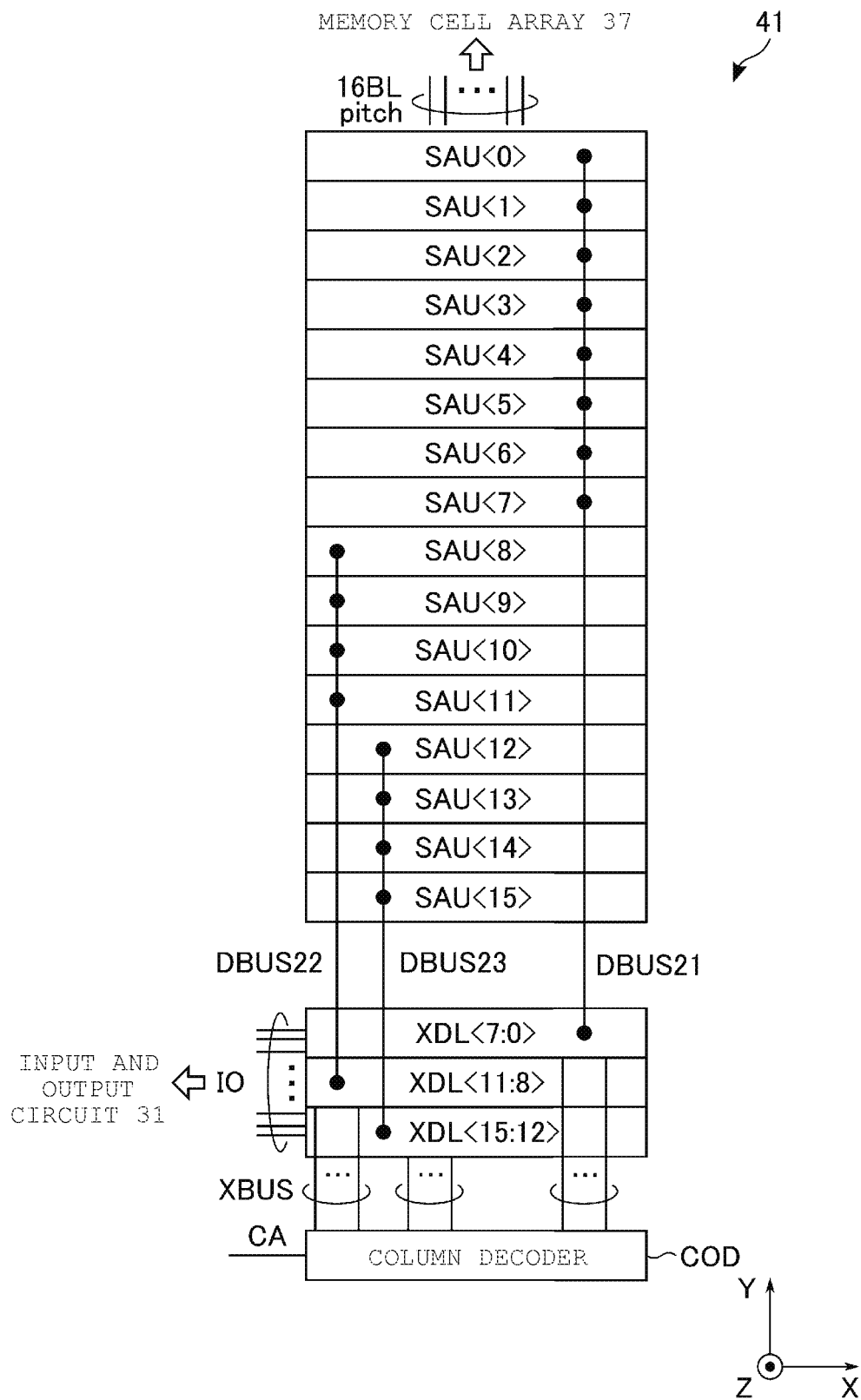
FIG. 33 is a block diagram of an example of a configuration of a sense amplifier module in a semiconductor memory according to a second modification of the first embodiment.

A configuration of the sense amplifier module 41 will be described with reference to FIG. 33. FIG. 33 is a block diagram of an example of the configuration of the sense amplifier module 41.

In the example of FIG. 33, eight sense amplifier units SAU<0> to SAU<7> are commonly connected to one bus DBUS (hereinafter, referred to as "DBUS21"). Four sense amplifier units SAU<8> to SAU<11> are commonly connected to one bus DBUS (hereinafter, referred to as "DBUS22"). Four sense amplifier units SAU<12> to SAU<15> are commonly connected to one bus DBUS (hereinafter, referred to as "DBUS23"). It is noted that any number of sense amplifier units SAU may be connected to the one bus DBUS. The sense amplifier unit SAU is connected to the latch circuit XDL via the corresponding bus DBUS. Eight latch circuits XDL<7:0> respectively corresponding to the sense amplifier units SAU<0> to SAU<7> are commonly connected to the bus DBUS21. Four latch circuits XDL<11:8> respectively corresponding to the sense amplifier units SAU<8> to SAU<11> are commonly connected to the bus DBUS22. Four latch circuits XDL<15:12> respectively corresponding to the sense amplifier units SAU<12> to SAU<15> are commonly connected to the bus DBUS23.

Other configurations of the sense amplifier module 41 are the same as those of the first embodiment shown in FIG. 4.

6.2.2 Circuit Configuration of Sense Amplifier Module

A circuit configuration of the sense amplifier module 41 will be described with reference to FIGS. 34 to 36.

Figure 34:
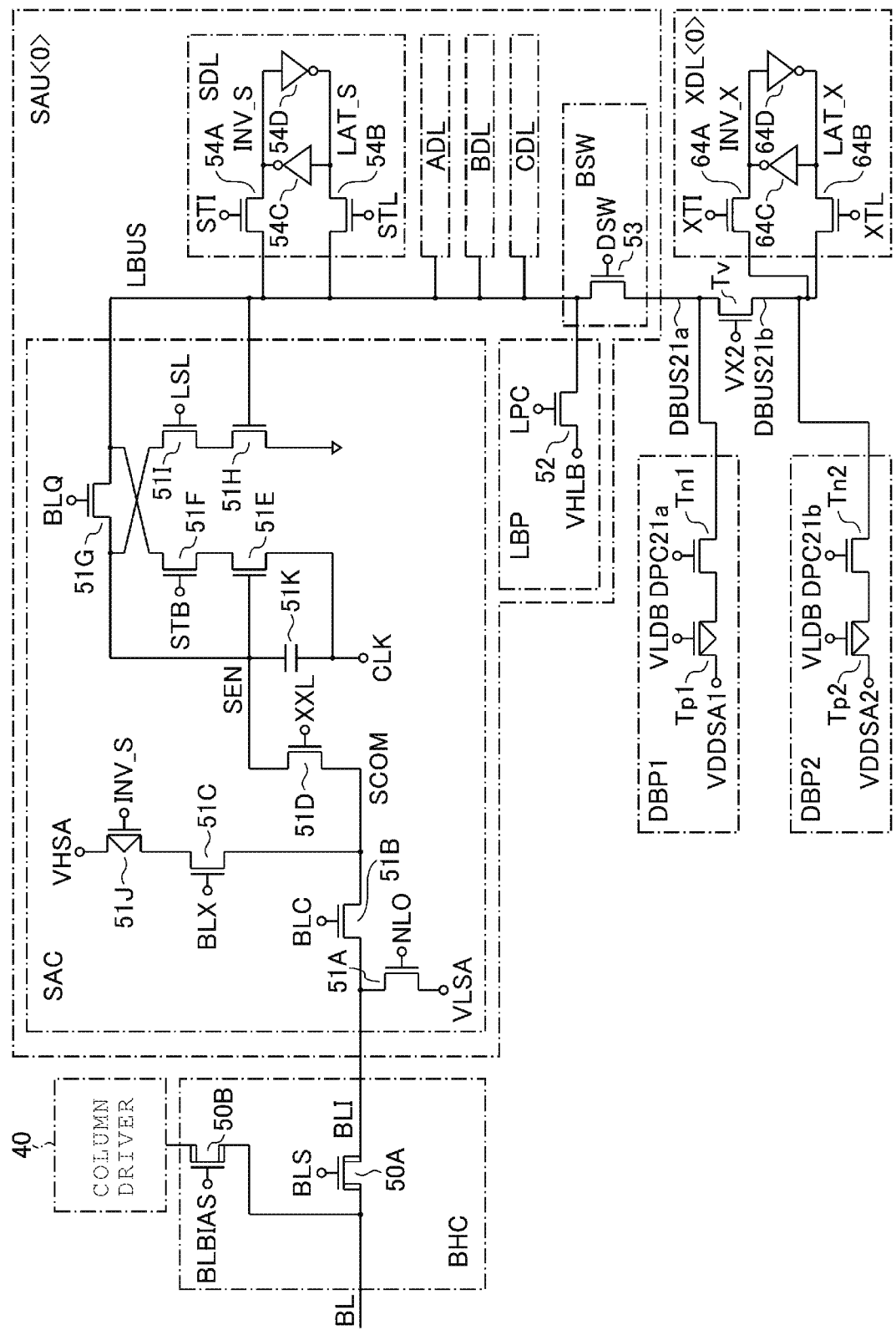
FIG. 34 is a circuit diagram showing an example of a circuit configuration of the sense amplifier module in the semiconductor memory according to the second modification of the first embodiment.

FIG. 34 is a circuit diagram showing an example of the circuit configuration of the sense amplifier module 41. It is noted that FIG. 34 particularly shows the sense amplifier unit SAU<0> in the sense amplifier module 41 as a representative example. The sense amplifier units SAU<1> to SAU<7> have the same configuration as the sense amplifier unit SAU<0>.

In the present modification, a bus DBUS21a is provided as the bus DBUS21 connected to the sense amplifier units SAU<0> to SAU<7>. A bus DBUS21b is provided as the bus DBUS21 connected to the latch circuits XDL<0> to XDL<7>. An n-channel MOS transistor Tv is provided between the bus DBUS21a and the bus DBUS21b.

One end of the bus DBUS21a is connected to the sense amplifier unit SAU<0>. The other end of the bus DBUS21a is connected to one end of the transistor Tv. One end of the bus DBUS21b is connected to the other end of the transistor Tv. The other end of the bus DBUS21b is connected to the latch circuit XDL<0>.

A pre-charge circuit DBP1 connected to the bus DBUS21a includes the n-channel MOS transistor Tn1 and the p-channel MOS transistor Tp1.

One end of the transistor Tn1 is connected to the bus DBUS21a. The other end of the transistor Tn1 is connected to one end of the transistor Tp1. A control signal DPC21a is input to the gate of the transistor Tn1. For example, the control signal DPC21a is generated by the sequencer 35.

The voltage VDDSA1 is applied to the other end of the transistor Tp1. The voltage VLDB is applied to the gate of the transistor Tp1. When the transistors Tp1 and Tn1 are in an on state, the voltage VDDSA1 is applied to the bus DBUS21a. As a result, the bus DBUS21a is charged.

A pre-charge circuit DBP2 connected to the bus DBUS21b includes the n-channel MOS transistor Tn2 and the p-channel MOS transistor Tp2.

One end of the transistor Tn2 is connected to the bus DBUS21b. The other end of the transistor Tn2 is connected to one end of the transistor Tp2. A control signal DPC21b is input to the gate of the transistor Tn2. For example, the control signal DPC21b is generated by the sequencer 35.

The voltage VDDSA2 is applied to the other end of the transistor Tp2. The voltage VLDB is applied to the gate of the transistor Tp2. When the transistors Tp2 and Tn2 are in an on state, the voltage VDDSA2 is applied to the bus DBUS21b. As a result, the bus DBUS21b is charged.

Other configurations in FIG. 34 are the same as those of the first embodiment in FIG. 5.

Figure 35:
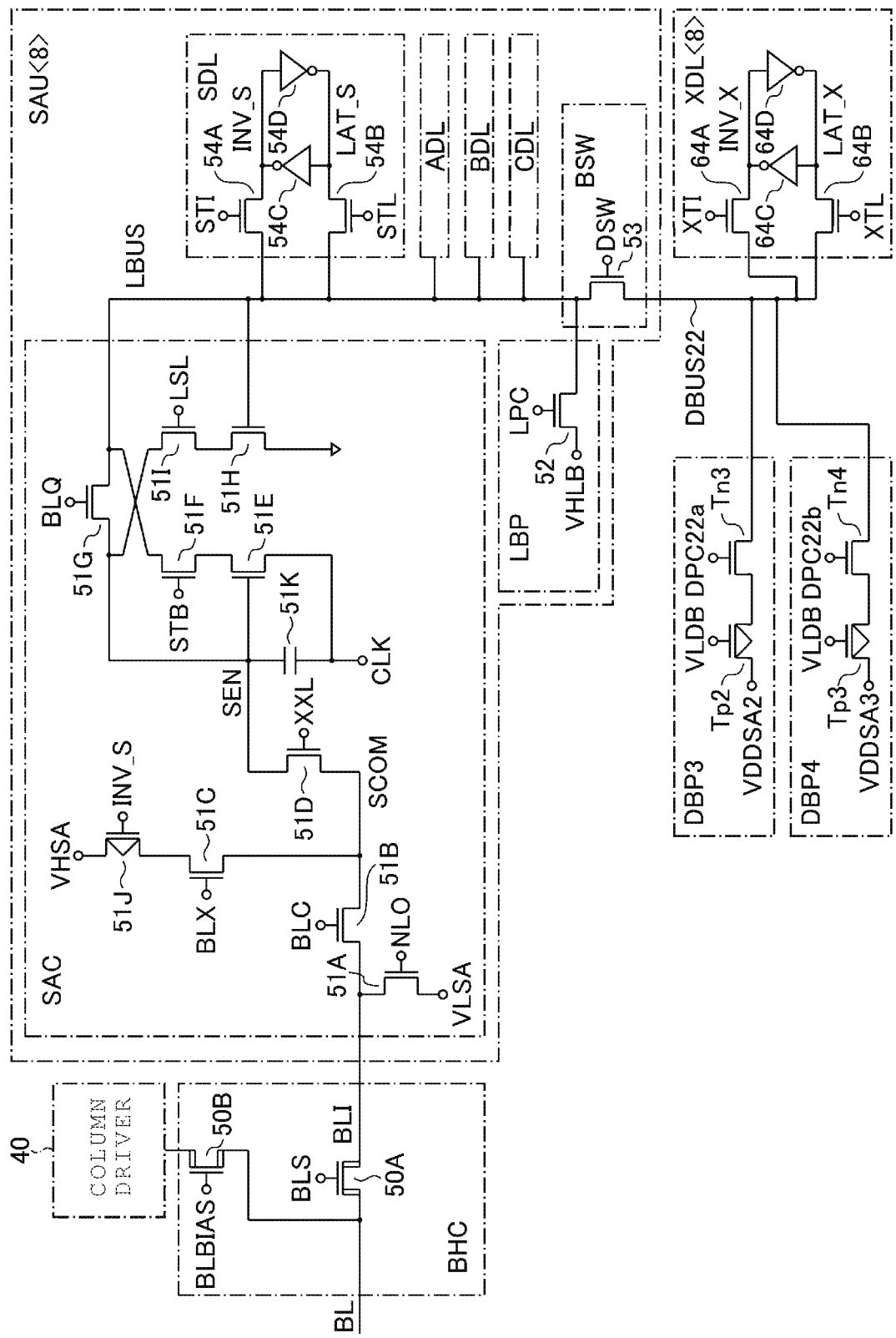
FIG. 35 is a circuit diagram showing an example of the circuit configuration of the sense amplifier module in the semiconductor memory according to the second modification of the first embodiment.

FIG. 35 is a circuit diagram showing an example of the circuit configuration of the sense amplifier module 41. It is noted that FIG. 35 particularly shows the sense amplifier unit SAU<8> in the sense amplifier module 41 as a representative example. The sense amplifier units SAU<9> to SAU<11> have the same configuration as the sense amplifier unit SAU<8>. The sense amplifier unit SAU<8> has the same configuration as the sense amplifier unit SAU<0> in FIG. 5. The latch circuit XDL<8> has the same configuration as the latch circuit XDL<0> in FIG. 5. A BL hookup circuit BHC has the same configuration as that shown in FIG. 5.

In the present modification, the bus DBUS22 is provided as the bus DBUS connected to the sense amplifier units SAU<8> to SAU<11>.

One end of the bus DBUS22 is connected to the sense amplifier unit SAU<8>. The other end of the bus DBUS22 is connected to the latch circuit XDL<8>.

A pre-charge circuit DBP3 connected to the bus DBUS22 includes the n-channel MOS transistor Tn3 and the p-channel MOS transistor Tp2.

One end of the transistor Tn3 is connected to the bus DBUS22. The other end of the transistor Tn3 is connected to one end of the transistor Tp2. A control signal DPC22a is input to the gate of the transistor Tn3. For example, the control signal DPC22a is generated by the sequencer 35.

The voltage VDDSA2 is applied to the other end of the transistor Tp2. The voltage VLDB is applied to the gate of the transistor Tp2. When the transistors Tp2 and Tn3 are in an on state, the voltage VDDSA2 is applied to the bus DBUS22. As a result, the bus DBUS22 is charged.

A pre-charge circuit DBP4 connected to the bus DBUS22 includes the n-channel MOS transistor Tn4 and the p-channel MOS transistor Tp3.

One end of the transistor Tn4 is connected to the bus DBUS22. The other end of the transistor Tn4 is connected to one end of the transistor Tp3. A control signal DPC22*b* is input to the gate of the transistor Tn4. For example, the control signal DPC22*b* is generated by the sequencer 35.

The voltage VDDSA3 is applied to the other end of the transistor Tp3. The voltage VLDB is applied to the gate of the transistor Tp3. When the transistors Tp3 and Tn4 are in an on state, the voltage VDDSA3 is applied to the bus DBUS22. As a result, the bus DBUS22 is charged.

Figure 36:
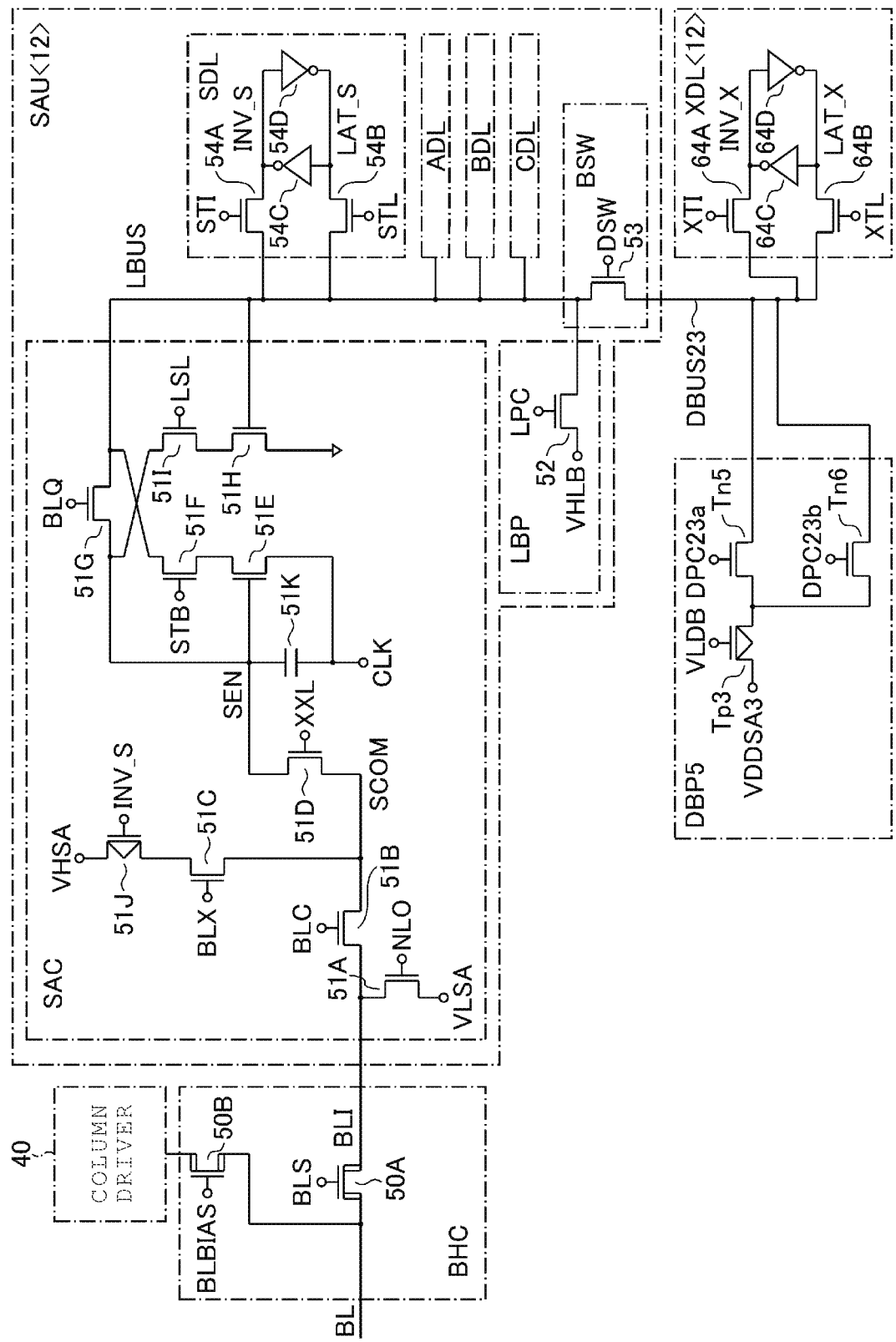
FIG. 36 is a circuit diagram showing an example of the circuit configuration of the sense amplifier module in the semiconductor memory according to the second modification of the first embodiment.

FIG. 36 is a circuit diagram showing an example of the circuit configuration of the sense amplifier module 41. It is noted that FIG. 36 particularly shows the sense amplifier unit SAU<12> in the sense amplifier module 41 as a representative example. The sense amplifier units SAU<13> to SAU<15> have the same configuration as the sense amplifier unit SAU<12>. The sense amplifier unit SAU<12> has the same configuration as the sense amplifier unit SAU<0> in FIG. 5. The latch circuit XDL<12> has the same configuration as the latch circuit XDL<0> in FIG. 5. The BL hookup circuit BHC has the same configuration as that shown in FIG. 5.

In the present modification, the bus DBUS23 is provided as the bus DBUS connected to the sense amplifier units SAU<12> to SAU<15>.

One end of the bus DBUS23 is connected to the sense amplifier unit SAU<12>. The other end of the bus DBUS23 is connected to the latch circuit XDL<12>.

A pre-charge circuit DBP5 connected to the bus DBUS23 includes the n-channel MOS transistors Tn5 and Tn6 and the p-channel MOS transistor Tp3.

One end of the transistor Tn5 is connected to the bus DBUS23. The other end of the transistor Tn5 is connected to one end of the transistor Tp3. A control signal DPC23*a* is input to the gate of the transistor Tn5. For example, the control signal DPC23*a* is generated by the sequencer 35.

The voltage VDDSA3 is applied to the other end of the transistor Tp3. The voltage VLDB is applied to the gate of the transistor Tp3. When the transistors Tp3 and Tn5 are in an on state, the voltage VDDSA3 is applied to the bus DBUS23. As a result, the bus DBUS23 is charged.

One end of the transistor Tn6 is connected to the bus DBUS23. The other end of the transistor Tn6 is connected to one end of the transistor Tp3. A control signal DPC23*b* is input to the gate of the transistor Tn6. For example, the control signal DPC23*b* is generated by the sequencer 35.

When the transistors Tp3 and Tn6 are in an on state, the voltage VDDSA3 is applied to the bus DBUS23. As a result, the bus DBUS23 is charged.

6.2.3 Layout of Column Driver and Sense Amplifier Module

A layout of the column driver 40 and the sense amplifier module 41 is the same as that shown in FIG. 7 of the first embodiment.

Figure 37:
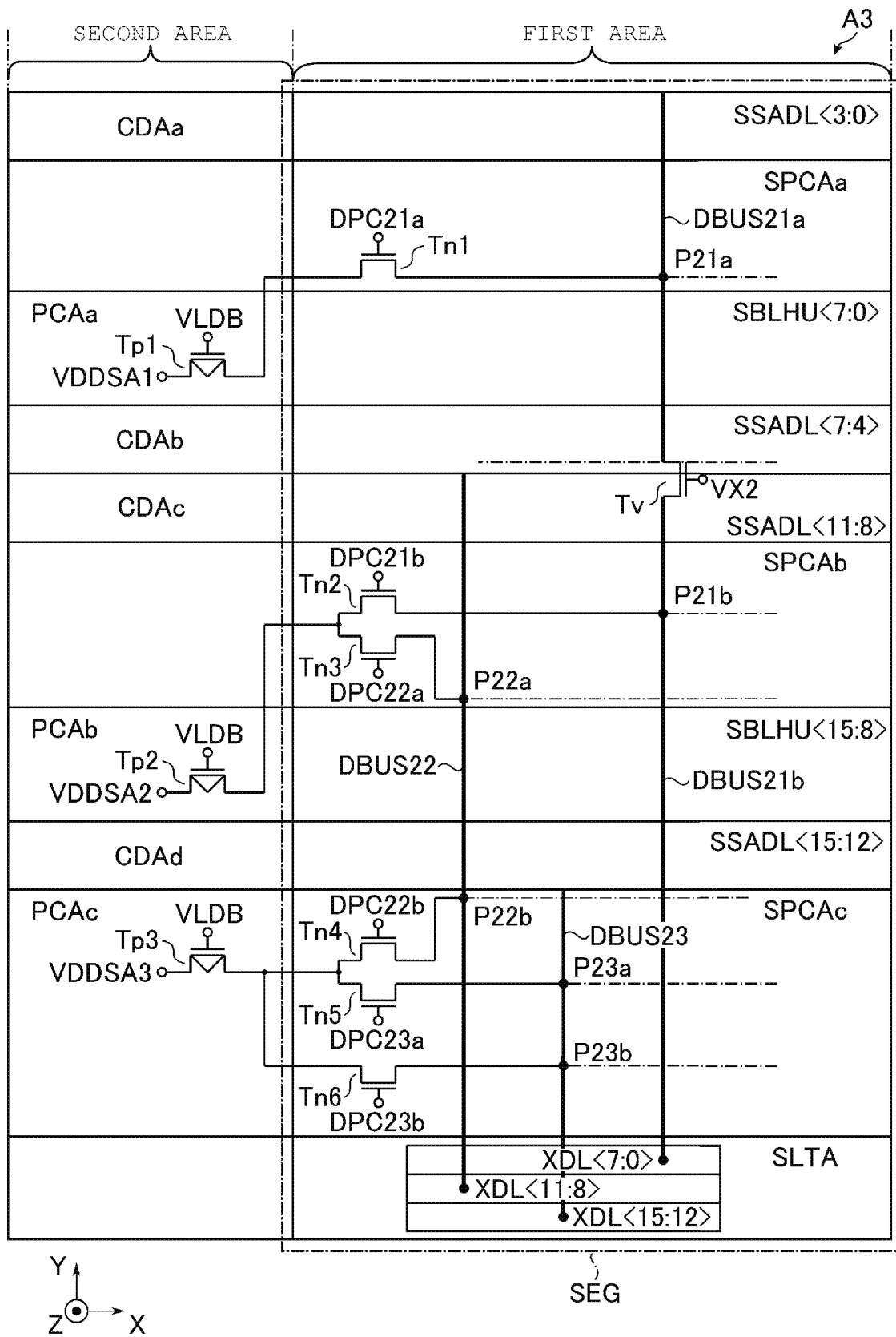
FIG. 37 is a diagram showing an example of a layout of buses and circuits in the sense amplifier module in the semiconductor memory according to the second modification of the first embodiment.

FIG. 37 is a diagram showing an example of a layout of the buses DBUS and circuits in the sense amplifier module 41. FIG. 37 shows an area corresponding to the area A3 in FIG. 13 of the first embodiment. FIG. 37 shows the buses DBUS21*a*, DBUS21*b*, DBUS22, and DBUS23, the pre-charge circuits DBP, and the latch circuits XDL. Other circuits are omitted in FIG. 37.

The buses DBUS21*a*, DBUS21*b*, DBUS22, and DBUS23 are provided in the segment SEG of the first area. The buses DBUS21*a*, DBUS21*b*, DBUS22, and DBUS23 extend along the Y direction. The transistor Tv is provided between the bus DBUS21*a* and the bus DBUS21*b*. For example, the transistor Tv is provided in either the sense amplifier unit area SSDL<7:4> or the sense amplifier unit area SSDL<11:8>. Alternatively, the transistor Tv is provided between, or straddles these areas.

The bus DBUS21*a* is connected to the sense amplifier unit SAU<7:0> (not shown) in the sense amplifier unit area SSADL<7:0>. One end of the bus DBUS21*a* is positioned in the sense amplifier unit area SSADL<0> and connected to the sense amplifier unit SAU<0>. The other end of the bus DBUS21*a* is connected to one end of the transistor Tv. One end of the bus DBUS21*b* is connected to the other end of the transistor Tv. The other end of the bus DBUS21*b* is connected to the latch circuit XDL<7:0>.

The bus DBUS22 is connected to the sense amplifier unit SAU<11:8> (not shown) in the sense amplifier unit area SSADL<11:8>. One end of the bus DBUS22 is positioned in the sense amplifier unit area SSADL<8> and connected to the sense amplifier unit SAU<8>. The other end of the bus DBUS22 is connected to the latch circuit XDL<11:8>.

The bus DBUS23 is connected to the sense amplifier unit SAU<15:12> (not shown) in the sense amplifier unit area SSADL<15:12>. One end of the bus DBUS23 is positioned in the sense amplifier unit area SSADL<12> and connected to the sense amplifier unit SAU<12>. The other end of the bus DBUS23 is connected to the latch circuit XDL<15:12>.

The transistor Tn1 is provided in the pre-charge circuit area SPCAa in the segment SEG. The transistor Tp1 is provided in the pre-charge circuit area PCAa of the second area. One end of the transistor Tn1 is connected to the bus DBUS21*a* at a position P21*a*. For example, the position P21*a* is positioned in the pre-charge circuit area SPCAa. The other end of the transistor Tn1 is connected to one end of the transistor Tp1. A control signal DPC21*a* is input to the gate of the transistor Tn1. The voltage VDDSA1 is applied to the other end of the transistor Tp1. The voltage VLDB is applied to the gate of the transistor Tp1.

The transistors Tn2 and Tn3 are provided in the pre-charge circuit area SPCAb in the segment SEG. The transistor Tp2 is provided in the pre-charge circuit area PCAb of the second area. One end of the transistor Tn2 is connected to the bus DBUS21*b* at a position P21*b*. For example, the position P21*b* is positioned in the pre-charge circuit area SPCAb. The other end of the transistor Tn2 is connected to one end of the transistor Tp2. A control signal DPC21*b* is input to the gate of the transistor Tn2. The voltage VDDSA2 is applied to the other end of the transistor Tp2. The voltage VLDB is applied to the gate of the transistor Tp2. One end of the transistor Tn3 is connected to the bus DBUS22 at a position P22*a*. For example, the position P22*a* is positioned in the pre-charge circuit area SPCAb. The other end of the transistor Tn3 is connected to one end of the transistor Tp2. A control signal DPC22*a* is input to the gate of the transistor Tn3.

The transistors Tn4 to Tn6 are provided in the pre-charge circuit area SPCAc in the segment SEG. The transistor Tp3 is provided in the pre-charge circuit area PCAc of the second area. One end of the transistor Tn4 is connected to the bus DBUS22 at a position P22*b*. For example, the position P22*b* is positioned in the pre-charge circuit area SPCAc. The other end of the transistor Tn4 is connected to one end of the transistor Tp3. A control signal DPC22*b* is input to the gate of the transistor Tn4. The voltage VDDSA3 is applied to the other end of the transistor Tp3. The voltage VLDB is applied to the gate of the transistor Tp3. One end of the transistor Tn5 is connected to the bus DBUS23 at a position P23*a*. For example, the position P23*a* is positioned in the pre-charge circuit area SPCAc. The other end of the transistor Tn5 is connected to one end of the transistor Tp3. A control signal DPC23*a* is input to the gate of the transistor Tn5. One end of the transistor Tn6 is connected to the bus DBUS23 at a position P23*b*. For example, the position P23*b* is positioned in the pre-charge circuit area SPCAc. The other end of the transistor Tn6 is connected to one end of the transistor Tp3. A control signal DPC23b is input to the gate of the transistor Tn6.

In the present modification, as in the first embodiment, it is preferable that the position P21a of the bus DBUS21a is a position at which the difference between the length of the bus DBUS21a from one end of the bus DBUS21a to the position P21a and the length of the bus DBUS21a from the position P21a to the transistor Tv is smaller. It is more preferable that the position P21a is at approximately half the length of the bus DBUS21a from one end of the bus DBUS21a to the transistor Tv. It is preferable that the position P22a of the bus DBUS22 is a position at which the difference between the length of the bus DBUS22 from one end of the bus DBUS22 to the position P22a and the length of the bus DBUS22 from the position P22a to the position P22b is smaller. It is more preferable that the position P22a is at approximately half the length of the bus DBUS22 from one end of the bus DBUS22 to the position P22b. It is preferable that the position P23a of the bus DBUS23 is a position at which the difference between the length of the bus DBUS23 from one end of the bus DBUS23 to the position P23a and the length of the bus DBUS23 from the position P23a to the position P23b is smaller. It is more preferable that the position P23a is at approximately half the length of the bus DBUS23 from one end of the bus DBUS23 to the position P23b.

6.2.4 Advantage

According to the present modification, as in the first embodiment, the position P21a where one end of the transistor Tn1 and the bus DBUS21a are connected to each other is close to the center of the length of the bus DBUS21a from one end of the bus DBUS21a to the transistor Tv. Further, as in the first embodiment, the position P22a where one end of the transistor Tn3 and the bus DBUS22 are connected to each other is close to the center of the length of the bus DBUS22 from one end of the bus DBUS22 to the position P22b where one end of the transistor Tn4 and the bus DBUS22 are connected to each other. Further, the position P23a where one end of the transistor Tn5 and the bus DBUS23 are connected to each other is close to the center of the length of the bus DBUS23 from one end of the bus DBUS23 to the position P23b where one end of the transistor Tn6 and the bus DBUS23 are connected to each other. In addition, since the length of the bus DBUS23 is shorter than that of the buses DBUS21a, DBUS21b, and DBUS22, the charging time of the bus DBUS23 is shorter than that of the buses DBUS21a, DBUS21b, and DBUS22. Therefore, according to the present modification, for example, when only the bus DBUS23 is charged, the charging time of the bus DBUS can be shortened as compared to the first embodiment. It is noted that the layout of the column driver 40 and the sense amplifier module 41 when the number of buses DBUS is three in the present modification can also be applied to the second to fifth embodiments.

6.3 Third Modification

A third modification of the first embodiment will be described. In the NAND flash memory 30 according to the third modification, a structure of the NAND flash memory 30 is different from that of the first embodiment. In particular, the NAND flash memory 30 of the present modification has a structure in which an array chip and a circuit chip are bonded to each other. Hereinafter, the differences from the first embodiment will be mainly described.

6.3.1 Layout of Column Driver and Sense Amplifier Module

A layout of the column driver 40 and the sense amplifier module 41 is the same as that shown in FIG. 7 of the first embodiment.

6.3.2 Layout of Memory Cell Array

A layout of the memory cell array 37 is the same as that shown in FIG. 8 of the first embodiment. However, there is no contact plug C4 provided above the second area of the column area and the hookup areas BLHUa and BLHUb of the first area shown in FIG. 7.

6.3.3 Cross-Sectional Structure of NAND Flash Memory

A cross-sectional structure of the NAND flash memory 30 will be described.

Figure 38:
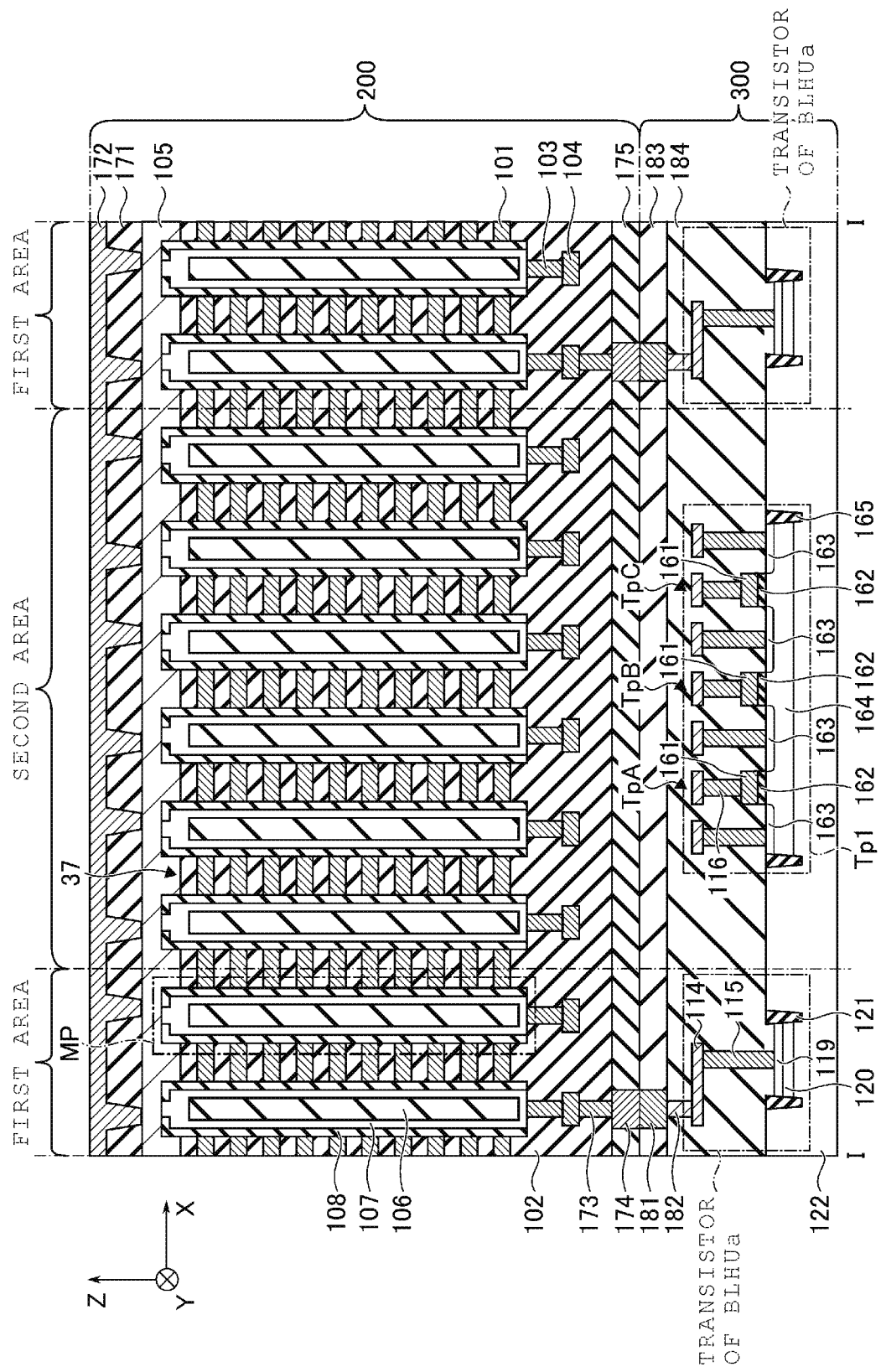
FIG. 38 is a cross-sectional diagram showing an example of a cross-sectional structure of a semiconductor memory according to a third modification of the first embodiment.

FIG. 38 is a cross-sectional diagram showing a cross section taken along line I-I of FIGS. 7 and 8, showing an example of the cross-sectional structure of the NAND flash memory 30.

An array chip 200 includes the memory cell array 37 and various wirings for connecting the memory cell array 37 and a circuit chip 300.

First, the array chip 200 will be described.

In the first area and the second area, a plurality of (e.g., 10) wiring layers 101 are stacked and spaced apart from each other in the Z direction. The wiring layers 101 serve as word lines WL and select gate lines SGD and SGS. The insulating layer 102 is provided between the respective wiring layers 101. The insulating layer 102 is provided on the uppermost wiring layer 101. The insulating layer 102 is provided under the lowermost wiring layer 101.

The wiring layer 105 is provided on the uppermost insulating layer 102. For example, the wiring layer 105 is formed in a plate shape extending along the X-Y plane and serves as the source line SL.

An insulating layer 171 and a wiring layer 172 are provided on the wiring layer 105. A portion of the wiring layer 172 is in contact with the wiring layer 105.

The memory pillar MP extends along the Z direction and passes through the plurality of wiring layers 101 and insulating layers 102. An upper end of the memory pillar MP is in contact with the wiring layer 105. For example, the memory pillar MP has a cylindrical shape, with its cross-sectional area along the X-Y plane (X-Y cross-sectional area) increasing from top to bottom. It is noted that the cross-sectional shape of the memory pillar MP is not limited to the above.

An intersection between the memory pillar MP and the uppermost wiring layer 101 serves as the select transistor ST2. An intersection between the memory pillar MP and the lowermost wiring layer 101 serves as the select transistor ST1. An intersection between the memory pillar MP and another wiring layer 101 serves as one memory cell transistor MC.

For example, the memory pillar MP includes a core film 106, a semiconductor film 107, and a stacked film 108.

The core film 106 extends along the Z direction. For example, an upper end of the core film 106 is positioned below the wiring layer 105, and a lower end of the core film 106 is positioned below the lowermost wiring layer 101.

The semiconductor film 107 covers the periphery of the core film 106. A portion of the semiconductor film 107 is in contact with the wiring layer 105 at the upper end of the memory pillar MP.

The stacked film 108 covers side and upper surfaces of the semiconductor film 107 except for the contacting portion between the semiconductor film 107 and the wiring layer 105. For example, the stacked film 108 is a stacked film including a first insulating layer, a second insulating layer, and a third insulating layer stacked in order. The first insulating layer, the second insulating layer, and the third insulating layer are the same as in the first embodiment.

The lower end of the memory pillar MP is connected to the wiring layer 104 via the contact plug 103. For example, the wiring layer 104 is formed in a line shape extending along the Y direction and serves as a bit line BL.

The wiring layer 104 is electrically connected to an electrode pad 174 via contact plugs 173. The electrode pad 174 is used for connection with the circuit chip 300. The electrode pad 174 is made of a conductive material. The insulating layer 102 is in contact with the insulating layer 175 in the Z direction. The electrode pad 174 is provided in the insulating layer 175. The insulating layer 175 is made of an insulating material.

Next, the circuit chip 300 will be described.

An insulating layer 184 is provided on the semiconductor substrate 122. The insulating layer 184 is made of an insulating material.

In the first area, the semiconductor substrate 122 and the insulating layer 184 are provided with a transistor in the hookup area BLHUa, like the first embodiment as shown in FIG. 9. In the example of FIG. 38, for example, the wiring layer 114 provided on the drain layer 119 of the transistor in the hookup area BLHUa via the contact plug 115 is electrically connected to an electrode pad 181 via a contact plug 182. The electrode pad 181 and the contact plug 182 are made of a conductive material. The electrode pad 181 is used for connection with the array chip 200. The electrode pad 181 is in contact with the electrode pad 174. The insulating layer 184 is in contact with an insulating layer 183 in the Z direction. The electrode pad 181 is provided in the insulating layer 183. The insulating layer 183 is made of an insulating material.

In the second area, the semiconductor substrate 122 and the insulating layer 184 are provided with the transistor Tp1 in the pre-charge circuit area PCAa, like the first embodiment as shown in FIG. 9.

Figure 39:
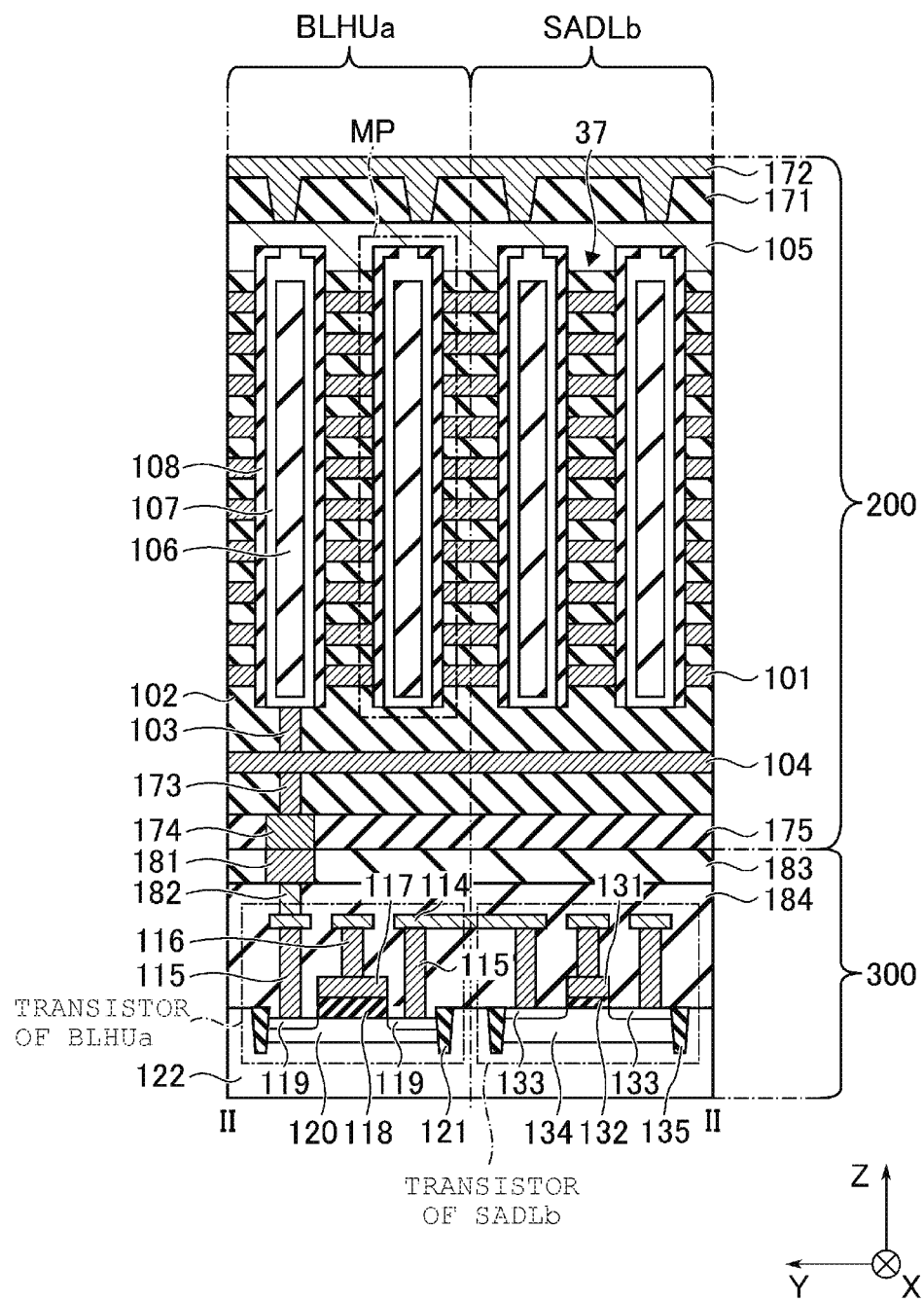
FIG. 39 is a cross-sectional diagram showing an example of the cross-sectional structure of the semiconductor memory according to the third modification of the first embodiment.

FIG. 39 is a cross-sectional diagram showing a cross section taken along line II-II of FIGS. 7 and 8, showing an example of the cross-sectional structure of the NAND flash memory 30.

In the array chip 200, the hookup area BLHUa is provided with the memory pillars MP in the same manner as the sense amplifier unit area SADLb.

In the circuit chip 300, the semiconductor substrate 122 and the insulating layer 184 are provided with the transistor in the hookup area BLHUa and a transistor in the sense amplifier unit area SADLb, like the first embodiment as shown in FIG. 10.

Figure 40:
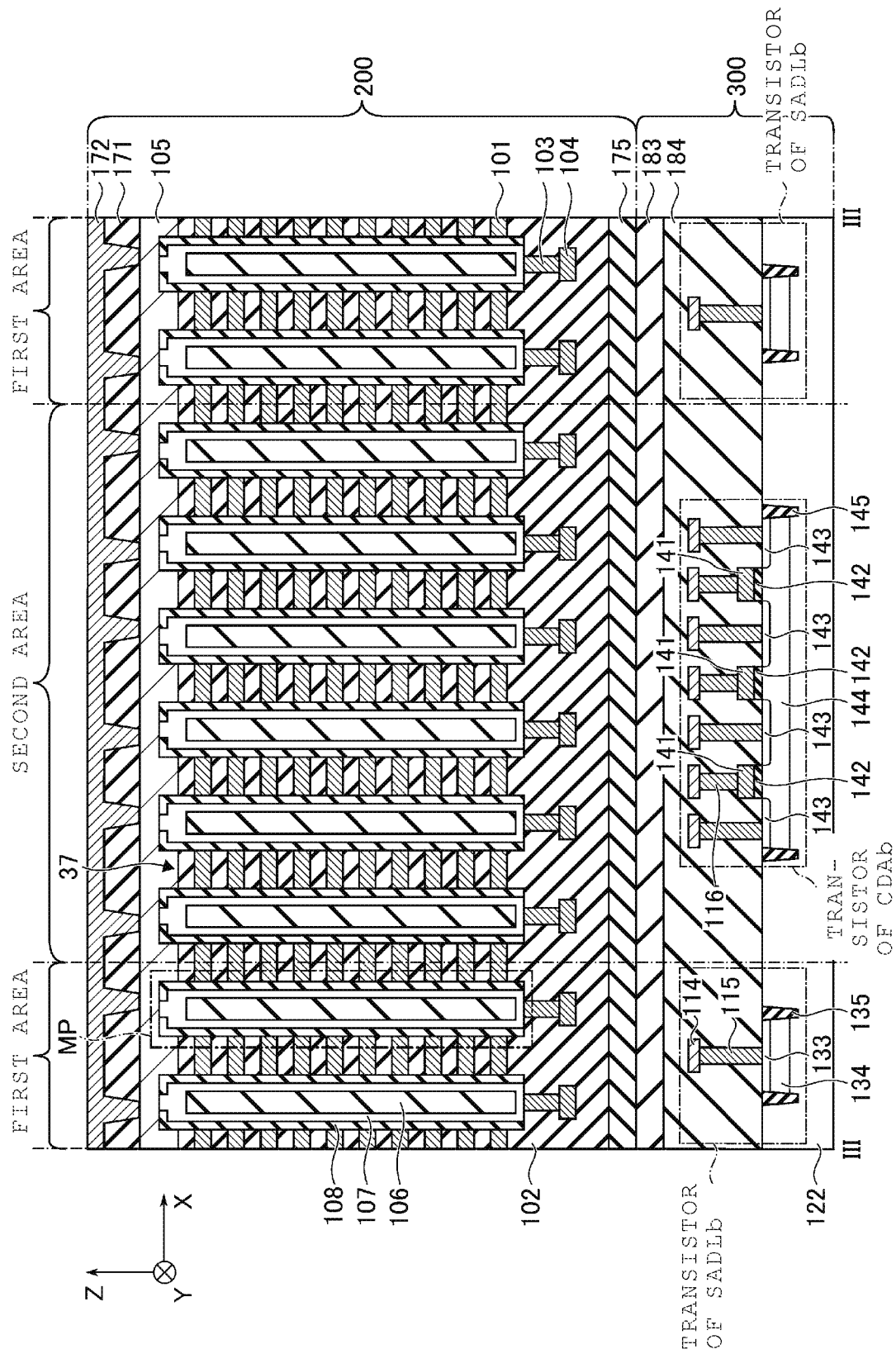
FIG. 40 is a cross-sectional diagram showing an example of the cross-sectional structure of the semiconductor memory according to the third modification of the first embodiment.

FIG. 40 is a cross-sectional diagram showing a cross section taken along line of FIGS. 7 and 8, showing an example of the cross-sectional structure of the NAND flash memory 30.

In the array chip 200, the memory pillars MP are provided in the second area as well as the first area.

In the circuit chip 300, the semiconductor substrate 122 and the insulating layer 184 are provided with the transistor in the sense amplifier unit area SADLb and a transistor in the column driver area CDAb, like the first embodiment as shown in FIG. 12.

6.3.4 Advantage

According to the present modification, as in the first embodiment, the transistor Tp1 is provided in the pre-charge circuit area PCAa of the second area (the area adjacent to the hookup area SBLHU<7:0> in the segment SEG of the first area in the X direction). The transistor Tn1 is provided in the pre-charge circuit area SPCAa in the segment SEG of the first area (the area adjacent to the hookup area SBLHU<7:0> in the Y direction).

Further, as in the first embodiment, the transistor Tp3 is provided in the pre-charge circuit area PCAb of the second area (the area adjacent to the hookup area SBLHU<15:8> in the segment SEG of the first area in the X direction). The transistor Tn3 is provided in the pre-charge circuit area SPCAb in the segment SEG of the first area (the area adjacent to the hookup area SBLHU<15:8> in the Y direction). The transistor Tn4 is provided in the pre-charge circuit area SPCAc in the segment SEG of the first area.

Therefore, according to the present modification, the same effects as those of the first embodiment can be achieved. It is noted that, in the present modification, the NAND flash memory 30 having a structure in which the array chip 200 and the circuit chip 300 are bonded to each other can also be applied to the second to fifth embodiments and the first and second modifications.

The embodiments and modifications are described above by taking an example of when each of the 16 latch circuits XDL<15:0> is connected to one bus DBUS, or when connected to one of two buses DBUS, or when connected to one of three buses DBUS. It is noted that each of the 16 latch circuits XDL<15:0> may be connected to 16 buses DBUS, respectively.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory comprising:
   a memory cell;
   a bit line electrically connected to the memory cell;
   a sense amplifier in a first circuit area and including a first latch circuit;
   a first hookup circuit in a second circuit area and configured to control connection between the bit line and the sense amplifier;
   a second latch circuit;
   a first wiring connected between the first latch circuit and the second latch circuit; and
   a first pre-charge circuit including a first transistor in a third circuit area between the first circuit area and the second circuit area, the first transistor having a first end connected to the first wiring at a first position in the third circuit area and a second end connectable to a terminal that is supplied with one of a pre-charge voltage and a ground voltage.

2. The semiconductor memory according to claim 1, wherein
   the first, third, and second circuit areas are arranged in a first direction, and
   the first pre-charge circuit also includes a second transistor in a fourth circuit area adjacent to the second circuit area in a second direction intersecting the first direction, the second transistor being connected between the first transistor and the terminal at the first voltage.

3. The semiconductor memory according to claim 2, wherein the second transistor has a larger footprint than the first transistor.

4. The semiconductor memory according to claim 2, further comprising:
   a memory pillar above the first circuit area and including a plurality of memory cells, one of which is the memory cell, no memory cell being above the fourth circuit area.

5. The semiconductor memory according to claim 1, wherein the terminal is supplied with the pre-charge voltage.

6. The semiconductor memory according to claim 5, wherein the first pre-charge circuit further includes a third transistor in the third circuit area, the third transistor having a first end connected to the first wiring at a second position in the third circuit area and a second end connected to a terminal supplied with a ground voltage.

7. The semiconductor memory according to claim 1, wherein the terminal is supplied with ground voltage.

8. The semiconductor memory according to claim 1, further comprising:
   a fourth transistor in the first wiring, the first position being between a first end of the first wiring and the fourth transistor,
   wherein a length of the first wiring between the first end thereof and the first position is substantially equal to a length of the first wiring between the first position and the fourth transistor.

9. The semiconductor memory according to claim 1, wherein
   the first pre-charge circuit further includes a fifth transistor having a first end connected to the first wiring at a second position and a second end connectable to a terminal at a second voltage, the first position being between a first end of the first wiring and the second position, and
   a length of the first wiring between the first end and the first position is substantially equal to a length of the first wiring between the first position and the second position.

10. A semiconductor memory comprising:
   a first memory cell;
   a first bit line electrically connected to the first memory cell;
   a first sense amplifier in a first circuit area and including a first latch circuit;
   a first hookup circuit in a second circuit area and configured to control connection between the first bit line and the first sense amplifier;
   a second latch circuit;
   a first wiring connected between the first latch circuit and the second latch circuit;
   a first pre-charge circuit including a first transistor in a third circuit area between the first area and the second area in a first direction, the first transistor having a first end connected to the first wiring at a first position in the third area and a second end connectable to a terminal that is supplied with one of a first pre-charge voltage and a ground voltage;
   a second memory cell;
   a second bit line electrically connected to the second memory cell;
   a second sense amplifier in a fourth circuit area and including a third latch circuit;
   a second hookup circuit in a fifth circuit area and configured to control connection between the second bit line and the second sense amplifier;
   a fourth latch circuit;
   a second wiring connected between the third latch circuit and the fourth latch circuit; and
   a second pre-charge circuit including a second transistor in a sixth circuit area between the fourth area and the fifth area in the first direction, the second transistor having a first end connected to the second wiring at a second position in the sixth area and a second end being connectable to a terminal that is supplied with one of a second pre-charge voltage and a ground voltage.

11. The semiconductor memory according to claim 10, wherein the first, third, second, fourth, sixth, and fifth circuit areas are arranged in the first direction in this order.

12. The semiconductor memory according to claim 10, wherein a length of the first wiring between a first end thereof and the first position in the first direction is substantially a half of a length between the first position and the second position in the first direction.

13. The semiconductor memory according to claim 12, further comprising:
   a third pre-charge circuit including a third transistor in a seventh circuit area, the fifth circuit area being between the sixth circuit area and the seventh circuit area in the first direction, the third transistor having a first end connected to the second wiring at a third position in the seventh circuit area and a second end connectable to a terminal that is supplied with one of a third pre-charge voltage and a ground voltage,
   wherein a length of the second wiring between the second position and the third position is substantially a half of the length between the first position and the second position in the first direction.

14. The semiconductor memory according to claim 13, further comprising:
   a fourth pre-charge circuit including a fourth transistor in an eighth circuit area between the second circuit area and the fourth circuit area in the first direction, the fourth transistor having a first end connected to the first wiring at a fourth position in the eighth circuit area and a second end connectable to a terminal that is supplied with one of a fourth pre-charge voltage and a ground voltage,
   wherein a length of the first wiring between a first end thereof and the first position is substantially equal to a length of the first wiring between the first position and the fourth position.

15. The semiconductor memory according to claim 10, further comprising:
   a fourth pre-charge circuit including a fourth transistor in an eighth circuit area between the second circuit area and the fourth circuit area in the first direction, the fourth transistor having a first end connected to the first wiring at a fourth position in the eighth circuit area and a second end connectable to a terminal that is supplied with one of a fourth pre-charge voltage and a ground voltage,
   wherein a length of the first wiring between a first end thereof and the first position is substantially equal to a length of the first wiring between the first position and the fourth position.

16. A semiconductor memory comprising:
   a memory cell;
   a bit line electrically connected to the memory cell;
   a sense amplifier in a first circuit area and including a first latch circuit;
   a first hookup circuit in a second circuit area and configured to control connection between the bit line and the sense amplifier, the first and second circuit areas being arranged in a first direction;

a second latch circuit;

a first wiring connected between the first latch circuit and the second latch circuit; and a first pre-charge circuit including a first transistor in a third circuit area adjacent to the second area in a second direction intersecting the first direction, the first transistor having a first end connected to the first wiring and a second end connectable to a terminal that is supplied with a pre-charge voltage and a ground voltage.

17. The semiconductor memory according to claim 16, wherein the first pre-charge circuit further includes a second transistor in a fourth circuit area between the first circuit area and the second circuit area in the first direction and connected between the first transistor and the first wiring at the first position.

18. The semiconductor memory according to claim 17, wherein the first transistor has a larger foot print than the second transistor.

19. The semiconductor memory according to claim 16, wherein the terminal is supplied with the pre-charge voltage.

20. The semiconductor memory according to claim 16, wherein the terminal is supplied with the ground voltage.

* * * * *